(12) United States Patent
Gandhiraman et al.

(10) Patent No.: US 10,991,548 B2
(45) Date of Patent: Apr. 27, 2021

(54) MODULAR PRINT HEAD ASSEMBLY FOR PLASMA JET PRINTING

(71) Applicant: Space Foundry Inc., Sunnyvale, CA (US)

(72) Inventors: Ramprasad Gandhiraman, San Jose, CA (US); Fergal John O'Moore, Los Gatos, CA (US); Lief Niklas Dennis Nordlund, Menlo Park, CA (US); Arlene Lynette Lopez, Long Beach, CA (US)

(73) Assignee: Space Foundry Inc., Los Gatos, CA (US)

( * ) Notice: Subject to any disclaimer, the term of this patent is extended or adjusted under 35 U.S.C. 154(b) by 0 days.

(21) Appl. No.: 16/922,587

(22) Filed: Jul. 7, 2020

(65) Prior Publication Data

US 2020/0335303 A1    Oct. 22, 2020

Related U.S. Application Data

(63) Continuation of application No. 16/649,868, filed as application No. PCT/US2018/053703 on Oct. 1, 2018.

(Continued)

(51) Int. Cl.
*H01J 37/32* (2006.01)
*B29C 64/209* (2017.01)
(Continued)

(52) U.S. Cl.
CPC ........ *H01J 37/32009* (2013.01); *B29C 64/10* (2017.08); *B29C 64/209* (2017.08);
(Continued)

(58) Field of Classification Search
CPC .. H01J 37/32009; B29C 64/209; B29C 64/10; B33Y 10/00; B33Y 50/02; B33Y 30/00
(Continued)

(56) References Cited

U.S. PATENT DOCUMENTS 3,179,782 A    4/1965 Leo et al.
3,450,926 A    6/1969 Kiernan et al.
(Continued)

FOREIGN PATENT DOCUMENTS

JP    H11285882 A    10/1999
JP         4341552 B2    10/2009
WO    WO-2019068070 A1    4/2019

OTHER PUBLICATIONS

Plasma Jet Printing of Electronic materials by Gandhiraman et al. 2014 (Year: 2014).*
(Continued)

*Primary Examiner* — Ram N Kackar
(74) *Attorney, Agent, or Firm* — Wilson Sonsini Goodrich & Rosati

(57) ABSTRACT

Described herein are apparatus and methods of printing in the presence of plasma. The apparatus includes a modular print head comprising an inlet module, a plasma module with movable electrode configurations, and a nozzle module. The modular design of the print head allows for printing on and treatment of surfaces in many different applications.

22 Claims, 38 Drawing Sheets

Related U.S. Application Data

(60) Provisional application No. 62/566,488, filed on Oct. 1, 2017, provisional application No. 62/626,171, filed on Feb. 5, 2018.

(51) Int. Cl.
*B29C 64/10* (2017.01)
*B33Y 10/00* (2015.01)
*B33Y 30/00* (2015.01)
*B33Y 50/02* (2015.01)

(52) U.S. Cl.
CPC .............. *B33Y 10/00* (2014.12); *B33Y 30/00* (2014.12); *B33Y 50/02* (2014.12)

(58) Field of Classification Search
USPC ...................................................... 118/723 E
See application file for complete search history.

(56) References Cited

U.S. PATENT DOCUMENTS

| | | |
|---|---|---|
| 3,639,831 A | 2/1972 | Cushman |
| 3,756,511 A | 9/1973 | Shinroku et al. |
| 3,958,883 A | 5/1976 | Turner |
| 4,916,273 A | 4/1990 | Browning |
| 4,990,740 A | 2/1991 | Meyer |
| 5,066,125 A | 11/1991 | Rogers et al. |
| 5,204,144 A | 4/1993 | Cann et al. |
| 5,477,048 A | 12/1995 | Nakagawa et al. |
| 6,194,036 B1 | 2/2001 | Babayan et al. |
| 6,800,336 B1 | 10/2004 | Fornsel et al. |
| 7,591,957 B2 | 9/2009 | Carr |
| 8,430,995 B2 | 4/2013 | Murokh |
| 2001/0022295 A1 | 9/2001 | Hwang |
| 2002/0001540 A1 | 1/2002 | Nakagawa et al. |
| 2002/0097295 A1* | 7/2002 | Toda ................ B41J 2/1623 347/45 |
| 2002/0104824 A1 | 8/2002 | Silverbrook |
| 2003/0007910 A1* | 1/2003 | Diamant Lazarovich .................. H01J 37/32009 422/186.18 |
| 2003/0087530 A1 | 5/2003 | Carr |
| 2004/0173316 A1 | 9/2004 | Carr |
| 2005/0218319 A1 | 10/2005 | Bandura et al. |
| 2006/0038992 A1 | 2/2006 | Morrisroe |
| 2006/0051505 A1 | 3/2006 | Kortshagen et al. |
| 2006/0054279 A1* | 3/2006 | Kim ................ H05H 1/2406 156/345.33 |
| 2006/0082319 A1 | 4/2006 | Eden et al. |
| 2008/0145553 A1 | 6/2008 | Boulos et al. |
| 2010/0225909 A1 | 9/2010 | Feilders et al. |
| 2010/0237050 A1 | 9/2010 | Zehavi |
| 2011/0272386 A1 | 11/2011 | Morrisroe |
| 2011/0298376 A1* | 12/2011 | Kanegae ................ B01J 19/088 315/111.51 |
| 2013/0048851 A1* | 2/2013 | Kumano ............. H01J 49/0431 250/282 |
| 2013/0115780 A1 | 5/2013 | Okumura et al. |
| 2013/0146564 A1 | 6/2013 | Okumura |
| 2014/0061165 A1 | 3/2014 | Stempfer |
| 2014/0087085 A1 | 3/2014 | Gruenler et al. |
| 2014/0131906 A1 | 5/2014 | Hadidi et al. |
| 2015/0079309 A1 | 3/2015 | Krueger et al. |
| 2015/0132866 A1 | 5/2015 | Asad et al. |
| 2015/0366042 A1 | 12/2015 | Zaidi et al. |
| 2016/0271874 A1 | 9/2016 | Tsai et al. |
| 2016/0325487 A1 | 11/2016 | Miller |
| 2016/0329192 A1 | 11/2016 | Sieber et al. |
| 2017/0259501 A1 | 9/2017 | Gandhiraman et al. |
| 2017/0298516 A1 | 10/2017 | Gandhiraman et al. |
| 2018/0006223 A1 | 1/2018 | Gandhiraman |
| 2018/0015730 A1 | 1/2018 | Essien et al. |
| 2020/0258717 A1 | 8/2020 | Gandhiraman et al. |

OTHER PUBLICATIONS

Carrilho, et al. Paper Microzone Plates. Analytical Chemistry. Published on Web Jul. 2, 2009. 81(15):5990-5998. American Chemical Society. https://doi.org/10.1021/ac900847g.

Connor, et al. Room temperature deposition oftunable plasmonic nanostructures by atmospheric pressure jet plasma. Journal of Materials Chemistry. Mar. 29, 2012. 22(19):9485-9489. DOI: 10.1039/c2jm30879g.

Co-pending U.S. Appl. No. 14/515,072, inventors Gandhiraman; Ramprasad et al., filed Oct. 15, 2014.

Co-pending U.S. Appl. No. 16/282,161, inventors Gandhiraman; Ramprasad et al., filed Feb. 21, 2019.

Li, et al. Paper-based microfluidic devices by plasma treatment. Anal Chem. Dec. 1, 2008;80(23):9131-9134. doi: 10.1021/ac801729t.

Mahajan, et al. Optimization of aerosol jet printing for high-resolution, high-aspect ratio silver lines. ACS Appl Mater Interfaces. Jun. 12, 2013;5(11):4856-4864. doi: 10.1021/am400606y. Epub May 22, 2013.

Palgrave, et al. Aerosol assisted chemical vapor deposition using nanoparticle precursors: a route to nanocomposite thin films. J Am Chem Soc. Feb. 8, 2006;128(5):1587-1597. doi: 10.1021/ja055563v.

PCT/US2018/053703 International Search Report and Written Opinion dated Dec. 7, 2018.

Siegel, et al. Foldable printed circuit boards on paper substrates. Adv Funct Mater. Jan. 8, 2010. 20(1):28-35. DOI:10.1002/ADFM.200901363.

U.S. Appl. No. 62/135,826, Tsai, Tsung-Chan, filed Mar. 20, 2015.
U.S. Appl. No. 14/515,072 Office Action dated Aug. 10, 2016.
U.S. Appl. No. 14/515,072 Office Action dated Aug. 23, 2018.
U.S. Appl. No. 14/515,072 Office Action dated Jan. 8, 2018.
U.S. Appl. No. 14/515,072 Office Action dated Mar. 25, 2016.
U.S. Appl. No. 15/454,920 Office Action dated Feb. 4, 2019.
U.S. Appl. No. 15/454,920 Office Action dated Jun. 11, 2020.
U.S. Appl. No. 15/454,920 Office Action dated Nov. 14, 2019.
U.S. Appl. No. 15/477,700 Office Action dated May 18, 2020.
U.S. Appl. No. 15/610,521 Office Action dated Dec. 5, 2019.
U.S. Appl. No. 15/610,521 Office Action dated Jun. 24, 2020.

Ward, et al. Atmospheric pressure plasma deposition of structurally well-defined polyacrylic acid films. Chem Mater. Apr. 2003. 15(7):1466-1469. DOI:10.1021/CM020289E.

Yang, et al. Preparation of active layers in polymer solar cells by aerosol jet printing. ACS Appl Mater Interfaces. Oct. 2011;3(10):4053-4058. doi: 10.1021/am200907k. Epub Sep. 28, 2011.

U.S. Appl. No. 15/477,700 Notice of Allowance dated Jan. 6, 2021.

* cited by examiner

MODULAR PRINT HEAD ASSEMBLY FOR PLASMA JET PRINTING

CROSS-REFERENCE

This application is a continuation application of U.S. patent application Ser. No. 16/649,868, filed Mar. 23, 2020, which claims priority to PCT Application No PCT/US2018/053703, filed on Oct. 1, 2018, which claims the benefit of U.S. Provisional Application No. 62/566,488, filed Oct. 1, 2017 and U.S. Provisional Application No. 62/626,171, filed Feb. 5, 2018, which application is incorporated herein by reference.

STATEMENT AS TO FEDERALLY SPONSORED RESEARCH

This invention was made with government support under US Small Business Innovation Research (SBIR) Phase 1 Award No. 1819676, awarded by the National Science Foundation; and SBIR Phase 1 Award No. 80NSSC18P1990, awarded by the National Aeronautics and Space Administration. The government may have certain rights in the invention.

BACKGROUND OF THE INVENTION

Photolithography, screen printing, laser induced sintering, plasma spray, inkjet printing, aerosol printing, laser sintering are all explored for site selective printing of metals and metal oxides, and organic electronics. Different deposition tools and methods must be adopted for different materials depending on the nature and type of substrate, material to be deposited and the substrate area. This also means increased processing time and increased number of printing tools required for different materials. Plasma printing can be used to print a wide range of materials onto the surface of a substrate. Exemplary materials that can be printed include organic materials, polymers, inorganic materials, metals, metal oxides, alloys, ceramics, composites, semiconductors, cements, pharmaceuticals, synthetic drugs. Plasma printing can provide good adhesion to underlying substrate. In some cases, plasma printing can be an alternative to spray coating, ink jet, aerosol jet printing, screen printing, dip coating, painting and brush coating.

SUMMARY OF THE INVENTION

Described herein is an apparatus for printing, comprising: a plasma module, wherein the plasma module comprises at least one dielectric tube with at least two electrodes on the outer side of the at least one dielectric tube, and wherein the at least two electrodes can be moved along the length of the at least one dielectric tube.

In some embodiments, each of the at least two electrodes comprise a dielectric encapsulation.

In some embodiments, the dielectric encapsulation has a thickness that is greater than the thickness of the at least one dielectric tube.

In some embodiments, the dielectric encapsulation has a thickness that is at least three times greater than the thickness of the at least one dielectric tube.

In some embodiments, the at least two electrodes have different surface areas.

In some embodiments, the dielectric encapsulation comprises a first dielectric material and the dielectric tube comprises a second dielectric materiel, and wherein the first dielectric material has a dielectric strength that is greater than the dielectric strength of the second dielectric material.

In some embodiments, the at least one dielectric tube has a length of about 10 mm to about 200 mm.

In some embodiments, the at least one dielectric tube comprises aluminum oxide, polyether ether ketone (PEEK), polytetrafluoroethylene (PTFE), or a combination thereof.

In some embodiments, the at least one dielectric tube has a diameter of about 0.02 cm to about 2 cm.

In some embodiments, the at least two electrodes are connected a high voltage power supply.

In some embodiments, the at least two electrodes generate a plasma within the at least one dielectric tube in the presence of a gas.

In some embodiments, the gas comprises argon, helium or a combination thereof.

In some embodiments, the apparatus further comprises an inlet module.

In some embodiments, the inlet module can be attached to the plasma module, and/or detached from the plasma module.

In some embodiments, the inlet module comprises at least one inlet.

In some embodiments, the at least one inlet allows for input of one or more materials into the inlet module.

In some embodiments, the inlet module allows for flow of the one or more materials from the inlet module into the at least one dielectric tube of the plasma module.

In some embodiments, the one or more materials are exposed to plasma generated in the at least one dielectric tube.

In some embodiments, a property of the one or more materials is changed when the one or more materials are exposed to the plasma.

In some embodiments, the property comprises an oxidation state, a morphology, a molecular structure, or a combination thereof.

In some embodiments, the apparatus further comprises a nozzle module.

In some embodiments, the nozzle module can be attached to the plasma module, and/or detached from the plasma module.

In some embodiments, one or more materials flow from the plasma module into the nozzle module.

In some embodiments, the nozzle module comprises an inner orifice and an outer orifice.

In some embodiments, the inner orifice of the nozzle module is in fluid contact with the plasma module.

In some embodiments, the inner orifice has a diameter that is less than, equal to, or greater than the diameter of the outer orifice.

In some embodiments, one or more materials exit the apparatus through the outer orifice of the nozzle module onto a substrate.

In some embodiments, the outer orifice is in fluid communication with a substrate.

In some embodiments, the one or more materials are printed on a surface of the substrate.

In some embodiments, the one or more materials form a film on the surface of the substrate.

In some embodiments, the distance between the at least two electrodes along the length of the at least one dielectric tube by about 1 mm to about 180 mm.

Described herein is an apparatus comprising: an inlet module, wherein the inlet module comprises one or more inlets, and an atomizer; and the plasma module described herein.

In some embodiments, one or more materials enter the inlet module through the one or more inlets.

In some embodiments, the atomizer aerosolizes the one or more materials that enter the inlet module through the one or more inlets.

In some embodiments, the one or more materials comprise an optical material.

In some embodiments, the inlet module is in fluid communication with the plasma module.

In some embodiments, the atomizer operates at a frequency of about 50 kHz to about 10 MHz.

In some embodiments, the inlet module can be attached to the plasma module and/or can be detached from the plasma module.

Described herein is an apparatus comprising: a fluid delivery assembly; and the plasma module described herein.

In some embodiments, the fluid delivery assembly can be attached to the plasma module and/or can be detached from the plasma module.

In some embodiments, the fluid delivery assembly comprises a cartridge.

In some embodiments, the cartridge comprises an ink reservoir.

In some embodiments, the fluid delivery assembly further comprises an atomizer, one or more fluid inlets, one or more fluid outlets, a dielectric spacer, a lip, or a combination thereof.

In some embodiments, the fluid delivery assembly is in fluid communication with the plasma module.

In some embodiments, the dielectric spacer connects the fluid delivery assembly to the plasma module.

In some embodiments, the dielectric spacer of the fluid assembly has a length that is greater than the distance between the at least two electrodes in the plasma module.

In some embodiments, the fluid delivery assembly comprises two or more cartridges.

In some embodiments, the apparatus comprises the fluid delivery assembly, the plasma module, and a nozzle module.

In some embodiments, the nozzle module can be attached to the plasma module, and/or detached from the plasma module.

Described herein is a method of printing, comprising: introducing one or more materials to be printed into the plasma module described herein; exposing the one or more materials to plasma in the plasma module, and printing the plasma-treated one or more materials on one or more substrates.

INCORPORATION BY REFERENCE

All publications, patents, and patent applications mentioned in this specification are herein incorporated by reference to the same extent as if each individual publication, patent, or patent application was specifically and individually indicated to be incorporated by reference.

BRIEF DESCRIPTION OF THE DRAWINGS

The novel features of the invention are set forth with particularity in the appended claims. A better understanding of the features and advantages of the present invention will be obtained by reference to the following detailed description that sets forth illustrative embodiments, in which the principles of the invention are utilized, and the accompanying drawings or figures (also "FIG." and "FIGs." herein), of which:

FIG. 1 is a cross sectional view of an exemplary print head for directing and accelerating the materials and gas mixtures introduced into the print head by generating an arc-less plasma.

FIG. 2 is a cross sectional view of an exemplary inlet manifold connected to the primary and secondary dielectric tube.

FIG. 3 is cross sectional view of an exemplary plasma manifold containing electrodes that could be moved along the circumference of the primary dielectric tube, a dielectric enclosure of the electrode, and an outer shield.

FIG. 4 shows cross sectional views of an exemplary modular portion of the print head, called plasma manifold, containing electrodes connected to high voltage power supply. Five different configurations of electrodes are shown.

FIG. 5 shows an exemplary gradient plasma setup wherein the primary dielectric tube carries electrodes 221*a*, 221*b*, 231*a*, 231*b* connected to power supplies which can be independently controlled to create gradient plasma and temperature gradient in the primary dielectric tube.

FIG. 6 shows an exemplary primary dielectric tube and an optional secondary dielectric tube 140 inside the primary dielectric tube whose length can be varied depending on the application.

FIG. 7A is a cross sectional view of an exemplary nozzle module that can be attached to a primary dielectric tube with an orifice whose inner diameter can either be same as primary dielectric tube or constantly decreasing and lower than the inner diameter of the primary dielectric tube.

FIG. 7B is a cross sectional view of an exemplary nozzle module that can be attached to a primary dielectric tube showing the material to be printed and the after-glow region of the plasma discharge.

FIG. 7C is a cross sectional view of an exemplary nozzle module with an inlet at the nozzle for introducing a gas that can be used for focusing or for tailoring the material properties in glow discharge region of the plasma.

FIG. 8A shows an exemplary printing process using a sacrificial orifice or mask printed on a substrate with precise geometry of printed material. The plasma glow discharge region containing the material that is directed out of the nozzle for printed with certain geometry and/or resolution can be precisely printed with a high resolution and/or precision by using a sacrificial mask whose orifice diameter or opening is smaller than the orifice opening.

The sacrificial orifice or mask as shown in FIG. 8B can be indexed when deposition builds up or for different shape. When an orifice in sacrificial mask is clogged or if deposition builds up or when different pattern is required the sacrificial orifice or mask can be adjusted or replaced to get a new unclogged orifice and/or a new pattern depending on the need.

FIG. 9 provides four examples of different shaped sacrificial orifices or patterned masks.

FIGS. 10A and 10B provide photographs of exemplary modular print heads of different configurations.

FIGS. 11A and 11B provide photographs of exemplary modular print heads of different configurations with the plasma ON.

FIGS. 12A and 12B provide photographs of exemplary modular prints heads in a configuration without a nozzle module an in a configuration that is electrically grounded.

FIG. 13 is a cross sectional view of an exemplary print head for aerosolizing and patterned printing of optical and plasmonic materials.

FIG. 14A is a cross sectional view of an inlet portion of an exemplary plasma print head comprising one atomizer for aerosolized liquid (precursor) delivery and two gas inlets connected to an inlet module and a dielectric tube in which plasma is generated.

Figure 28:
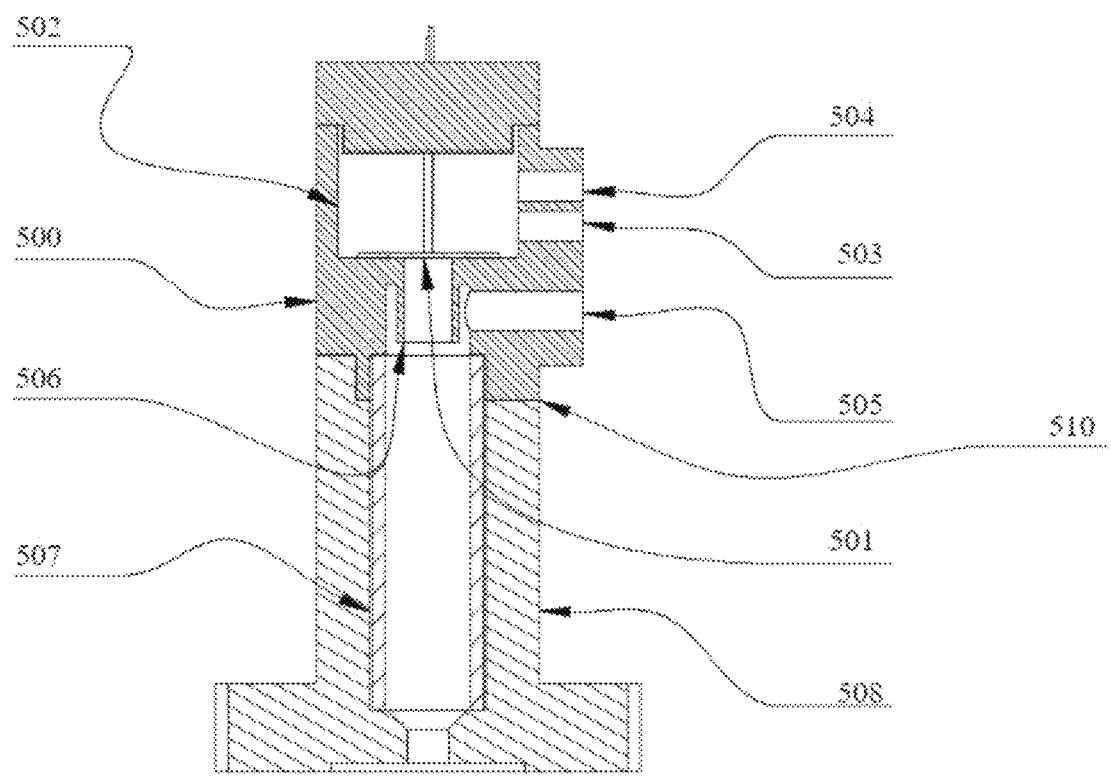

FIG. 28 provides an exemplary fluid delivery assembly.

Figure 29:
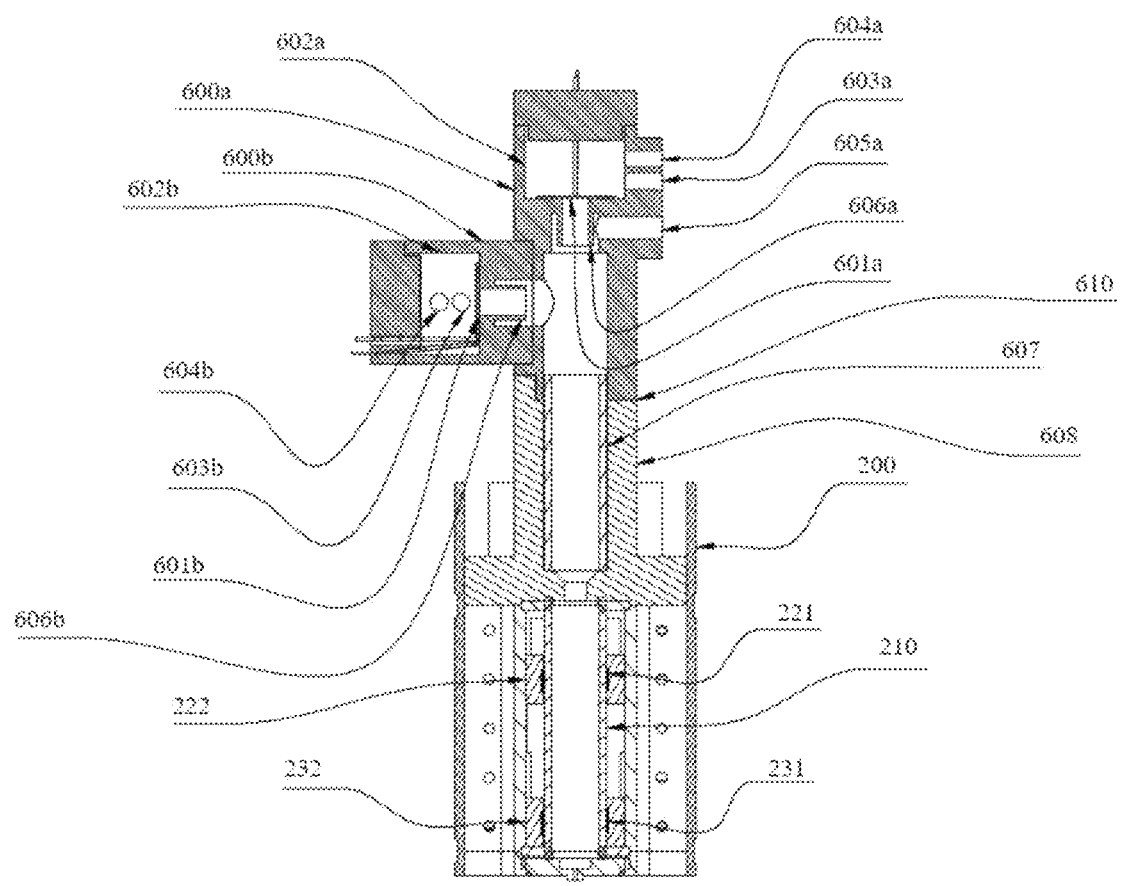

FIG. 29 provides an exemplary multi-material fluid delivery system with two cartridges.

Figure 30:
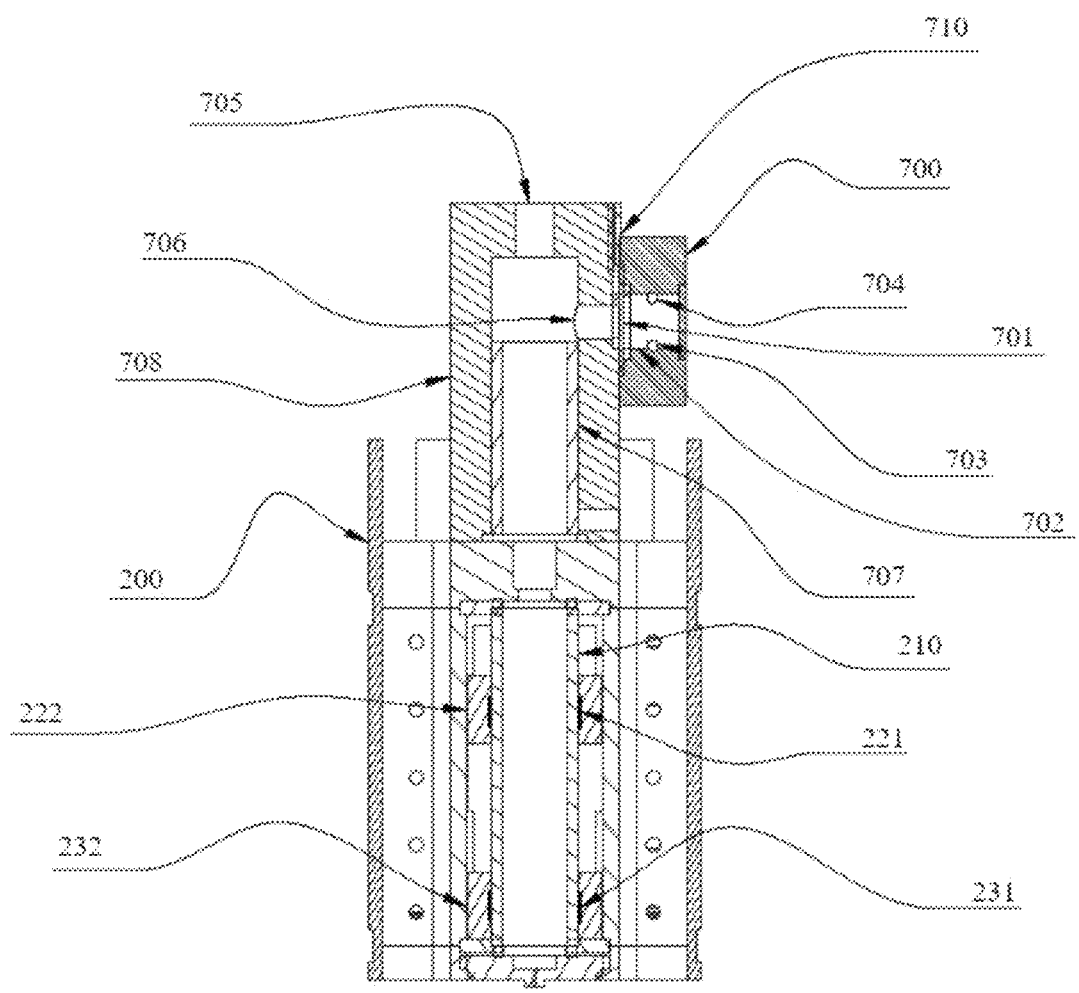

FIG. 30 shows a fluid delivery assembly with a cartridge mounted vertically on a coupler

DETAILED DESCRIPTION OF THE INVENTION

Provided herein is a modular print head assembly for plasma jet printing, patterning and treatment of surfaces and materials. Patterned printing, controlled deposition of materials and treatment of materials, using atmospheric pressure plasma, can be used for the manufacturing of a wide range of products. In some cases, printing of materials with good adhesion to the underlying substrate and tailored material properties can be obtained using atmospheric pressure plasma.

Atmospheric pressure plasma jet printing of wide range of materials including metals, metal oxides, organics, inorganics, organic electronics, composites, alloys, polymers, drugs, and pharmaceuticals, in a defined pattern and large area can be carried out using any or all of the atmospheric plasma techniques like cold plasma, high temperature plasma, glow discharge plasma, and plasma spray.

The ability to print a wide range of materials and to mix materials to form polymers, composites, drugs, and alloys for printing, make plasma jet printing a versatile technique in comparison to state of the art and conventional printing, coating, and/or painting techniques.

There are several benefits to plasma in printing including propelling materials towards the substrate for printing; changing and/or tailoring material characteristics on-flight to the substrate before, during and/or after printing; retaining pristine material characteristics; increasing adhesion of the material to the substrate surface; polymerizing plasma; depositing materials in multi-layer; and formation of composites and alloys, to name a few.

Printing of materials and treatment of materials to change their properties using atmospheric pressure plasma jet requires optimized configuration of electrodes, electrode spacing and design.

In order to efficiently use plasma jet printing for reliable and reproducible fabrication of devices, high volume production and manufacturing, and other treatment of materials, the plasma jet print head should be robust, easy to use, easy to change configuration and easy to replace.

The print head should have provision to deal with multiple materials, multiple line widths, varying resolution, geometries and small/large area printing.

In addition, the ability to replace the nozzle in an easy, user friendly, time effective manner is crucial for long term continued use of the system.

The ability to change the nozzle diameter to effectively change print resolution in an easy, user friendly, time effective manner is also important for both research and development work as well as for volume manufacturing.

The characteristics and properties of the materials printed and/or treated by plasma can be tailored and changed by appropriate choices of plasma characteristics.

The characteristics of the plasma can be varied by effectively changing the electrode configuration, electrode surface area, dielectric tube, plasma volume, dielectric area contained between the electrodes, power characteristics, or a combination thereof.

The plasma jet print head should have the provision to change the electrode configuration. In addition, the plasma jet print head should have the provision to change the area between the electrodes to tailor the plasma characteristics to suit certain material printing.

One of the key challenges in plasma jet printing is arcing between electrodes and arcing between the print head and substrate and/or substrate holder, if it happens to include metal or metallic printed features. Arcing between electrodes can result in severe damage to the print head and cause electrical and fire safety issues. Arcing between the print head and the metal substrate or metal substrate holder or metallic printed features can seriously damage the substrate to be printed and also the printed features.

For efficient, reliable and reproducible printing of materials using plasma jet and for volume production of devices using plasma jet printer, the print head needs to have provisions that allow for flexible electrode configuration with modular design; allow for flexible modular design of dielectric tubes; avoid failure like arcing between electrodes that will not only damage the print head but also the substrate; and minimize loss of materials during printing, with minimal or no loss during movement from the cartridge/reservoir to the nozzle.

Treatment of materials to change chemical structure, molecular structure, oxidation state, morphology; to inactivate microbes; to remove organics; to decontaminate, or a combination thereof, requires optimal configuration of the plasma with provisions for changing the electrode spacing, thermal gradient, plasma gradient or a combination thereof, so that the energetic bombardment of plasma-generated species and the reactive species generated in plasma can have maximum impact on the surface being treated.

The electrodes in the print head could be placed in any of a variety of configurations. In some cases, the electrodes are disposed along the circumference of the dielectric tube. In some cases, the electrodes are arranged with a central tube electrode that is placed inside the dielectric tube and another electrode disposed at the outer wall of the dielectric tube.

Arcing between electrodes can take place either at the inner side of the dielectric tube (internal arcing) or at the outer side of the dielectric tube (external acting) of the print head that can potentially damage the print head, substrate, or power supply. In addition, this poses a serious electrical safety issues in operation of plasma jet printing. Addressing these safety concerns require appropriate shielding and spacing of electrodes, flexibility in having multiple electrodes with required electrode spacing and configuration.

Loss of materials to the inner walls of the dielectric tube during transportation and printing is a common issue that needs to be addressed. Using the primary gas that is used for generating plasma discharge as the only source of gas for both carrier as well as printing purpose, this can cause the plasma to extend far beyond the electrode region and all the way through both the sides of the print head and dielectric tube depending on the applied voltage.

Having an extended plasma throughout the dielectric tube and print head can be detrimental and can cause loss of materials to the inner walls of the tube through collisions. This may result in reduced throughput of printing, poor printing performance, loss of dielectric characteristics of the inner portion of the tube. In some cases, this may further result in device failure, and need for a larger quantity of precursor materials for plasma printing compared to non-plasma printing for same feature size printing.

One aspect of the disclosure provided herein is a modular print head. In some embodiments, the modular print head can focus and direct a material in a geometrical pattern using plasma jet and electric field to print the material on a substrate. In some cases, the modular print head comprises a modular assembly of tubes, and movable electrodes. In some embodiments, an electric field is applied to the movable electrodes to generate plasma. The design of the modular print head avoids internal and external arcing in the tube.

In the following description provided herein, for purposes of explanation, specific details are set forth in order to provide an understanding of the invention. It will be apparent, however, to one skilled in the art that the invention can be practiced without these details. Furthermore, one skilled in the art will recognize that embodiments of the present invention, described below, may be implemented in a variety of ways, such as a process, an apparatus, a system, a device, or a method on a tangible computer-readable medium.

References will be made to embodiments of the invention, examples of which may be illustrated in the accompanying figures. These figures are intended to be illustrative, not limiting. Although the invention is generally described in the context of these embodiments, it should be understood that it is not intended to limit the scope of the invention to these particular embodiments.

It should be noted that steps or operations may be performed in different orders or concurrently, as will be apparent to one of skill in the art. And, in some instances, well known process operations have not been described in detail to avoid unnecessarily obscuring the present invention.

Components shown in diagrams are illustrative of exemplary embodiments of the invention and are meant to avoid obscuring the invention. It should also be understood that throughout this discussion that components may be described as separate functional units, which may comprise sub-units, but those skilled in the art will recognize that various components, or portions thereof, may be divided into separate components or may be integrated together including integrated within a single system or component. It should be noted that functions or operations discussed herein may be implemented as components. Embodiments of the present invention include apparatus and methods for printing materials with required pattern, material properties and precision and also treatment of materials, surfaces, organics, microbes for changing any one or more of the properties including morphology, topography, surface energy, oxidation state, molecular structure, chemical structure etc.

Figure 1:
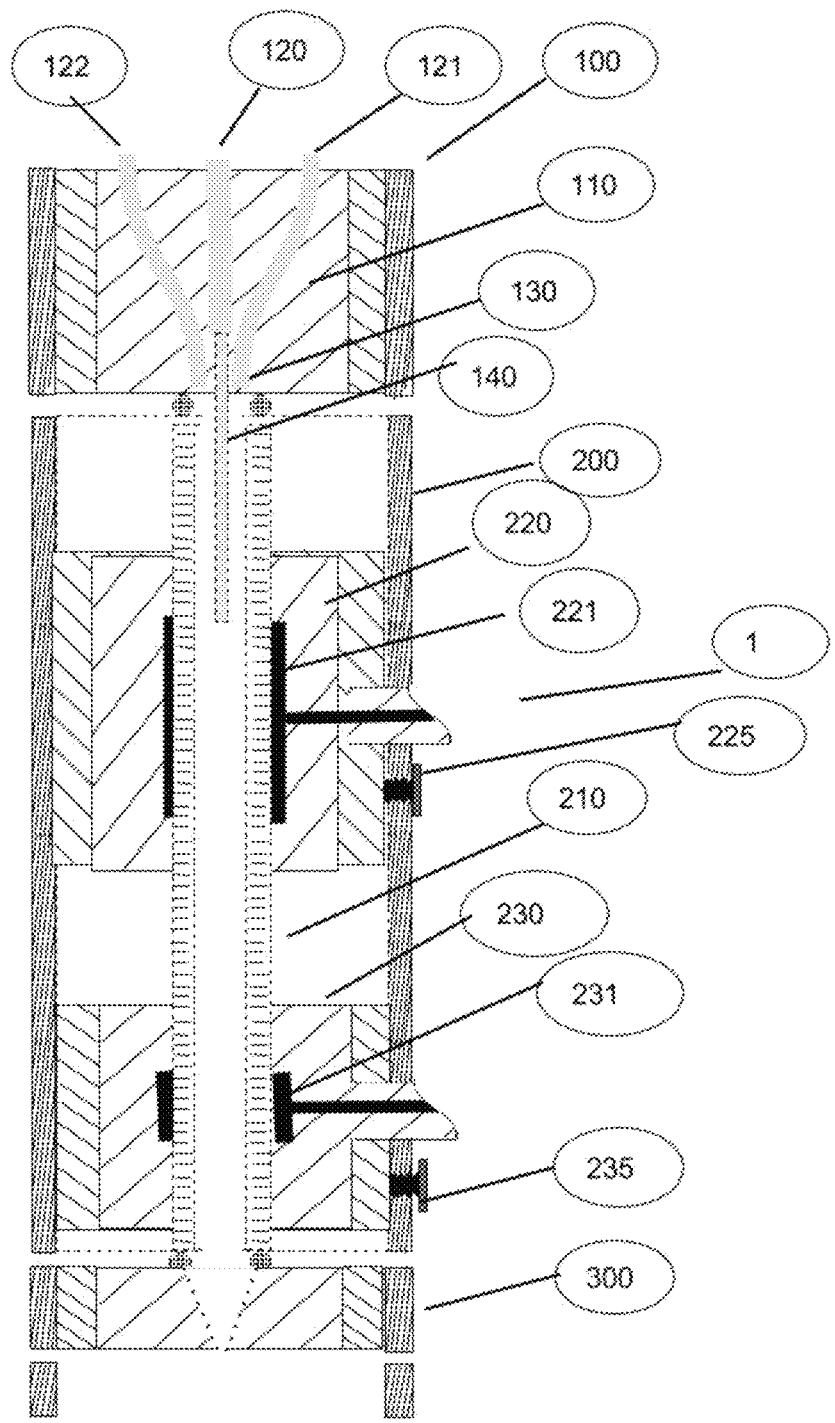

FIG. 1 provides a cross-section view of an exemplary print head 1. In some embodiments, the print head 1 comprises an inlet manifold 100. In some embodiments, the print head 1 comprised a plasma manifold 200. In some embodiments, the print head 1 comprises a nozzle manifold 300. In some embodiments, the print head 1 comprises a modular assembly comprising an inlet manifold 100, a plasma manifold 200, a nozzle manifold 300, or a combination thereof. A modular assembly can allow the different manifolds to be dismantled and connected together as needed, depending on the required plasma characteristic and the type/quality of materials being printed.

In some embodiments, the inlet manifold 100 comprises a dielectric material to create a dielectric inlet manifold 110. In some cases, the dielectric material comprises ceramics. In some cases, the dielectric material comprises aluminum oxide, polyether ether ketone (PEEK), polytetrafluoroethylene (PTFE).

In some embodiments, the dielectric inlet manifold 110 comprises one or more inlets. The one or more inlets provide for the entry of one or more materials. In some cases, the one or more materials comprise a gas. In some cases, the gas comprises helium, argon, hydrogen, nitrogen, or a combination thereof. In some cases, the one or more materials comprise a metallic colloid. In some cases, the metallic colloid comprises a copper nanomaterial, a silver nanomaterial, a gold nanomaterial, or a combination thereof. In some cases, the one or more materials comprise a precursor material. In some cases, the precursor material comprises an organic precursor. In some cases, the organic precursor comprises hexamethyldisiloxane, tetraethyl orthosilicate, (3-amino propyl)triethoxy silane, or a combination thereof. In some cases, the dielectric inlet manifold 110 comprises three inlets 120, 121, and 121.

In some embodiments, the inlet manifold 100 is connected to the plasma manifold 200. In some cases, the dielectric inlet manifold comprises an opening 130. The opening 130 may allow a primary dielectric tube 210 of the plasma manifold 200 to connect with the inlet manifold 100. In other cases, one of the inlets 120 can connect with an optional secondary dielectric tube 140. In those cases, the dielectric tube 140 can have a variable length. The length of the dielectric tube 140 can depend on the nature and the type of material to be printed. In some cases, the secondary dielectric tube 140 ends before the beginning of the one or more electrodes 221 of the plasma manifold 200. In some cases, the secondary dielectric tube 140 extends beyond electrode 221 and ends before the beginning of electrode 231. In some cases, the secondary dielectric tube 140 extends beyond electrode 231. In some cases, the secondary dielectric tube 140 extends to the nozzle manifold 300.

Figure 2:
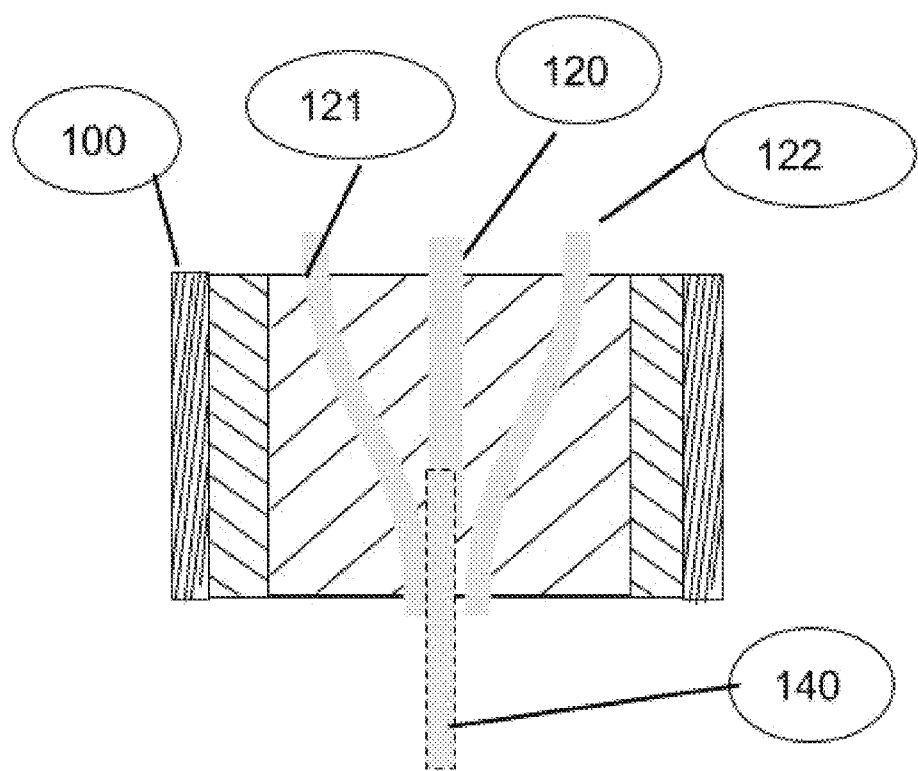

FIG. 2 is a cross sectional view of the exemplary inlet manifold 100. In this exemplary embodiment, the dielectric inlet manifold 110 comprises three inlets 120, 121, and 122. FIG. 2 also provides an optional secondary dielectric tube 140.

Figure 3:
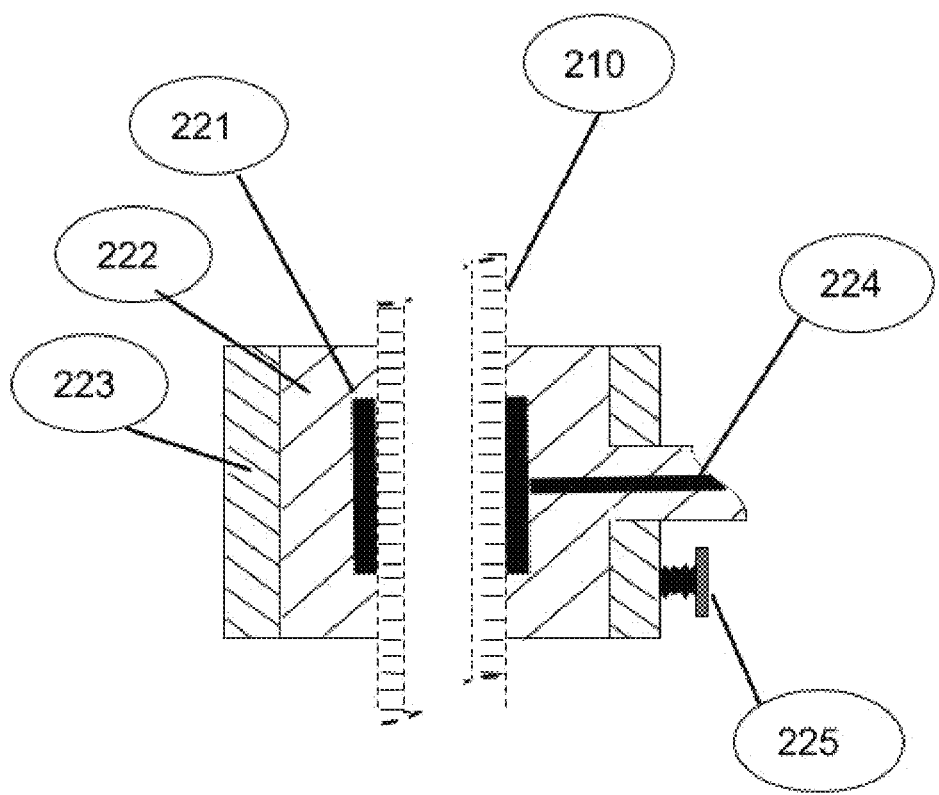

FIG. 3 is a cross sectional view of an exemplary plasma manifold 220. In some embodiments, the plasma manifold 220 comprises one or more electrodes. In the exemplary embodiment of FIG. 3, the plasma manifold 220 comprises two or more electrodes 221, 231 that could be moved along a circumference of a primary dielectric tube 210. In some embodiments, the electrodes 221 and 231 can contain one or more dielectric enclosures 222 and 232 and an outer shield 223 that connect all the three major portions of the modular print head 1, namely inlet module 100, plasma module 200 and nozzle module 300. In FIG. 3, the plasma module 200 can contain an electrical feedthrough 224 that is connected to the electrode 221 with dielectric encapsulation 222. The electrodes 221 and 231 in the plasma manifold are fixed to the primary dielectric tube 210 using an adjustable mechanical position controller 225 and 235. The position controller can be a screw, slide or be made of any adjustable fixture, and can be moved along the axis of the primary dielectric tube 210 by manual or by using a mini motor. The spacing between electrodes 221 and 231 (shown in FIG. 1) can be controlled using the position controller 225 and 235 depending on the nature and type of materials being printed and the plasma characteristics required to obtain molecular precision in printing.

Figure 4:
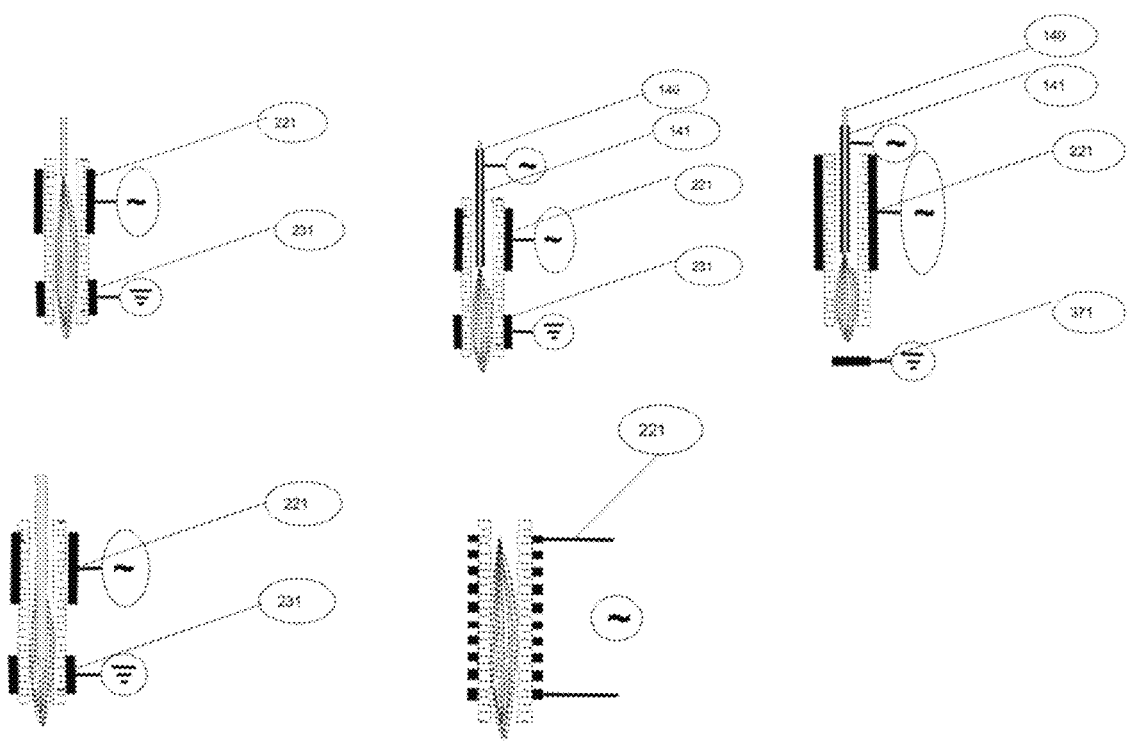

FIG. 4 provides exemplary cross sectional views of a plasma module 200, comprising one or more electrodes. The one or more electrodes can be connected to high voltage power supply. Different configurations of electrodes are shown in FIG. 4 with varying electrode spacing and surface area. FIG. 4A shows bottom electrode 231 connected to ground and electrode 221 connected to high voltage. In this embodiment, the secondary dielectric ends before the top electrode. FIG. 4B shows an additional electrode 141 dispersed along the circumference of the secondary inner dielectric 140. FIG. 4C shows the electrode 371 placed outside the print head, connected to ground while the two electrodes 221 and 141 are connected to high voltage. FIG. 4D shows that the bottom electrode 231 is connected to ground and top electrode 221 is connected to high voltage while the length of the secondary dielectric 140 is extended till the bottom electrode 231. FIG. 4E shows a ring electrode 221 connected to high voltage power supply.

Figure 5:
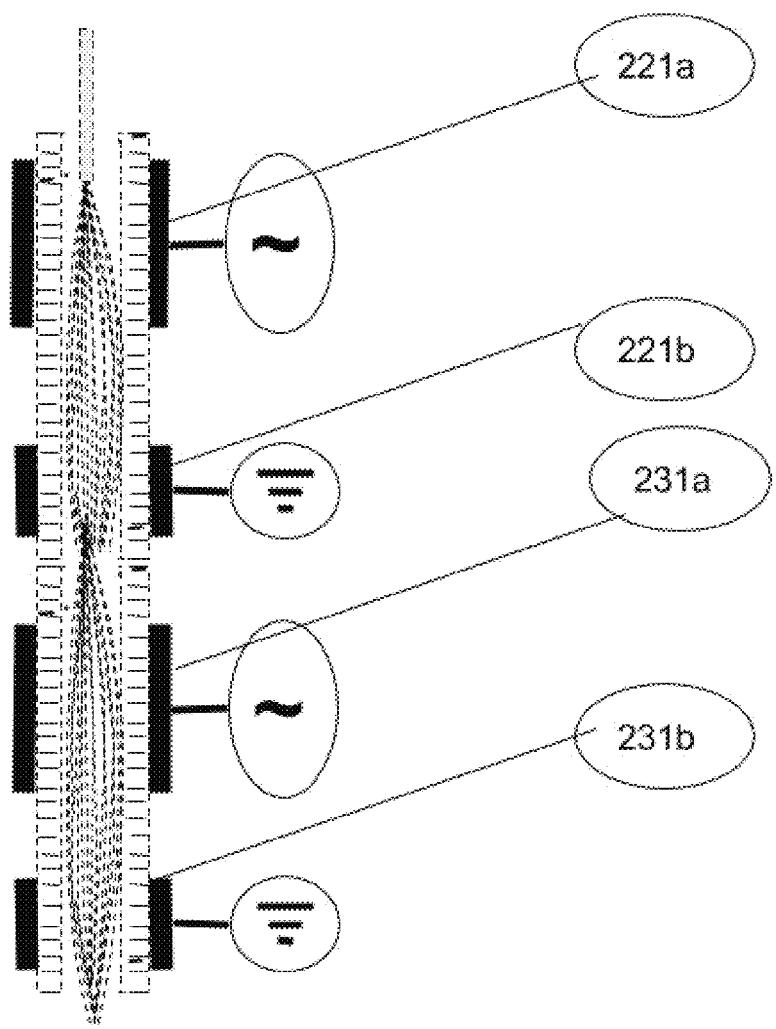

FIG. 5 provides an exemplary gradient plasma setup with an illustrative primary dielectric tube 210 comprising one or more electrodes 221a, 221b, 231a, and 231b. The one or more electrodes can be connected to power supplies which can be independently controlled to create a gradient plasma and a temperature gradient in the primary dielectric tube.

Figure 6:
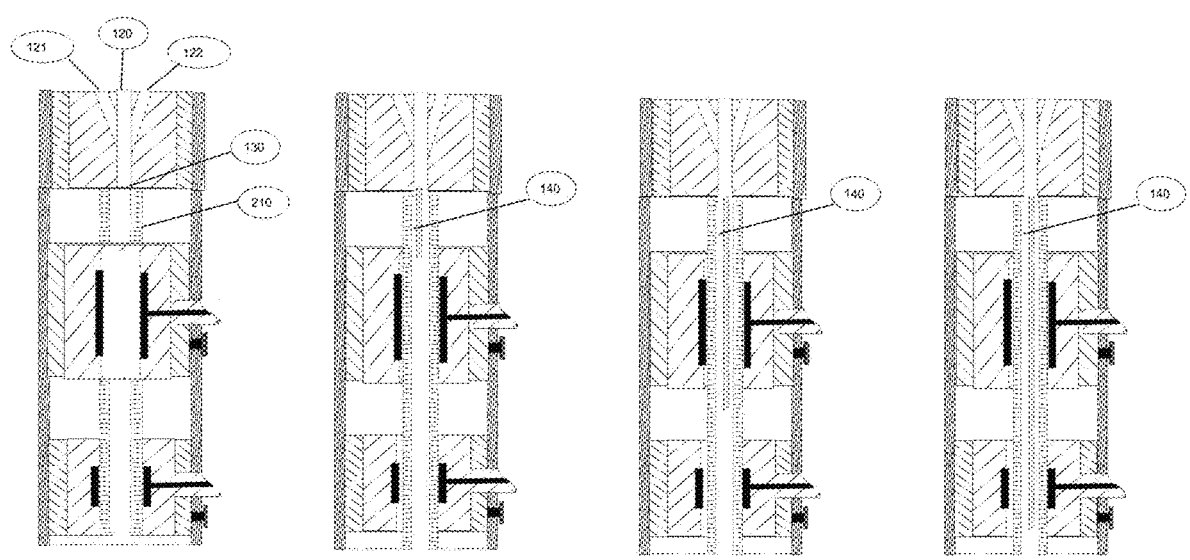
Figure 7A:
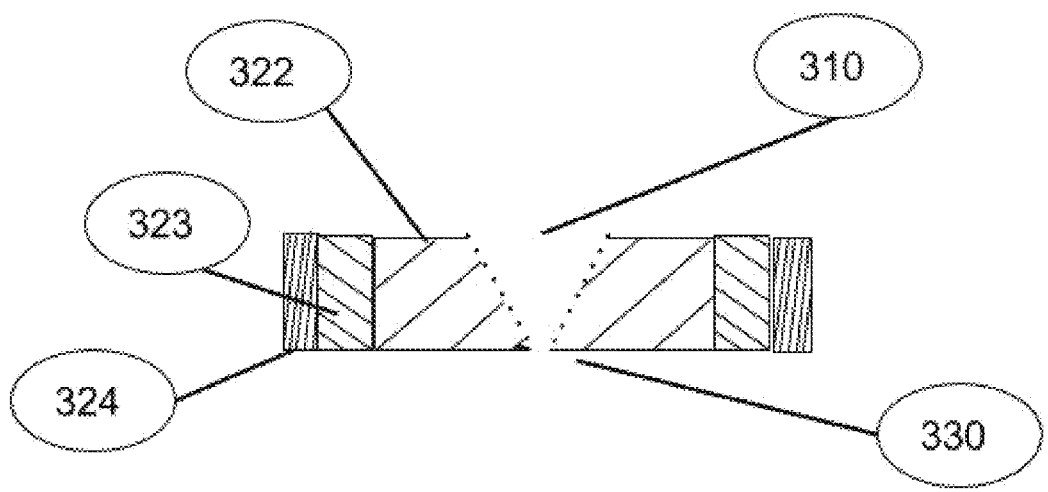

FIG. 6 provides cross sectional view of an exemplary modular print head comprising an inlet module and a plasma module. The print head can comprise a primary dielectric tube 210 and an optional secondary dielectric tube 140. The length of the optional secondary dielectric tube 140 whose length can be varied depending on the application so that the material coming out of secondary dielectric tube is either exposed to the entire plasma region comprising two or more electrodes or to a partial plasma region or to a glow discharge region of the plasma close to the nozzle FIG. 7A is a cross sectional view of an exemplary nozzle module 300. In some embodiments, the nozzle module 300 can be attached to the primary dielectric tube 210 of the plasma module 200. In some embodiments, the nozzle module 300 comprises a nozzle with an orifice 330. In some cases, the inner diameter of the orifice 310 can be controlled and varied as needed depending on the application and type/nature of material being printed. In some cases, the diameter of the orifice 330 of the nozzle is the same at the inner diameter of the orifice 310. In other cases, the diameter of the orifice 330 is smaller than the inner diameter of the orifice 310.

In some embodiments, the nozzle module 300 comprises of a dielectric material 322. In some cases, the dielectric material 322 is surrounded by an outer shield 323. In some cases, the outer shield 323 can be connected electrically to ground. In some cases, a protective enclosure or housing 324 can be used to connect the nozzle module to the plasma module 200 to complete a modular dielectric print head assembly.

Figure 7B:
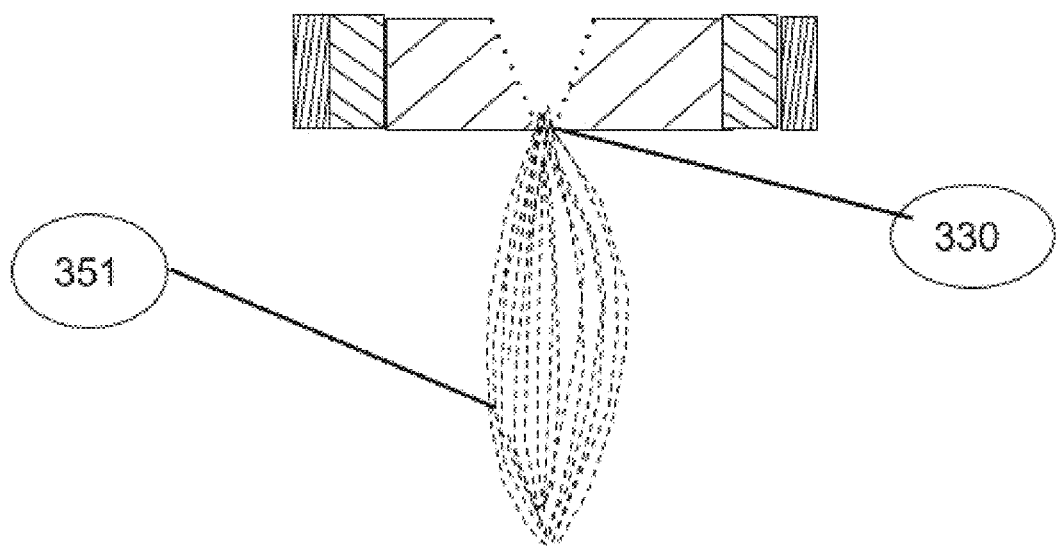

FIG. 7B provides an exemplary illustration of a discharge 351 from the orifice 330 of the nozzle module.

Figure 7C:
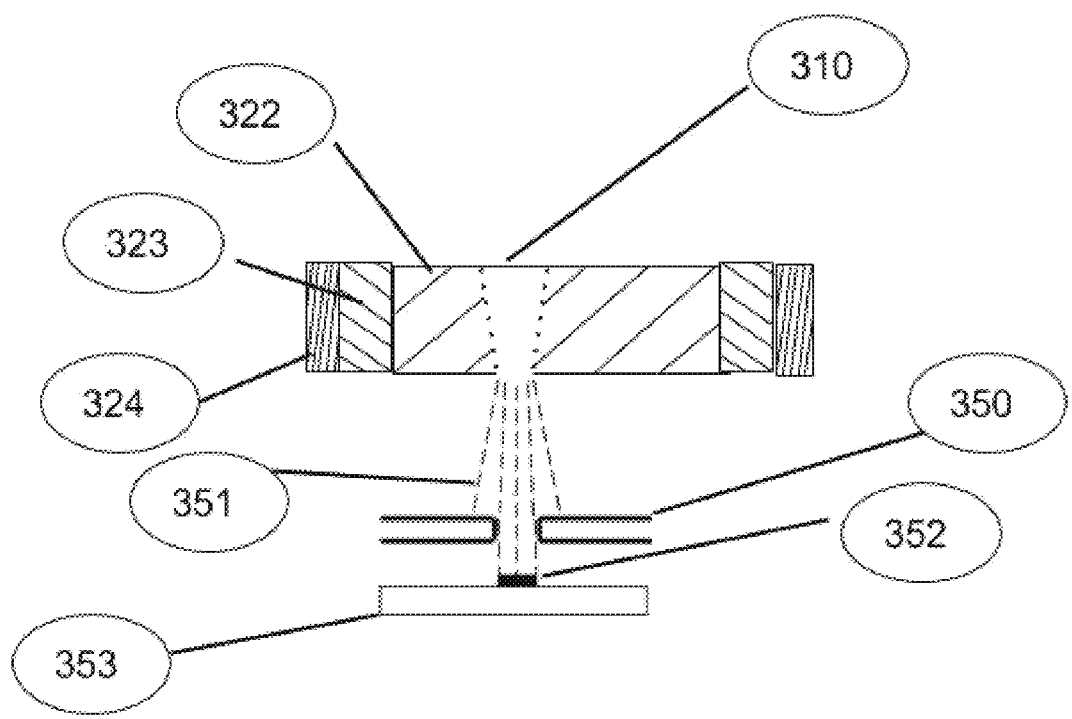

FIG. 7C provides an exemplary embodiment of a nozzle module comprising a gas inlet 360. In some cases, a gas 361 provided through the gas inlet 360 can be used to focus any material exiting the plasma module. In some cases, the gas 361 provided through the gas inlet 360 can tailor one or more properties of the material in the discharge 351 at the glow discharge region.

Figure 8A:
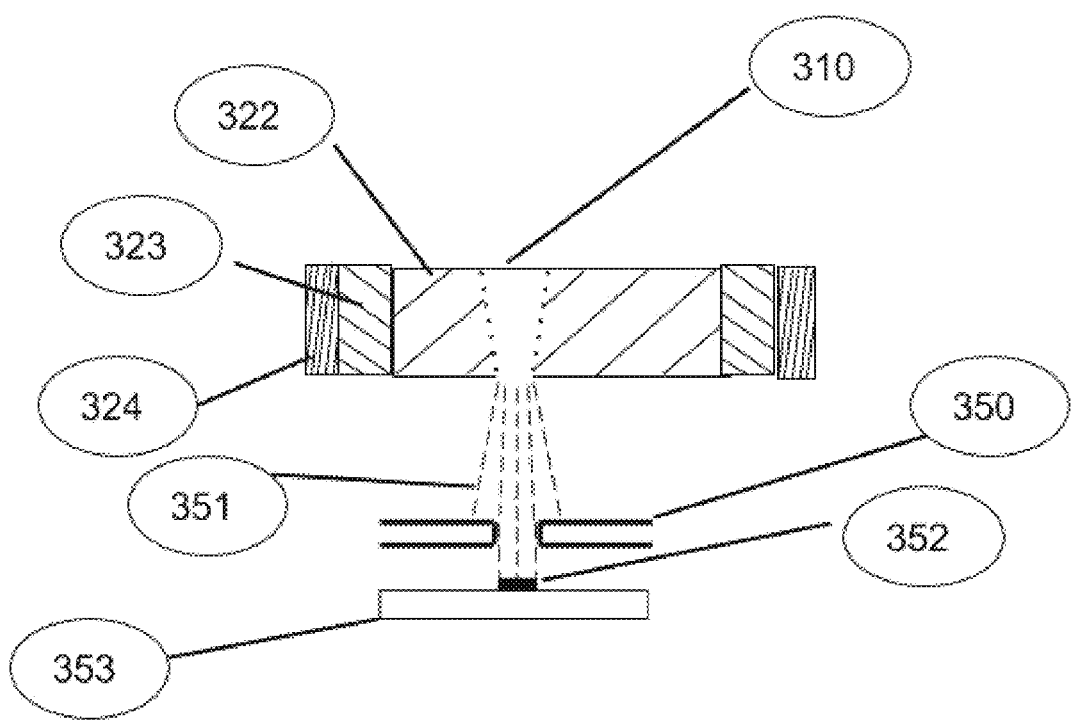

FIG. 8A is an exemplary schematic of printing using the nozzle module of the modular print head. The exemplary embodiment comprises printing using a sacrificial orifice or mask 350, to print on a substrate 353 with precise geometry of printed material 352. The plasma glow discharge region containing the material 351 is directed out of the nozzle module 300 for printing with a geometry of interest, a resolution of interest, or a combination thereof. Printing with a high resolution, a high precision, or a combination thereof, can be achieved by using a sacrificial mask 350. In some embodiments, the diameter of the orifice or opening of the sacrificial mask 350 is smaller than the orifice opening 330 of the nozzle module 300. In some embodiments, the diameter of the orifice or opening of the sacrificial mask 350 is about the same as the orifice opening 330 of the nozzle module 300. In some embodiments, the diameter of the orifice or opening of the sacrificial mask 350 is greater than the orifice opening 330 of the nozzle module 300.

Figure 8B:
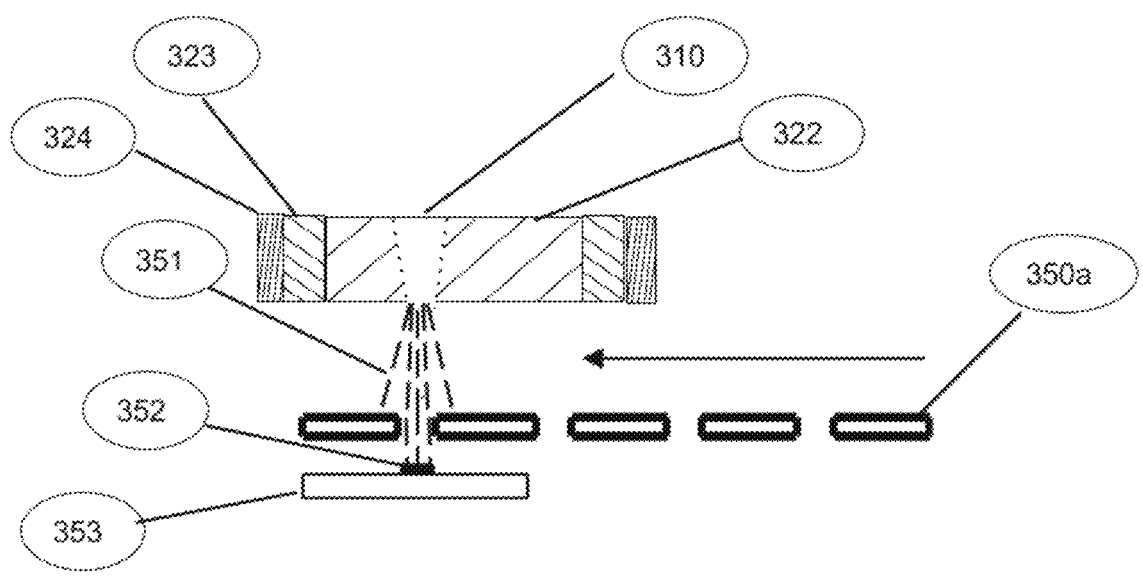

In some embodiments, the sacrificial orifice or mask 350a as shown in FIG. 8B can be indexed when deposition builds up. In some embodiment, the sacrificial orifice or mask 350a can be indexed for different shape.

In some cases, the quality of printing may be disrupted. For example, an orifice in sacrificial mask may become clogged; or deposition may build up on the sacrificial mask.

In those cases, the sacrificial orifice or mask 350 can be adjusted or replaced to get a new unclogged orifice.

In some cases, two or more different patterns may be required for printing. In those cases, the sacrificial orifice or mask 350 can be adjusted or replaced to get a new pattern depending on the need.

Figure 9:
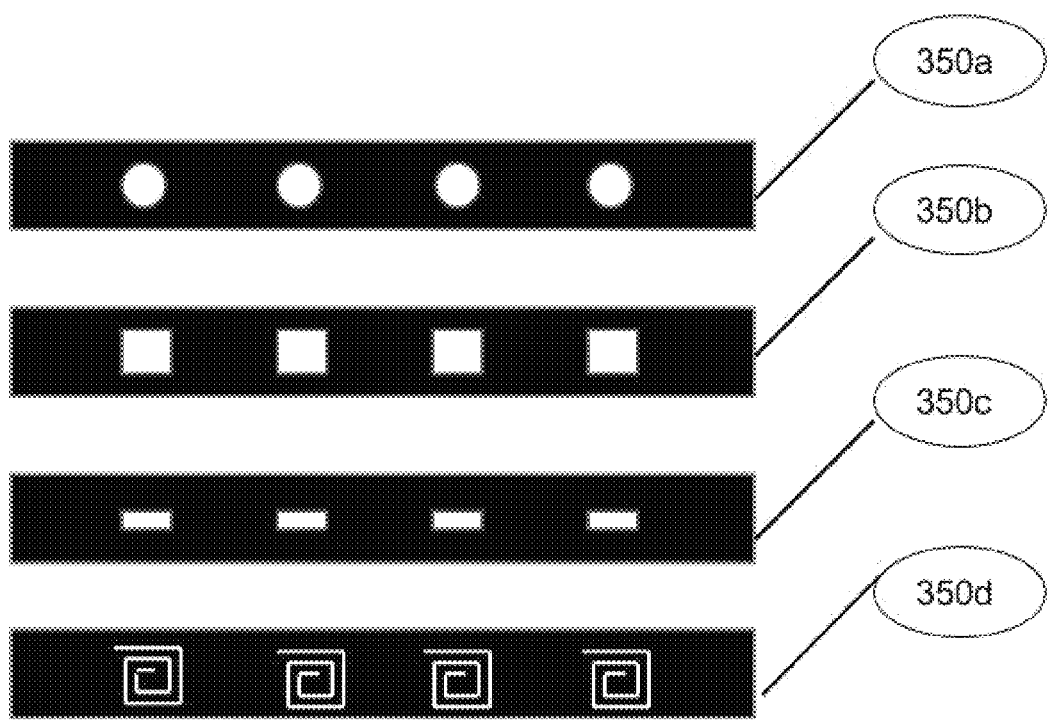

In some embodiments, the sacrificial orifice or mask 350 comprises one or more orifices or patterns. FIG. 9 shows examples of different shaped sacrificial orifices or patterned masks 350 a, 350b, 350c, and 350d. The patterned masks and the sacrificial orifices could be made of any material including metals, dielectric materials, silicon, plastic, or a combination. The patterned masks and sacrificial orifices could be made using any of the known methods including laser etching, wet etching, plasma etching, lithography process, or a combination thereof.

Figure 10A:
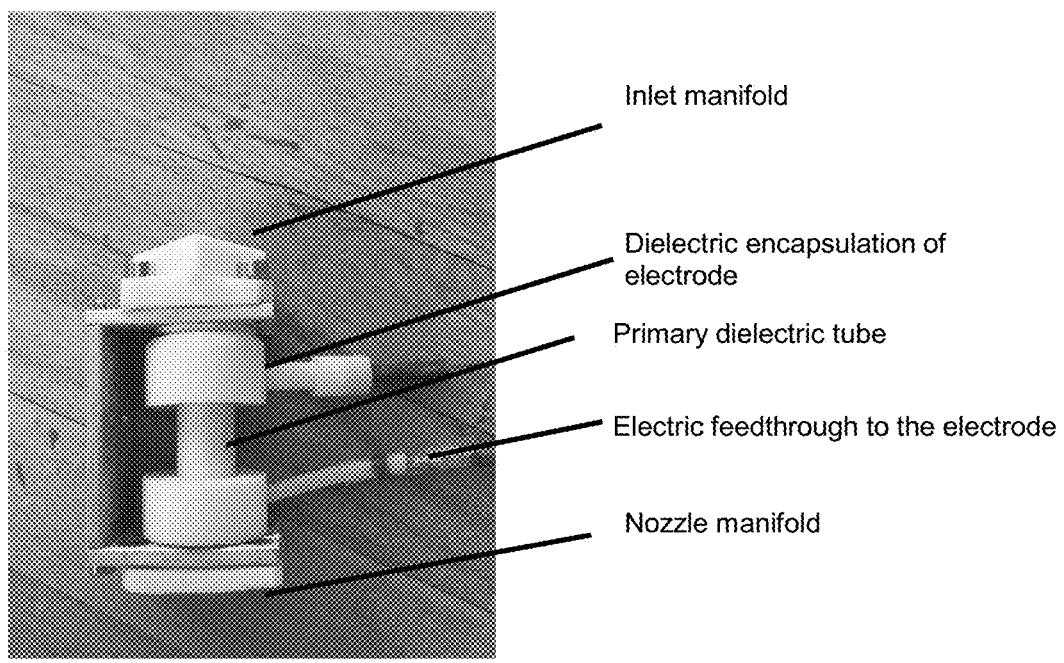
Figure 10B:
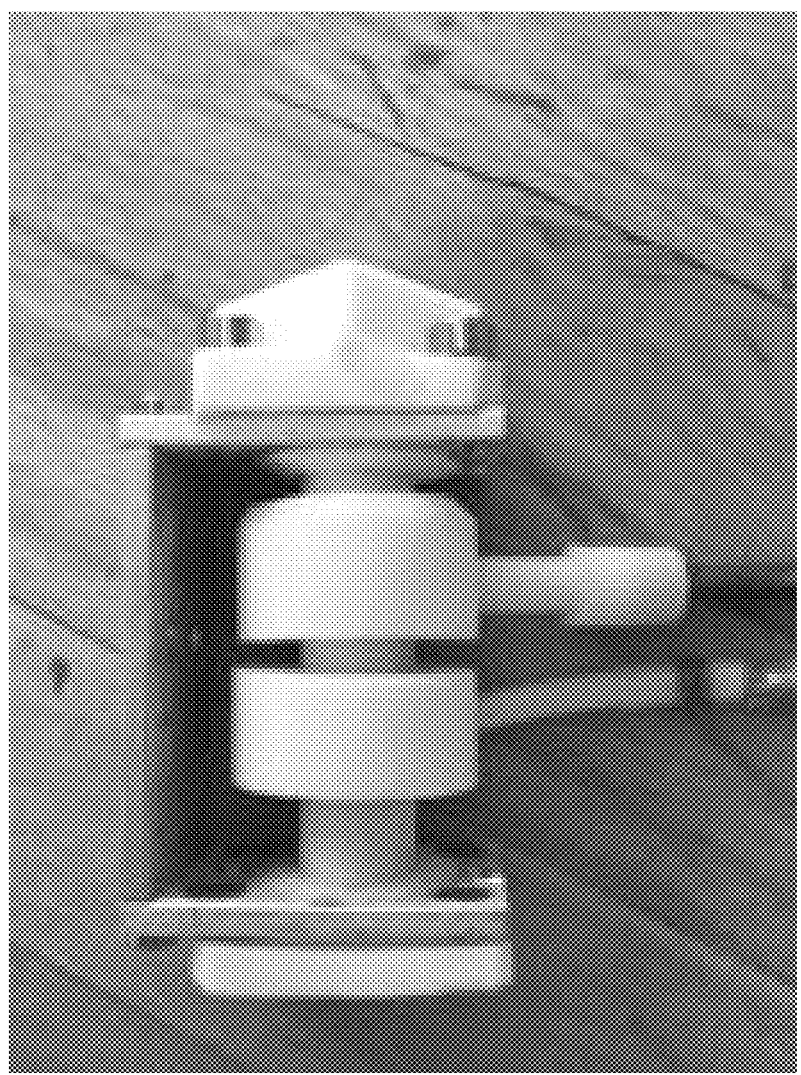

FIG. 10A is a photograph of an exemplary modular print head comprising an inlet manifold, a plasma manifold and a nozzle manifold. In this exemplary embodiment, the print head comprises an electrode, a dielectric encapsulation of the electrode, a primary dielectric tube, and an electric feedthrough to the electrode. FIG. 10B is a photograph of an exemplary modular print of a different configuration. In this embodiment, the print head comprises a short electrode spacing.

Figure 11A:
Figure 11B:

FIG. 11A and FIG. 11B provide photographs of an exemplary modular print head with the plasma ON.

Figure 12A:
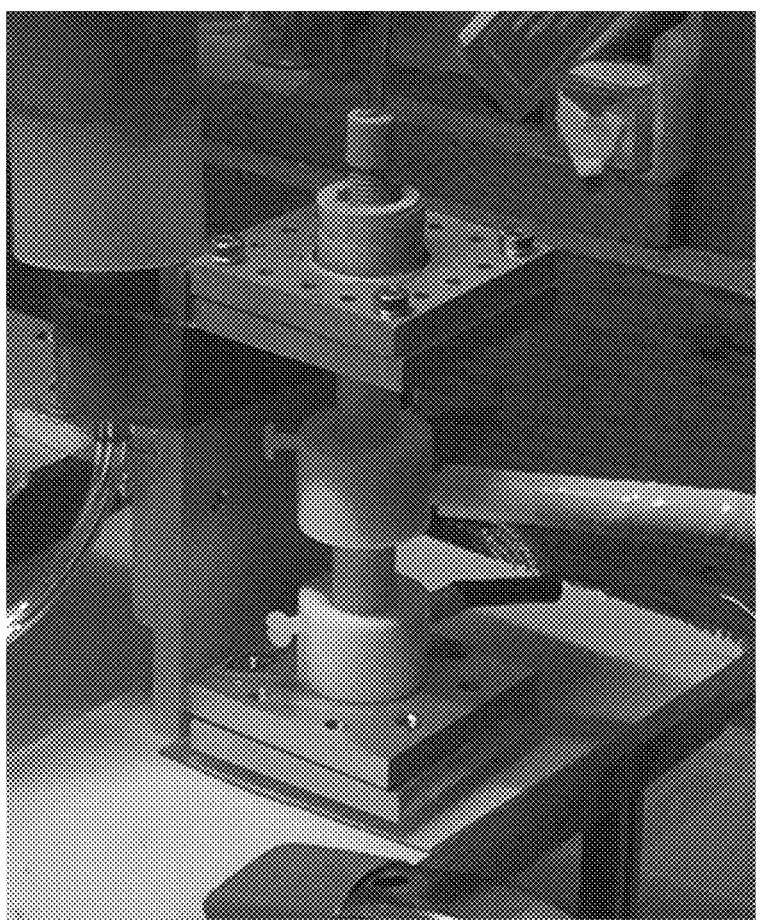
Figure 12B:
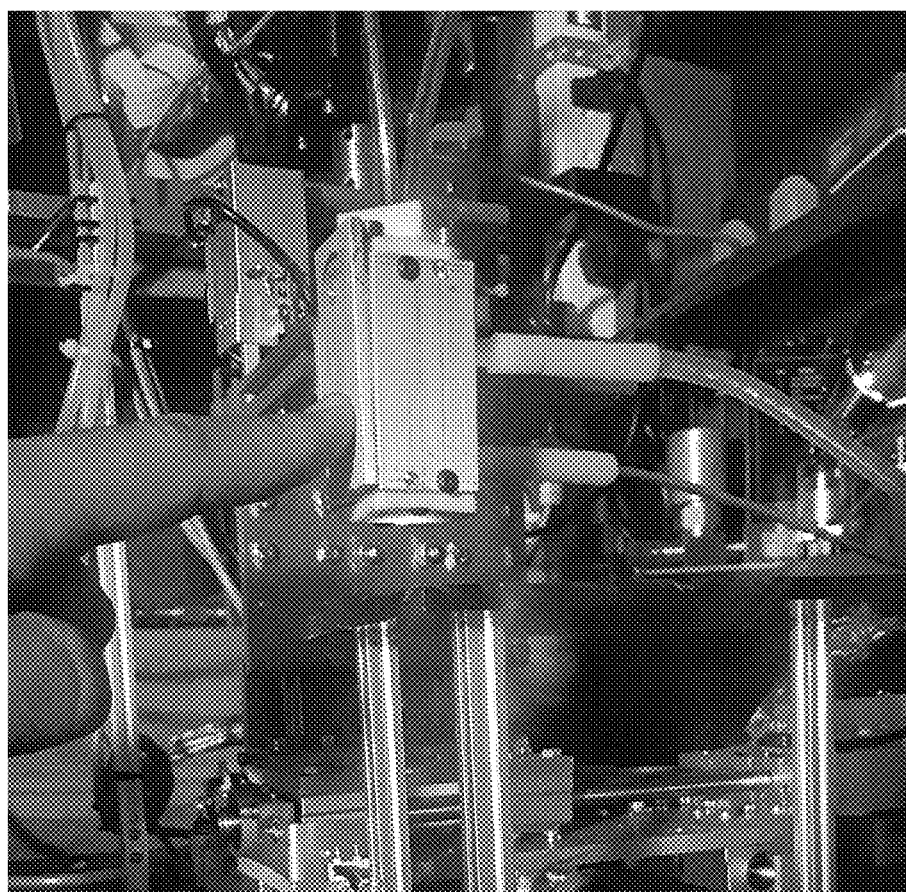

FIG. 12A is a photograph of an exemplary print head without the nozzle manifold with plasma ON. FIG. 12B is a photograph of an exemplary print head with an electrically grounded shield that can be touched safely during the operation of the plasma jet printer.

The primary dielectric tube 210 could be made of any dielectric material not limited to ceramic, inorganic materials, including alumina, quartz, teflon, silica, aluminum oxide, or a combination thereof.

The dielectric enclosure 222 and encapsulation shield 232 used to enclose the electrodes 221 and 231 could be made of any insulating materials, ceramics, inorganic materials or mixtures not limited to teflon, macor, alumina, or a combination thereof. Arcing in plasma is a common phenomenon. Total dielectric strength of encapsulated dielectric is higher than that of the dielectric tube on which electrodes are placed.

The electrodes and electrical feed throughs could be made of any metal, alloy that conducts electricity including but not limited to copper and stainless steel.

Printing of materials using plasma jet require the precursor or actual material to be printed be introduced in to the plasma jet print head comprising dielectric tube, electrodes connected to high voltage power supply, gas supply and a nozzle through which the introduced material is directed towards the substrate on to which the material is to be printed.

The precursor or actual material to be introduced into the plasma jet print head can be in the form of dry particles or aerosolized particles or aerosolized solution that enters the region where active plasma is sustained for sufficient chemical or physical or electronic or molecular or morphological change and are directed to be printed on the substrate. The precursor or actual material may also be introduced into the plasma jet print head in the form of controlled size droplets or controlled volume liquid or paste dispense.

The precursor or actual material to be printed can also be introduced in the glow discharge region of the plasma by avoiding interaction of the material with active plasma region and hence retaining the pristine material characteristics. For this purpose, the material to be printed can be introduced through secondary dielectric tube.

Plasma jet printing of materials with tailored material characteristics and defined geometry on a wide range of 2D, 3D objects and soft, or hard substrates and for manufacturing in a reliable, reproducible and high throughput fashion requires a print head that can sustain a stable plasma with several key features including ability to control the plasma characteristics through which printed material characteristics can be tailored; with the ability to print materials with user defined resolutions, ability to avoid plasma arc between the print head components, electrodes, substrate, substrate holder, printed material etc., ability to sustain temperature gradient in print head for printing materials with varying temperature allowing the operating temperature of the substrate to vary from 20° C. to several hundred degree Celsius.

In one configuration, the ability to print materials with printed geometries between 50 nm and 500 um with control over the repeatability and accuracy of the resultant geometry is provided. In another configuration, the ability to print materials with printed geometries of between 500 um and 10 cm is provided. In another configuration, the ability to print materials with printed geometries of between 10 cm and 50 cm is provided. Similarly, the ability to treat materials and substrates with plasma for all the above defined geometry ranges is provided. Some configuration allows use of multiple print heads simultaneously to print and treat materials on a large area.

The ability to print a variety of materials with controlled but variable morphologies including amorphous, agglomerated particle, porous continuous or non-continuous is provided.

The ability to precisely control the printed material rate of deposition and thickness of deposition during printing by means of manipulating the plasma characteristics and/or the delivery of the material being printed is provided.

Printing materials using plasma jet with defined geometry and tailored material characteristics including physical, chemical, mechanical, electronic, optical, bio-interface, biocompatible properties require optimum plasma characteristics to obtain any one or more combination of above mentioned material properties. For example, nature and type of plasma gas, plasma density, electron temperature, ion temperature, free radical generation, available volume between electrodes, electrode configuration, number of active electrodes etc., can play a significant role in printing materials with any of the required properties including physical, chemical, mechanical, electronic, magnetic, optical, bio-interface, biocompatible properties etc.

A plasma jet printer is disclosed, that can print wide range of materials on wide range of substrates including 2D, 3D, hard, soft, continuous, porous, flexible, rigid, vials, wells etc., can be used in manufacturing in various fields including electronics, textiles, medical, wearable, automobile, aerospace, energy storage/generation, display, food packaging, sensors, implants, test equipment etc.

Printing a wide range of materials with unique material characteristic for any or all field of use application requires appropriate precursor materials, appropriate substrate, appropriate processing environment like humidity, temperature, pre-treatment of substrate, masks, printing, post-treatment, curing etc.

However, plasma jet printing of wide range of materials with tailored material characteristics requires a key component, namely a controlled plasma environment that can change, modify or control the properties of the material that goes through the plasma region or retain those properties depending on the need. Say for example, printing of conducting materials will require prevention of oxidation, reduction of materials in-situ or post printing, partial or full melting of materials, etc., For printing of organic coatings, polymerization is essential. For printing of organic electronics or chemicals or drugs, retaining of chemical structure is essential. For printing of dielectric coatings with varying dielectric strength, the chemical composition needs to be varied. For printing biocompatible coatings, retaining the chemical structure of drugs is essential.

For printing of organics, inorganics, metals, metal oxides, semiconductors, magnetic materials, ceramics, polymers, drugs, chemicals, small organic molecules, big organic molecules, or a combination, the plasma characteristics in the print head and the gas composition, precursor composition will have to be precisely controlled. Though the precursor composition and gas composition can easily be controlled with appropriate use of ink cartridge and gas supply line, controlling the plasma characteristics for printing require optimal configuration of several key components including dielectric strength of the dielectric print head and the tube thickness, electrode configuration, electrode spacing, dielectric encapsulation of electrodes, volume of the portion of dielectric tube that contains the active plasma region, number of live/ground/floating electrodes, nature and type of nozzle, orifice diameter in nozzle, particle feeding rate etc.

Modular design of the print head with multiple feed throughs for precursor and gas inlet, multiple dielectric tubes connected through a manifold and placed inside the main dielectric tube containing electrodes in which the plasma is generated, adjustable electrode spacing, replaceable nozzles with varying orifice diameter for printing, provision to increase or decrease the total number of electrodes in the print head, dielectric encapsulation of electrodes, uneven electrode areas can all play a significant role in deciding the optimum parameters needed for printing specific class of materials, the quality of the printed material as well as the nature of material that can be printed.

For example, a modular design of the print head that is optimized for printing 10 microns thick uniform conducting metallic features with defined line resolution (say 50 microns) from the corresponding metal oxide input, will allow increased dwelling time of metallic particles in the plasma containing reducing gas environment and also higher temperature in specific regions of the dielectric tube. The number of electrodes, electrode spacing, plasma volume, particle/aerosol/precursor feeding, nature and type of nozzle, orifice diameter, applied potential will have to be optimized to obtain a plasma characteristic that will make maximum use of plasma parameters/properties to reduce metal oxide to metal and also to partially or fully melt metallic input to form a continuous metal film with precise 50 microns conducting metallic line feature.

However, a modular design of the print head for printing a 10 nanometer thick organic polyethylene glycol coating with a line width of 5 millimeters on a biosensor or medical device will have the electrode design in such a way that the plasma characteristics are not too intense to damage the chemical structure of the precursor or the substrate and at the same time enabling plasma polymerization to take place. The number of electrodes, electrode spacing, plasma volume, particle/aerosol/precursor feeding, nature and type of nozzle, orifice diameter, applied potential will be optimized for this application and the parameters will be different than that of printing metal from metal oxides with fine feature.

The idea behind the modular design of the plasma jet print head is to allow optimization of the print head design, configuration and process parameters for specific application.

Also the modular design of the plasma jet print head enables integration of the print head to other printing techniques like aerosol jet printing, spray pyrolysis, ink jet printing, laser printing, drop casting etc.

Use of high voltage power supply is essential for generating plasma discharge. The high voltage is applied between the electrodes in the dielectric tube of plasma jet print head. The nature and type of power input can vary from DC, pulsed DC, AC to RF. The power supply can either be battery powered or connected to a high voltage source. Use of multiple electrodes in the same print head will allow application of varying input energy to selected electrodes resulting in gradient plasma in the dielectric tube.

A modular design with two electrodes in the print head could result in uniform plasma. However, in a modular design with an elongated dielectric tube with four electrodes in the print head, two electrodes could be connected to a power supply with higher input energy and two other electrodes could be connected to the same or different power supply with lower input energy than the other electrodes. In this case, the plasma characteristics in higher input region is likely to be have a higher ion energy, electron/ion temperature, plasma density etc., than that of the lower energy input region. This design can be used to introduce temperature gradient in the print head and for increased dwelling time of the materials in the plasma. Both the electrode sets could also be connected to similar potential resulting in uniform plasma across the entire print head.

Use of high voltage power supply and generation of plasma can also result in arcing between the metallic components of the print head or the printer assembly. The arcing can happen between the electrodes of the print head, the plasma and the substrate or substrate holder, or the metallic coating being printed. The modular design of the plasma jet print head assembly provides a solution to avoid arcing during the printing and post-printing.

The modular design of the plasma jet print head comprise a manifold connected to the primary dielectric tube on which electrodes connected to high voltage power supply are dispersed. The manifold will have provision for gas input and precursor/material inlet and a provision to connect dielectric tubes from the gas input and/or precursor/material input inside the primary dielectric tube whose length can be controlled depending on the application. The inner dielectric tubes placed inside the primary dielectric tube can carry the precursor or gas or both. The modular design also allows the provision to have a manifold with inlets for gas and precursor without multiple dielectric tubes and containing only the primary dielectric tube inside which both the gas and precursor/material are introduced.

The length and diameter of the primary dielectric tube in the modular design can be varied depending on the nature and type of material to be printed and the application. The thickness, dielectric strength and diameter of the dielectric tube can vary the plasma characteristics and the temperature inside the tube allowing for tailoring the material properties of the printed features/structures. The modular design allows joining of two or more dielectric tubes that are similar or of varying diameters along the longitudinal axis.

In some embodiments, the diameter of the dielectric tube is about 0.02 cm to about 2 cm. In some embodiments, the diameter of the dielectric tube is at least about 0.02 cm. In some embodiments, the diameter of the dielectric tube is at most about 2 cm. In some embodiments, the diameter of the dielectric tube is about 0.02 cm to about 0.05 cm, about 0.02 cm to about 0.1 cm, about 0.02 cm to about 0.5 cm, about 0.02 cm to about 1 cm, about 0.02 cm to about 1.5 cm, about 0.02 cm to about 2 cm, about 0.05 cm to about 0.1 cm, about 0.05 cm to about 0.5 cm, about 0.05 cm to about 1 cm, about 0.05 cm to about 1.5 cm, about 0.05 cm to about 2 cm, about 0.1 cm to about 0.5 cm, about 0.1 cm to about 1 cm, about 0.1 cm to about 1.5 cm, about 0.1 cm to about 2 cm, about 0.5 cm to about 1 cm, about 0.5 cm to about 1.5 cm, about 0.5 cm to about 2 cm, about 1 cm to about 1.5 cm, about 1 cm to about 2 cm, or about 1.5 cm to about 2 cm. In some embodiments, the diameter of the dielectric tube is about 0.02 cm, about 0.05 cm, about 0.1 cm, about 0.5 cm, about 1 cm, about 1.5 cm, or about 2 cm.

The electrodes that will be connected to a voltage source are dispersed along the primary dielectric tube. The number of electrodes can be two or more and the surface area of one of the electrodes is more than double that of the second electrode. The electrodes can either be placed along the outer circumference of the dielectric tube, or one of the electrodes can be placed inside the dielectric tube and the other along the outer circumference, or the electrodes can be embedded inside the dielectric tube such that the portion of electrodes are exposed to the inner portion of the dielectric tube.

One or all of the electrodes can either be similar in shape or more than one can be of any shape like that of a planar tape or wire like winding along the circumference or pointed edge or sharp blade like when embedded inside the dielectric or one of the electrodes can be rod shaped and placed inside the dielectric. However, in all these cases except for electrodes that are embedded inside the dielectric, the electrode separation distance can be changed depending on the required configuration/application/quality of printing and the electrodes dispersed along the circumference of the dielectric are movable along the longitudinal axis.

In some embodiments, the distance between the first electrode and the second electrode is about 5 mm to about 40 mm. In some embodiments, the distance between the first electrode and the second electrode is at least about 5 mm. In some embodiments, the distance between the first electrode and the second electrode is at most about 40 mm. In some embodiments, the distance between the first electrode and the second electrode is about 5 mm to about 10 mm, about 5 mm to about 15 mm, about 5 mm to about 20 mm, about 5 mm to about 25 mm, about 5 mm to about 30 mm, about 5 mm to about 35 mm, about 5 mm to about 40 mm, about 10 mm to about 15 mm, about 10 mm to about 20 mm, about 10 mm to about 25 mm, about 10 mm to about 30 mm, about 10 mm to about 35 mm, about 10 mm to about 40 mm, about 15 mm to about 20 mm, about 15 mm to about 25 mm, about 15 mm to about 30 mm, about 15 mm to about 35 mm, about 15 mm to about 40 mm, about 20 mm to about 25 mm, about 20 mm to about 30 mm, about 20 mm to about 35 mm, about 20 mm to about 40 mm, about 25 mm to about 30 mm, about 25 mm to about 35 mm, about 25 mm to about 40 mm, about 30 mm to about 35 mm, about 30 mm to about 40 mm, or about 35 mm to about 40 mm. In some embodiments, the distance between the first electrode and the second electrode is about 5 mm, about 10 mm, about 15 mm, about 20 mm, about 25 mm, about 30 mm, about 35 mm, or about 40 mm.

In some embodiments, the distance between the electrodes is about 1 mm to about 180 mm. In some embodiments, the distance between the electrodes is at least about 1 mm. In some embodiments, the distance between the electrodes is at most about 180 mm. In some embodiments, the distance between the electrodes is about 1 mm to about 10 mm, about 1 mm to about 25 mm, about 1 mm to about 50 mm, about 1 mm to about 75 mm, about 1 mm to about 100 mm, about 1 mm to about 125 mm, about 1 mm to about 150 mm, about 1 mm to about 180 mm, about 10 mm to about 25 mm, about 10 mm to about 50 mm, about 10 mm to about 75 mm, about 10 mm to about 100 mm, about 10 mm to about 125 mm, about 10 mm to about 150 mm, about 10 mm to about 180 mm, about 25 mm to about 50 mm, about 25 mm to about 75 mm, about 25 mm to about 100 mm, about 25 mm to about 125 mm, about 25 mm to about 150 mm, about 25 mm to about 180 mm, about 50 mm to about 75 mm, about 50 mm to about 100 mm, about 50 mm to about 125 mm, about 50 mm to about 150 mm, about 50 mm to about 180 mm, about 75 mm to about 100 mm, about 75 mm to about 125 mm, about 75 mm to about 150 mm, about 75 mm to about 180 mm, about 100 mm to about 125 mm, about 100 mm to about 150 mm, about 100 mm to about 180 mm, about 125 mm to about 150 mm, about 125 mm to about 180 mm, or about 150 mm to about 180 mm. In some embodiments, the distance between the electrodes is about 1 mm, about 10 mm, about 25 mm, about 50 mm, about 75 mm, about 100 mm, about 125 mm, about 150 mm, or about 180 mm.

The electrodes are part of the modular design of the print head in which the number, size and spacing of the electrodes can be easily changed providing an opportunity to control plasma characteristics through application specific, precise configuration of electrodes for reliable and reproducible printing of materials with tailored characteristics. Generating plasma using multiple electrodes dispersed along the dielectric and applying similar or varying potentials to various sets of electrodes can create a gradient in plasma characteristics. In some cases, a temperature gradient is created which will drastically change the material properties such as increasing dwelling of materials in the plasma zone and resulting in change of electronic or mechanical or optical or chemical properties of the resultant printed feature.

The provision to change spacing between the electrodes provides the opportunity to change plasma characteristics and hence the quality of materials printed. For example, two electrodes dispersed along the outer circumference of the dielectric tube with 1 centimeter spacing between them will have a certain plasma characteristics for a given externally applied electric potential. However, for the same potential, if the electrode spacing is increased to 2 centimeters the plasma characteristics will be different and higher potential will be required to ignite and sustain the plasma. The quality of films printed under the two configurations could vary significantly for a given set of fixed plasma process parameters like flow rate, applied voltage, printing time, or a combination thereof.

Changing the spatial distribution of electrodes to print materials allows changing parameters like thermal energy in the plasma, electron and ion density in the plasma, bombardment between various species in the plasma and the material to be printed, and also momentum transferred on to the materials and substrate during printing. A plasma jet print head with safe option to change the electrode spacing in a single step process without having to remove the electrode from the print head offers a unique capability to tune the properties of the materials printed using the plasma jet print head.

The print head described herein can connect multiple electrodes in a confined zone and without any electrical arc between any of the internal components of the print head or with the substrate or with the substrate holder or with the material being printed. An apparatus for printing materials using plasma jet in a defined geometry with a modular print head design comprising detachable dielectric tubes, metal electrodes and dielectric encapsulations that avoids arcing between electrodes, substrate, substrate holder, coated material for printing materials with tailored material properties is disclosed.

The modular design of the plasma jet print head allows for attaching dielectric tubes along the longitudinal axis that can be used for focusing the materials towards substrate for printing. The ability to increase, decrease, narrow or widen the length, diameter and volume of the dielectric tube provides an opportunity to change the plasma volume and in turn tune the interaction of the material to be printed with the plasma.

The modular design of the plasma jet print head allows for attaching or removing a replaceable nozzle with defined orifice diameter that can be used for printing required feature size and resolution. The orifice diameter can either remain the same as the dielectric tube or it can be narrowed to suit the required resolution varying from 5 centimeters to 5 microns to further down to submicron level to 50 nm with the use of silicon micro-machined nozzle. In another configuration, large area coating could be achieved by having multiple dielectric tubes or print heads for simultaneous printing or use of larger diameter orifice greater than 5 cm.

The narrow orifice and design of the nozzle along with the externally applied electric field and presence of plasma helps driving the material entering the dielectric tube to get focused and accelerated towards the substrate enabling high resolution and high throughput printing.

The modular design of the print head also allows the introduction of an inert or higher dielectric strength gas (than the ones used for generating plasma) at the nozzle as a sheath gas for focussing the material towards the substrate.

The nozzle that can be easily replaced and also attached to the primary dielectric tube can comprise a plain dielectric material with an orifice or be designed with a continuously narrowing inner dimension to allow for fine resolution printing or contain a metal inside or at the edge that can either be at floating potential or connected to ground. The presence of metal at the nozzle can play a significant role in reducing arcing between the plasma in the print head and substrate or substrate holder or the material being printed.

Arcs in plasma and high voltage are a common phenomenon. However, for printing application arcing should be avoided as it can damage the substrate or the components of the print head. The modular design of the print head allows a stable arc-less plasma to sustain and prevent arcing between the electrodes or arcing between the plasma and substrate or substrate holder or material being printed.

Applying high voltage to electrodes placed along the circumference of the dielectric tube can cause arcing either external to the dielectric, here after called as external arcing, or internal to the dielectric tube, here after called as internal arcing, or both. For printing applications, both internal and external arcing between the electrodes should be prevented.

The modular design of the print head incorporates multiple features that prevent arcing between the electrodes or arcing between the plasma and the electrodes in the print head. One of the ways to prevent arcing is to use uneven surface area of electrodes. Another way is to use thicker dielectric encapsulation of electrodes so that the electrodes are not exposed to ambient environment.

With the electrodes dispersed along the circumference of the dielectric tube, one of the electrodes has a surface area more than double that of the other electrode, such that the electric field is spread over a larger area, minimizing arcing.

A key feature to prevent arcing between electrodes that are dispersed along the outer circumference of the dielectric tube is to encapsulate the electrodes with dielectric material whose thickness is more than thrice that of the thickness of the primary dielectric tube on which the electrodes are dispersed. The total dielectric strength of the encapsulated dielectric is higher than that of the primary dielectric tube on which the electrodes are dispersed.

The carrier gas that carries the aerosolized material to be printed and the gas that is used to generate plasma discharge can either be same or different depending on the nature of the material and the required resultant printed material properties. In the case where the effect of plasma species on the materials is to be minimized and restricted to a minimal region containing plasma, a non-interactive higher dielectric strength carrier gas can be used to transfer the material and a gas with lower dielectric strength like that of argon or helium be used to generate plasma discharge. The higher dielectric strength carrier gas can also be used as a focusing gas at the nozzle and the modular design allows feeding the required gas mixtures either at the input manifold of the print head or closer to the electrode in the dielectric tube or at the nozzle.

The modular design of the print head that allows connecting multiple electrodes (more than 2) in the dielectric tube, provision to control the plasma volume and the interaction time of plasma species with the materials and provision to introduce required gas mixture in any portion of the dielectric tube like that of inlet manifold, before or in between or after the electrodes allows intricate control of the plasma characteristics and in turn allows tailoring of the material properties resulting in printing of custom made material.

Multiple electrodes powered with varying input energies for generating plasma with either the same gas mixture or different gas mixtures allow dual plasma zones in the primary dielectric tube as shown in FIG. 5. The region inside the dielectric tube has different plasma characteristics in each plasma zone. For example plasma zone 1 with higher input electric energy across the electrodes 221*a* and 221*b* can have higher temperature and plasma zone 2 with lower input electric energy across the electrodes 231*a* and 231*b* can have lower temperature. Plasma zone 1 inside the primary dielectric tube between the electrodes 221*a* and 221*b* can have reducing environment and plasma zone 2 between the electrodes 231*a* and 231*b* can have inert environment. This allows intricate control of both temperature driven and chemically driven modification of the printed material. Plasma zone 2 can act as a focusing or a cooling unit while still maintaining an active plasma region enabling printing on low glass transition materials.

Plasma zone 1 provide optimal conditions for chemical, electronic, magnetic, structural or morphological modification of the material, plasma zone 2 can remain optimized for best printing properties depending on the substrate, temperature, adhesion, pre-treatment, post-treatment etc., requirement.

The print head can generate atmospheric pressure plasma that directs and prints materials onto the substrate where the substrate temperature during the printing process can vary from as low as 20° C. to as high as 300° C. as determined by the electrode configuration, electrode spacing, applied power, dielectric tube, nature of gas, to name a few. In some cases, the substrate temperature is about 20° C. to about 300° C. In some cases, the substrate temperature is at least about 20° C. In some cases, the substrate temperature is at most about 300° C. In some cases, the substrate temperature is about 20° C. to about 50° C., about 20° C. to about 75° C., about 20° C. to about 100° C., about 20° C. to about 125° C., about 20° C. to about 150° C., about 20° C. to about 175° C., about 20° C. to about 200° C., about 20° C. to about 225° C., about 20° C. to about 250° C., about 20° C. to about 275° C., about 20° C. to about 300° C., about 50° C. to about 75° C., about 50° C. to about 100° C., about 50° C. to about 125° C., about 50° C. to about 150° C., about 50° C. to about 175° C., about 50° C. to about 200° C., about 50° C. to about 225° C., about 50° C. to about 250° C., about 50° C. to about 275° C., about 50° C. to about 300° C., about 75° C. to about 100° C., about 75° C. to about 125° C., about 75° C. to about 150° C., about 75° C. to about 175° C., about 75° C. to about 200° C., about 75° C. to about 225° C., about 75° C. to about 250° C., about 75° C. to about 275° C., about 75° C. to about 300° C., about 100° C. to about 125° C., about 100° C. to about 150° C., about 100° C. to about 175° C., about 100° C. to about 200° C., about 100° C. to about 225° C., about 100° C. to about 250° C., about 100° C. to about 275° C., about 100° C. to about 300° C., about 125° C. to about 150° C., about 125° C. to about 175° C., about 125° C. to about 200° C., about 125° C. to about 225° C., about 125° C. to about 250° C., about 125° C. to about 275° C., about 125° C. to about 300° C., about 150° C. to about 175° C., about 150° C. to about 200° C., about 150° C. to about 225° C., about 150° C. to about 250° C., about 150° C. to about 275° C., about 150° C. to about 300° C., about 175° C. to about 200° C., about 175° C. to about 225° C., about 175° C. to about 250° C., about 175° C. to about 275° C., about 175° C. to about 300° C., about 200° C. to about 225° C., about 200° C. to about 250° C., about 200° C. to about 275° C., about 200° C. to about 300° C., about 225° C. to about 250° C., about 225° C. to about 275° C., about 225° C. to about 300° C., about 250° C. to about 275° C., about 250° C. to about 300° C., or about 275° C. to about 300° C. In some cases, the substrate temperature is about 20° C., about 50° C., about 75° C., about 100° C., about 125° C., about 150° C., about 175° C., about 200° C., about 225° C., about 250° C., about 275° C., or about 300° C.

The modular design of the print head has the provision to introduce precursor, gas or other material to the print head in more than one way to get tailor-made material properties and or materials with pristine properties as in the original precursor. This can be achieved by having plurality of inputs and/or dual dielectric tubes.

The print head input manifold may have one input for the precursor and gas, or one input for both precursor and gas, to enter into the primary dielectric tube. The manifold may also have plurality of inputs for more than one precursor, or gases, to enter the primary dielectric tube, either one at a time or simultaneously.

The modular design of the print head allows for one or more inputs for the precursors, or gases, to enter into the primary dielectric tube and there may be a secondary dielectric tube within the primary dielectric tube. In this configuration, the precursors may enter into either the primary or secondary dielectric tube, or both, one at a time or simultaneously. The electrodes in this configuration are present in outer dielectric tube and the length of the inner dielectric tube can vary. The length of the inner secondary dielectric tube can either be same as the outer primary dielectric tube or shorter. The length of the inner secondary dielectric tube can be varied in such a way that the dielectric tube can end well before the electrode placed at the outer primary dielectric or stretch all the way unto the nozzle or take any intermediary length independent of the length of the primary dielectric tube.

Depending on the gas constituent and or precursor/material input from the primary dielectric and the length of the secondary dielectric placed inside the primary, the precursor/material or gas introduced through the secondary dielectric can either face the active plasma region created by the electrodes dispersed over the primary dielectric tube or face only the glow discharge region of the place at the nozzle or at the exit of the nozzle. This allows the materials introduced through the secondary dielectric tube to either undergo plasma induced property changes or maintain its pristine characteristics without undergoing plasma induced structural, chemical or material property changes.

The modular design of the print head allows for multiple dielectric tubes to be present with provision for including one or more secondary dielectric tubes within the primary dielectric tube. The inputs to the primary and the secondary dielectric tubes can again be independently controlled and also the length of all or any of the secondary dielectric tube can either be same as primary dielectric tube or shorter than the primary dielectric tube.

The modular assembly of the print head allows for further improving the resolution by placing a patterned focusing apparatus with a defined orifice whose opening is smaller than the orifice of the nozzle. The modular design allows for the utilization of a patterned or controlled geometry sacrificial mask to print though, providing an additional means for transferring a precise pattern to the substrate or further refining the geometry of the print by restricting the area of the substrate exposed to the print medium. This may be as simple as an additional orifice that is smaller than the nozzle exit orifice that acts as a way of reducing the print jet. This additional orifice allows for the nozzle orifice to be larger than normal not the geometry defining orifice and so less susceptible to a buildup of printer material interfering with the resolution of the resultant print. The printer further provides an automated means of changing such sacrificial masks or orifices.

The modular design of the print head not only allows replacement of nozzle but also allows replacement of nozzle tip which is placed at the end of the nozzle for fine resolution or patterned printing. Using a patterned nozzle tip at the end of the nozzle allows fine resolution printing with a fixed nozzle whose orifice diameter is bigger than that required for printing and bigger than the orifice of this patterned tip which is replaceable. The modular design also allows for the ability to extend the lifetime of the nozzle before it needs cleaning or replacement due to buildup of deposited material on the inner diameter of the nozzle orifice which would change the geometry of the print. Further, such a replaceable nozzle tip allows for variable geometry print control with a single nozzle.

The modular design of the print head allows for configuration of multiple nozzles in one printer for multi-material printing. The ability to configure with multiple nozzles in one printer system or to configure with nozzles in a cluster arrangement allows for multiple materials to be printed on a substrate within the same system either one after another or simultaneously or, in a cluster configuration, for multiple materials to be printed on a substrate in separate chambers one after another where each chamber performs a different step of the overall process thus facilitating parallel steps within the same printer.

The precursor input to print head may occur through a nebulizer that creates an aerosol of materials to be printed.

The nebulizer can be independently controlled by having features to control droplet size of aerosolized material: allowing for atomized droplet size to be varied as another means of optimizing the characteristics of the printed materials Printing of electronic circuits, conductive traces, passive electronic components is normally carried out on planar substrates. The need for printing conductive traces and circuits on polymers, non-planar surfaces, 3D objects and on steps, vials, wells etc., is ever increasing, especially in interconnect technologies, fan out wafer level packaging, laboratory devices, testing using well plates etc. Traditionally used deposition technologies like magnetron sputtering, electro chemical coating, thermal evaporation etc., are no longer appealing for these applications. Direct write printing techniques like screen printing, ink jet printing and aerosol jet printing are being widely researched as an alternative route for printing. Printing on vials, steps, wells etc., whose aspect ratio is high and the depth varies from few tens of micrometers to few millimeters is challenging. There is a need to get highly directional printing that can print in such long working distance. The modular design of the plasma jet printing offers the ability to control the fluid flow and the jet using plasma process parameters and the applied voltage and hence has the potential to print in vials, steps, wells, 3D objects etc.

Printing of electronic materials including conducting and insulating layers on vials, steps, wells and non-planar surfaces requires techniques that enable printing over a long working range. The working distance between the print head nozzle and the substrate on which printing to be carried out is normally very small, in the range of few millimeter in state of the art printers like inkjet and aerosol jet printing. For applications that involve printing on vials, steps, wells that are three dimensional, the need is efficient and directed delivery of particles on to these surfaces. The plasma jet controlled by externally applied electromagnetic field can be efficiently used to print materials on vials, wells, steps and non-planar surfaces. The print head nozzle containing decreasing throat diameters can be used successfully to print fine traces and patterns on such three dimensional surfaces.

There is a growing need for advanced metallization techniques for 3D interconnects in through silicon via (TSV) and 3D integration in integrated circuit (IC) packaging. There is also a demand for printing conductive patterns including printed circuit boards, interconnects, antenna, bumps in a range of substrates with varying glass transition temperature and outgassing properties.

Flexible electronics, displays and wearable monitoring technologies require printing of conducting materials including conducting organics and/or metal coatings and interconnects on flexible and non-traditional substrates like plastics, cellulose, polymers, textiles where the conventional techniques for metallization are difficult to apply. The modular design of the plasma jet print head allows for printing of these conducting and insulating materials and electronic devices on these wide range of substrates.

The modular design of the print head allows for printing of electrodes for devices including batteries, fuel cells, photovoltaic devices, photocatalytic converters etc., The electrodes can be planar and/or porous, with appropriate morphology for efficient energy conversion, energy generation, storage etc.

The modular design of the plasma jet print head allows for printing batteries, flexible batteries, battery electrodes, porous electrodes, flexible electrodes, and also enable battery fabrication using binder-free methods. Plasma jet printing using a modular design allows complete removal of inactive binder in the electrodes or for the inactive binder components in electrodes to be kept to a lower level compared to other printing techniques.

Porous metallic nanostructure films printed using the modular print head design can be used as electrodes for batteries accounting for expansion and contraction with temperature and duty cycle. The porous metallic or metal-oxide structure with nano roughness that is critical for catalyst and $CO_2$ conversion can also be printed using the modular design of the print head. Also metal composites such as $TiO_2$ nanostructure film containing copper (Cu—$TiO_2$ co catalyst) can also be printed using the modular design for $CO_2$ conversion.

Nanostructures of various metal, metal oxide, transition metals and composites can be printed with required oxidation state, composition and morphology using the modular design of the print head. The plasma process parameters and the modular design can be optimized to print co-catalyst composites to get high $CO_2$ conversion efficiency and high catalyst reliability. For example Cu—$TiO_2$ co-catalyst, iron-copper oxide (Fe—CuO) co-catalyst, Cu-based nanoparticles (copper oxides, and hybrid copper nanostructures) and copper nanoparticles immobilized into or supported on various support materials.

The modular design of the plasma jet print head can be used to fabricate and embed catalysts for effective conversion of $CO_2$ to oxygen and hydrocarbons in a range of applications including emission gas reduction in automobile industry, power plants, space station etc., The plasma properties and process parameters like the applied voltage, gas ratio, precursor flow ratio, electrode design can be used to fabricate the co-catalyst and print with appropriate composition and morphology to get maximum possible conversion efficiency by enabling artificial photosynthesis. The printing can be done on a range of substrates including waveguides, planar, non-planar surfaces.

The modular design of the print head can be used for a range of applications including printing and coating of polymers, organics, inorganics, graphene, graphene oxide, reduced graphene oxide, metals, alloys, composites, semiconductors, magnetics, insulators etc., This provides a method to print polymers in a dry form on a range of substrates for applications including wearables, wearable monitors, textiles, cloths, shoes, medical devices, implants, diagnostic devices, etc., and avoid thermal curing, annealing or post treatment process to increase polymerization or to remove materials (impurities, solvents).

The modular design of the plasma jet print head can be used to make metal-polymer composites, alloys, polymeric coatings, layered coatings, porous coatings, hybrid inorganic/organic materials, metal-organic hybrid etc., for a wide variety of applications. The plasma process parameters and the modular design of the print head allows printing a variety of material compositions, structures and morphologies in a dry form as thin, thick, or porous films, with or without patterning in a dry form.

The plasma jet print head can be used to print plasmonic nanostructures, plasmonic film, plastic-metal layered plasmonic features to fabricate nanostructured plasmonic devices for a range of applications including biosensing, photonics communication, optical devices etc., The plasma process parameters, print head design and printing time can be used to control the density of packing of plasmonic nanostructures like gold, silver etc., and also the layer thickness.

The plasma jet printing can be used to print organics including cellulose, polymers etc., and also composites to create organic films of different densities, cross-linked strengths and rigidities.

The modular assembly of the plasma jet print head allows printing of carbonaceous materials including carbon nanotubes, graphene oxide etc., and also allows both in-situ and post printing reduction and oxidation of these nanomaterials.

The modular assembly of the plasma jet print head allows the treatment of materials on a surface by using appropriate gas mixtures and temperature gradient in active plasma regions if necessary where by the morphology, surface chemistry, and/or surface energy of the materials on the surface can by changed. For example, by treatment of a planar copper surface with argon or helium or hydrogen or a gas mixture plasma, copper nanomaterial features can be formed on the surface. A planar copper surface may be turned into copper nanowires by morphological and topographical changes. Copper oxide reducing to copper by change of oxidation state of copper by reduction may be achieved.

The modular assembly of the plasma jet print head can also allow for the treatment of organics and microbes on the surface whereby inactivating the microbes, sterilizing the surface and if needed removing the microbes and the organics from the surface by plasma ashing using oxygen gas mixture in the plasma. The presence of multiple inlets, dual plasma zone, plasma gradient and temperature gradient properties can efficiently be used to bombard the cell structure of the microbes, change its morphology and also surface chemistry whereby inactivating the microbe. Further intense plasma treatment can be used to remove and vaporize the intra cellular components of the cell like that of amino acids, proteins etc., and the cell structure whereby causing complete organic decontamination from the surface.

The adjustable electrodes can be placed close to the nozzle such that the active plasma region is close to the surface being treated and the energetic bombardment of the plasma generated species causing physical distortion of the cell structure and the presence of any oxygen species or any other reactive gas species changing the surface chemistry of the cell structure and cellular components providing dual impact of physical distortion and chemical structure change on the microbes resulting in inactivation. Prolonged treatment of the surface or treatment with appropriate gas mixture like that of oxygen and argon for example could completely remove the cellular debris paving way for dual benefit of inactivating microbes and removing the cell debris and organic components of the cells from the surface being treated.

Some features and advantages of the invention have been generally described in this summary section; however, additional features, advantages, and embodiments are presented herein or will be apparent to one of ordinary skill in the art in view of the drawings, specification, and claims hereof. Accordingly, it should be understood that the scope of the invention is not limited by the particular embodiments disclosed in this summary section.

A printing apparatus containing a modular assembly of a plasma jet print head with multiple removable, adjustable and replaceable modules for directing and printing materials in a defined geometry with desired material properties by sustaining a stable arc less plasma inside a dielectric tube.

The apparatus comprises: a dielectric tube containing two or more electrodes on its outer side that are connected to a high voltage power supply, to generate a plasma inside the dielectric tube in the presence of a gas, that avoids arcing both inside the dielectric tube as well as outside the dielectric tube between the electrodes and avoids arcing between the print head and coated material/substrate/substrate holder, and that accelerates, directs the aerosolized materials from a nebulizer in a geometrical fashion, with minimal loss of materials to the wall of the dielectric tube resulting in high density of materials directed through the nozzle; detachable dielectric tubes connected together whose one end is connected to a manifold through which the carrier gas and material to be printed are introduced in aerosol form, the other end has continuously reducing inner diameter to form a nozzle that is detachable and replaceable with an orifice through which materials from the tube will exit in a defined geometry, central portion of the tube containing electrodes; the detachable tubes are made of dielectric material, the nozzle can be made of same dielectric or different dielectric or metallic material or a combination of dielectric and metal to avoid arcing between the plasma and the coating or substrate or substrate holder and by enabling precise delivery of the material out of the print head for controlled geometrical printing;

The orifice diameter in the detachable nozzle can be varied to control the geometry of printing and resolution while the diameter of the dielectric tube can either be fixed or varied and the material to be printed is accelerated out of the nozzle with a momentum created by the externally applied electric field, plasma and gas pressure, to enable focused expulsion of the material from the dielectric tube through the nozzle towards a substrate for printing;

The inner portion of the detachable nozzle can contain metal layer either connected to ground or in floating potential to avoid arcing between the print head and the substrate or substrate holder; multiple movable metal electrodes to change the spacing between the electrodes, dispersed at the inlet, outlet or along the outer circumference of the dielectric tube and connected to high voltage power source to generate plasma, an active plasma region, with desired plasma characteristics through controlled electrode area, spacing of electrodes and its configuration depending on required resultant material characteristics; each electrode having a dielectric encapsulation with the thickness of the encapsulation dielectric being more than thrice the thickness of the dielectric tube used to generate plasma.

Each electrode of the print head/apparatus described herein may have a dielectric encapsulation. In some embodiments, the dielectric encapsulation may have a thickness that is less than, equal to, or greater than the thickness of the dielectric tube that the electrode is attached to. In some embodiments, the dielectric encapsulation has a thickness that is greater than the thickness of the dielectric tube. In some cases, the dielectric encapsulation has a thickness that is at least twice the thickness of the dielectric tube. In some cases, the dielectric encapsulation has a thickness that is at least three times greater than the thickness of the dielectric tube. In some cases, the dielectric encapsulation has a thickness that is at least four times greater than the thickness of the dielectric tube. In some cases, the dielectric encapsulation has a thickness that is at least five times greater than the thickness of the dielectric tube. When a dielectric encapsulation has a greater thickness than the thickness of the dielectric tube, arcing between the electrodes is reduced. In some cases, arcing between the electrodes is eliminated. In some cases, arcing between the electrodes within the dielectric tube is reduced or prevented.

In some cases, arcing can be reduced or prevented by using a dielectric material in the dielectric encapsulation that is different from the dielectric material in the dielectric tube.

In some embodiments, the dielectric material of the dielectric encapsulation has a higher dielectric strength than the dielectric material of the dielectric tube. As the dielectric strength varies with the thickness of the dielectric material, the thickness, geometry, or both, of the dielectric encapsulation and/or dielectric tube can be adjust to maximize the corresponding dielectric strength accordingly.

In some embodiments, the dielectric strength of the dielectric tube is about 5 kV/mm to about 20 kV/mm. In some embodiments, the dielectric strength of the dielectric tube is at least about 5 kV/mm. In some embodiments, the dielectric strength of the dielectric tube is at most about 20 kV/mm. In some embodiments, the dielectric strength of the dielectric tube is about 5 kV/mm to about 7.5 kV/mm, about 5 kV/mm to about 10 kV/mm, about 5 kV/mm to about 12.5 kV/mm, about 5 kV/mm to about 15 kV/mm, about 5 kV/mm to about 17.5 kV/mm, about 5 kV/mm to about 20 kV/mm, about 7.5 kV/mm to about 10 kV/mm, about 7.5 kV/mm to about 12.5 kV/mm, about 7.5 kV/mm to about 15 kV/mm, about 7.5 kV/mm to about 17.5 kV/mm, about 7.5 kV/mm to about 20 kV/mm, about 10 kV/mm to about 12.5 kV/mm, about 10 kV/mm to about 15 kV/mm, about 10 kV/mm to about 17.5 kV/mm, about 10 kV/mm to about 20 kV/mm, about 12.5 kV/mm to about 15 kV/mm, about 12.5 kV/mm to about 17.5 kV/mm, about 12.5 kV/mm to about 20 kV/mm, about 15 kV/mm to about 17.5 kV/mm, about 15 kV/mm to about 20 kV/mm, or about 17.5 kV/mm to about 20 kV/mm. In some embodiments, the dielectric strength of the dielectric tube is about 5 kV/mm, about 7.5 kV/mm, about 10 kV/mm, about 12.5 kV/mm, about 15 kV/mm, about 17.5 kV/mm, or about 20 kV/mm. In some cases, the dielectric tube comprises alumina and has a dielectric strength of about 13.4 kV/mm.

In some embodiments, the dielectric strength of the dielectric encapsulation is about 15 kV/mm to about 30 kV/mm. In some embodiments, the dielectric strength of the dielectric encapsulation is at least about 15 kV/mm. In some embodiments, the dielectric strength of the dielectric encapsulation is at most about 30 kV/mm. In some embodiments, the dielectric strength of the dielectric encapsulation is about 15 kV/mm to about 17.5 kV/mm, about 15 kV/mm to about 20 kV/mm, about 15 kV/mm to about 22.5 kV/mm, about 15 kV/mm to about 25 kV/mm, about 15 kV/mm to about 27.5 kV/mm, about 15 kV/mm to about 30 kV/mm, about 17.5 kV/mm to about 20 kV/mm, about 17.5 kV/mm to about 22.5 kV/mm, about 17.5 kV/mm to about 25 kV/mm, about 17.5 kV/mm to about 27.5 kV/mm, about 17.5 kV/mm to about 30 kV/mm, about 20 kV/mm to about 22.5 kV/mm, about 20 kV/mm to about 25 kV/mm, about 20 kV/mm to about 27.5 kV/mm, about 20 kV/mm to about 30 kV/mm, about 22.5 kV/mm to about 25 kV/mm, about 22.5 kV/mm to about 27.5 kV/mm, about 22.5 kV/mm to about 30 kV/mm, about 25 kV/mm to about 27.5 kV/mm, about 25 kV/mm to about 30 kV/mm, or about 27.5 kV/mm to about 30 kV/mm. In some embodiments, the dielectric strength of the dielectric encapsulation is about 15 kV/mm, about 17.5 kV/mm, about 20 kV/mm, about 22.5 kV/mm, about 25 kV/mm, about 27.5 kV/mm, or about 30 kV/mm. Arcing between the electrodes may also be prevented by using electrodes in which the electrodes have different surface area. In some cases, the surface areas of the electrodes differ by a factor of 2, 3, 4, or 5. In some embodiments, the print head described herein comprises a first electrode and a second electrode, wherein the first electrode has a surface area that is different from the surface area of the second electrode. In some cases, the surface area of the first electrode may be greater than the surface area of the second electrode. In some cases, the surface area of the first electrode may be less than the surface area of the second electrode. In some cases, the dielectric encapsulation comprises polytetrafluoroethylene (PTFE) and has a dielectric strength of about 19.7 kV/mm.

In some embodiments, the metal electrodes each have uneven surface area so as to avoid arcing by creating an extended electric field between the electrodes on the inner side of the dielectric tube. In some embodiments, one of the electrodes has a perimeter/surface area that is more than double that of the second electrode.

In some embodiments, one or more than one dielectric tubes are placed inside the dielectric tube. In those cases, the one or more dielectric tubes can be extended from inlet manifold up to nozzle. The length of the inner dielectric tube/tubes can be varied either to be short so that the material coming out of the tube is in the active plasma region and the materials can be interacting with the plasma species. In some cases, the tube length can be extended all the way up to nozzle to avoid material interaction with plasma species. The tube can also be made of metal and connected to electrical source or to ground and function as an electrode.

Optional multiple electrodes dispersed over the primary dielectric tube that can be connected to same or different voltage sources that provide varying input energy to multiple electrodes creating dual field in the dielectric tube and generating dual plasma zone. Multiple electrodes driven by varying electrical energy inputs create a gradient plasma and hence a temperature gradient in the dielectric tube; a provision for introducing the primary gas closer to the electrodes for igniting the plasma and if needed a carrier gas with a higher breakdown voltage being used for transporting the aerosol to the plasma region so that the plasma is concentrated in between the electrodes and thereby avoiding presence of plasma outside of the electrode region and minimizing loss of materials to the walls of the tube that connects the nebulizer to the print head in the form of plasma deposition;

In some embodiments, the adjustable electrode configuration allows to change the spacing between the electrodes without removing the electrode from the assembly to control process parameters like temperature, mean free path/residence time in plasma, effective plasma area etc., to get specific material properties In some embodiments, the material to be printed is accelerated out of the nozzle by the externally applied electric field, plasma and gas pressure, with defined orifice to enable focused expulsion of the material from the dielectric tube towards a substrate for printing on a defined geometry.

In some exemplary embodiments, one configuration there may be one input for the precursor, or gas, to enter into the primary dielectric tube. In another configuration there may be a plurality of inputs for more than one precursor, or gases, to enter the primary dielectric tube, either one at a time or simultaneously. In yet another configuration there may be one or more inputs for the precursors, or gases, to enter into the primary dielectric tube and there may be a secondary dielectric tube within the primary dielectric tube. In this configuration the precursors may enter into either the primary or secondary dielectric tube, or both, one at a time or simultaneously.

In some embodiments, the multiples electrodes can be dispersed inside, outside of dielectric, continuous, wound, embedded with dielectric etc.

In some embodiments, the electrodes the dielectric tube could be made of any aluminum, quartz, ceramic, teflon, machinable ceramic, macor etc. In some cases, the electrodes comprise an electrically conducting material. In some cases, the electrodes are connected to one or more voltage sources. In some cases, the voltage sources comprise one of a DC source, a pulsed DC source, an AC source, an RF source, and a microwave voltage source.

In some embodiments, the replaceable nozzle has provision for introducing non-interactive sheath gas for focusing the materials coming out of the nozzle. In some cases, in the adjustable electrode spacing, uneven surface area of the electrodes, dielectric strength and thickness of the dielectric tube and dielectric encapsulation, extreme applied voltage sources, gas mixtures and modular design of the inlet manifold, plasma manifold and nozzle manifold allows for intricate control of plasma characteristics to print materials with high molecular precision and required characteristics.

In some embodiments, the modular assembly can be used to treat materials and/or microbes on the surface using appropriate gas mixtures and electrode configuration, to make maximum possible impact to the target surface through a combination of energetic ion bombardment and reactive species generated in the plasma to change the morphology, topography, chemical structure, molecular structure, surface energy of the material being treated and also to remove any organic molecules from the surface.

Another aspect of the invention provided herein relates to photonics devices, and more particularly, to plasma jet printing apparatus and method for printing optical materials with desired optical properties for manufacturing of photonic and hybrid electronic photonics devices.

Printing of optical materials with tailored optical characteristics can have far reaching applications in manufacturing of next generation photonics-based devices. A wide variety of optical materials including polymeric materials, electroluminescent materials and plasmonic metal materials are key elements in manufacturing of next generation communication and information systems, optical switching, computing, and display panels—both organic light emitting diodes and photonic displays.

Traditional manufacturing methods are not always compatible with the nature and type of materials being explored or with the nature and geometry of the substrate materials on which the optical materials are being printed.

There is a need for novel manufacturing technologies that can enable printing of wide variety of optical materials on a range of substrates to allow low-cost and high-performance fabrication of optical devices.

With the rapid growth of Internet of Things, connected devices, telecommunications, and cloud computing, the bandwidth requirements of data centers and high-performance computers have increased drastically. All these factors are driving exponential growth in data, with a consequent need to handle data densities and transfer speeds beyond the functional limits of metal interconnects. Power consumption, data traffic congestion and noise become major issues. There is a need for optical interconnection systems that are compatible with electronic systems as a hybrid configuration. Embedded optical communications channels within computer systems could provide higher bandwidth capacity to satisfy the needs of the industry.

Advanced polymeric materials have been explored for non-linear optics and optoelectronics applications. Organic-based components such as optical waveguides, modulators, optical switches, splitters, organic laser sources, optical amplifiers and detectors are all being heavily researched.

Optical waveguides made of optically transparent materials that can guide electromagnetic radiation in UV, Visible, and/or IR wavelength ranges can be used as components in integrated optical circuits.

Optical fibers and optical waveguides may be considered to make up two different classifications of optical interconnects. According to the type of material used to fabricate the waveguides, optical waveguides can be classified as inorganic or organic. Inorganic waveguides are primarily silicon dioxide-based and organic waveguides are primarily polymer-based.

The higher bandwidth capacity, low noise, and low cross talk that are characteristic of polymer waveguides, along with their ability to increase the channel density, make them highly attractive. Hence, board-level optical interconnects made of polymer waveguides are widely being explored. Polymer based devices offer low cost and a simple process for fabrication.

Printing technologies enable fabrication of optical devices and their integration on to structural components.

Another variety of optical materials that can control light at nanometer-scale by coupling electromagnetic field to the oscillations of free electrons in metals includes plasmonic materials. Plasmonic nanoparticles such as colloidal silver and gold particles strongly scatter and absorb light near to their localized surface plasmon resonance (LSPR).

For plasmonic coupling of electromagnetic waves to the free electron cloud of the metals, the metal film or structure that is used should be supported on a dielectric medium that has certain specific optical properties.

The plasmon resonance intensity and wavelength depend on the kind of metal, nanoparticle size and shape, as well as the dielectric strength of the surrounding medium. Appropriate choices of these parameters provide the capability to tune the plasmon resonance, which is crucial for several applications, including plasmonic detection of biomolecules, particle-based therapies, nanoantennas etc.

The plasmonic surfaces prepared through printing of nanoparticles and metamaterials have applications in optoelectronics, liquid crystal displays, touch screens, etc. Further development of plasmonic applications relies on the emergence of new fabrication methods of plasmonic devices.

Transparent conductive indium tin oxide (ITO) substrates are currently used to fabricate transparent electrodes in a large variety of optoelectronic devices including liquid crystal displays, touch screens, and organic light-emitting devices. Plasma jet printing of plasmonic metal nanoparticles onto ITO substrates could play an important role in creating future plasmonic and optoelectronic devices.

Thick metallic films perforated by arrays of sub wavelength holes can greatly enhance the optical transmission of underlying waveguides. It has been reported that surface plasmon resonance is the primary reason for the extraordinary optical transmission of such waveguides.

Direct write printing technologies play a crucial role in printing plasmonic materials and engineered nanomaterials, also known as metamaterials, with precise size, shape, geometry etc. Precise controlling of thickness, density of packing, particle size and shape, dielectric strength of the adjacent medium are all very important for plasmon resonance.

An important problem in optical packaging involves the optical interconnection of planar-integrated photonic integrated circuits such as chip-chip connections, and the connection of such circuits to the external world. Photonic integrated circuits (PICs) refer to waveguide-based photonic components, including optical integrated devices such as lasers, optical amplifiers, switches, filters, modulators, splitters, phase shifters, variable attenuators, detectors, and the like. PICs can also include integration with semiconductor devices such as CMOS electronic devices.

Various methods for manufacturing optical waveguides have been used using polymer materials. These methods include photolithography method, a hot embossing method, reactive ion etching, laser ablation, molding, a direct ultraviolet patterning method, a laser direct writing method, inkjet printing and aerosol jet printing, or a combination thereof. An ultraviolet (UV) curing approach involves applying UV radiation to resins or polymers to cause photopolymerization. In a photo-polymerization reaction, a monomer comprising a single organic unit, or an oligomer—a molecule comprising a small number of organic units—is converted, or cross-linked, to form a solid cross-linked polymer.

The photolithography method includes very complicated processes involving multiple steps, including coating a cladding material on a substrate, baking, coating a core material, applying photoresist, exposure using photomask, developing and etching.

In the hot embossing method, a core portion is molded in under-clad material using a mold master, core material is inserted into the molded structure, an overclad is deposited there-on, and ultraviolet radiation is applied in order to cure the core material and adhere the over clad.

In the ultraviolet direct patterning method, after an under-clad is formed on a planar substrate, a ultraviolet-curable polymer is coated thereon as a core layer. Then, after ultraviolet exposure through a photomask, a core pattern is formed by using a polymer developer, and finally, a coating of an upperclad material is applied.

The laser direct writing method is based on a laser micro-machining technique. The laser direct writing method has the advantages of a short process time, low cost and the possibility of application over a large area, because of the simplicity of the process, without the need for a photomask.

Plasma jet printing can either be used as an alternative to inkjet printing, spin coating, screen printing, dipping, spraying, or in combination with one or more than one of these printing technologies as a complementary technique for printing certain types of materials.

Plasma jet printing provides an alternative strategy to achieve fast selective deposition of plasmonic nanoparticles onto transparent conductive electrode substrates.

Embodiments of the current invention described in this disclosure use plasma jet printing as a novel way of fabricating optical packaging, in particular in fabricating optical polymer waveguides.

Waveguide performance depends strongly on the quality of the waveguide surfaces, such as the core sidewalls. High surface roughness or defects become the strongest contributor to optical scattering loss along a low-quality waveguide Refractive index changes can also severely affect the quality of waveguides and device performance. Plasma jet printing process enables tailoring surface roughness and refractive index.

Optimizing the plasma printing process parameters is essential in achieving high transmission quality and high resolution. Plasma jet printing enables manufacturing of both single mode and multimode waveguides.

Silicon dioxide (silica) is an important material for a range of applications. For example, silica can be used to form transparent optical materials useful for the transmission of light. In addition, silicon dioxide is a useful dielectric for applications in electronics and plasmonics. Also, silicon dioxide can be selectively doped to influence the properties.

In the fabrication of optical waveguides for optical communications, silica particles or a silica film can be printed to form waveguides using a plasma jet process. The index of refraction of the resulting optical waveguide structure can be altered through plasma process control to get a desired refractive index profile or distribution, for example, a uniform refractive index, or a continuously varying refractive index, or a profile with a sharply defined lateral and/or longitudinal boundary.

Other applications include displays in which display elements can be formed through the disclosed printing process and subsequent processing. The printing process can be effective to form display structures with a desired optical material at selected locations within the structure, wherein the optical materials incorporate particular dopants to influence the optical and/or other physical properties of the material.

Fluorescent or luminescent materials like phosphor particles can be coated with silica either in solution or during plasma printing. Boron, phosphorous and/or germanium dopants can be added as plasma process parameters. Plasma jet printing can be used to print active materials that can emit light under appropriate activating conditions.

Plasma jet printing provides the ability for effective printing of silicon dioxide with or without dopants to form structures at higher resolution than what other currently used methods allow. With appropriate control of plasma process parameters, the silicon dioxide can be printed rapidly and with relatively high resolution. The ability to introduce selected dopants over a wide range of compositions provides the ability to form a correspondingly wide range of devices based on properties of the silicon dioxide film or particles used.

Plasma jet printing allows for fast and programmable deposition of numerous colloidal plasmonic metal nanoparticles onto a transparent electrode, along arbitrary 2D circuits that can be easily designed.

Plasmons may be created in graphene, providing a material with many unique properties and allowing for practically useful methods of light manipulation. Such graphene plasmons can have far reaching applications in computing and in displays. The tunable plasmonic characteristics of graphene on its own as well as the combination of graphene plasmonics with noble metal nanostructures offer a wide range of applications that are not easily achieved by conventional noble metal plasmonics without graphene.

The versatility of graphene means that graphene-based plasmonics may enable the manufacture of novel optical devices working in different frequency ranges, from about 0.5 terahertz to about 300 terahertz, with extremely high speed, low driving voltage, low power consumption and compact sizes. Graphene plasmons at mid-infrared and longer wavelengths are known. Controlled doping may allow them to be created in the visible and near-infrared regimes.

The use of the plasmon resonance characteristics of aluminum nanoparticles for color displays has already been explored. The displays are made up of arrays of pixels which are made up of nanostructures, and the color is generated by the characteristics of light scattered. Different arrangements create different colors. Aluminum plasmonic pixels are advantageous for use in electronic displays because they are inexpensive and can be made in an ultra-small size, which can increase image resolution.

Several approaches have been reported so far to create patterned structures using graphene oxide (GO) ink, including micromolding in capillaries (MIMIC), gravure printing, screen printing and inkjet printing. The first two suffer from limited scalability while screen printing has the lowest resolution among all techniques. Hence, inkjet technology is the most accepted choice for the fabrication of such devices.

However, present inkjet printing technologies, widely used to print graphene based electronic devices, suffer from the need for various post processing steps, and are also substrate dependent. The major issue with GO-based inks is the need for reduction after printing, which is done either by high temperature annealing or by reducing agents like hydrazine vapor. Other techniques include UV reduction and annealing in an Argon/Hydrogen atmosphere.

Tailoring the ink plays a key role for a successful printing process. Ink properties like viscosity, surface tension and density are important and need to be designed according to the substrate. Most inks, including graphene inks, require sophisticated pre- and post-processing steps. Thus, there is a strong drive to develop a robust technique that is independent of the ink in use and has the ability to perform any additional processing steps in-situ. Plasmas, whether at low pressure or especially at atmospheric pressure, possess considerable potential in functionalization of carbon based materials. This is because plasma discharges can allow the fixation of different chemical species of the same element to the graphene structure. Atmospheric pressure plasma jet printing could, therefore, be an ideal solution to overcome several problematic issues of conventional printing techniques.

As described in detail herein, plasma jet printing of reduced graphene oxide with He and $H_2$ plasma can simultaneously deposit graphene oxide from a highly acidic precursor and reduce it. The deposited films can be further treated with plasma to enhance their properties. This process effectively negates all the intermediate steps involved in wet chemistry-based preparation. The removal of oxygen functionalities is expected to have a definite effect on the electronic properties of the graphene oxide films.

A plasma jet process can reduce in situ highly acidic graphene oxide without the need for external post-processes. No other printing technique has achieved this till now. The reaction intermediates otherwise formed during synthesis of graphene oxide can be eliminated by introduction of reducing gases in the plasma. This reduction process aids in the recovery of the sp2 structure of the graphitic lattice.

According to one aspect of the present invention, there is provided an apparatus for direct write, dry printing and patterning of optical materials using plasma jet with tailored optical properties to fabricate photonics and hybrid photonics devices. The materials can be printed on a single layer or as multiple layers. Printing can be either as a homogeneous material or as a hybrid film containing one or more than one type of material, or more than one variation of same material. Uses of the fabricated devices include but are not limited to communication and information systems, optical packaging, computing, and display panels. The methods and apparatus described herein can facilitate printing of multi-materials such as organics, inorganics, plasmonics etc., with tailored material characteristics as a homogeneous or as a hybrid film.

One apparatus comprises a modular print head for generating plasma that enables direct write dry printing. In some embodiments, the print head comprises an inlet module to allow one or more than one optical materials, and/or one or more than one gas mixture into the print head and the plasma region. In some embodiments, the modular print head comprises a nozzle containing an orifice for printing the materials. In some embodiments, a mask can be attached to the print head for patterning of the optical materials. The mask can be moved together with the print head or moved independently using a piezo motor, or some other means of creating relative motion. The piezo motor or other means attached to the mask, so that the entire print head can remain stationary while the mask moves to create a pattern.

The mask can be manufactured using any of a number of known methods, like photo lithography, silicon micromachining, photo chemical machining, precision machining, plasma etching, reactive ion etching, or a combination thereof. The mask can enable printing feature sizes in micron or sub-micron geometries that are not achieved by other printing methods such as ink jet, aerosol jet, screen printing, or a combination thereof. The mask can be attached to the modular assembly of the print head at the outlet of the nozzle so that the mask can be removed and replaced as necessary, depending on the required feature size in printing and also depending on the nature of material.

In one embodiment, an inlet of the modular print head contains an atomizer or nebulizer that creates an aerosol mist from the material that enters the print head through the inlet. In some cases, the atomizer or nebulizer creates an aerosol mist of a colloid-containing optical material. In some cases, the atomizer or nebulizer creates an aerosol mist of a precursor/monomer that can be polymerized by plasma or a polymeric blend. In some cases, the atomizer or nebulizer can be operated pneumatically. In some cases, the atomizer or nebulizer can be operated by a piezo electric method that allows the particle size to be predetermined using appropriate values of gas flow and piezoelectric operating frequency. Either one material may be introduced, or multiple materials may be introduced simultaneously, to create a homogeneous or heterogeneous or hybrid film. For the multiple material cases, more than one gas supply may be attached to the inlet through mass flow controllers. The one or more gases are used to generate plasma and depending on the need, a reducing gas or an oxidizing gas or any other chemical reactive gas or gas mixtures can be used to tailor the optical properties of the material being printed. The gas and liquid precursor inlet can also be used to pretreat the substrate and/or to post-treat the printed pattern. In one embodiment, the apparatus, the modular print head, can also be used as a plasma etcher to etch materials from a surface. The same inlet can also be used to clean the print head by introducing appropriate gas mixtures and/or liquid precursors that will be used to etch or remove the materials settled in the inner part of the dielectric tube during printing, effectively cleaning the nozzle and the print head.

Either the print head or the mask can be moved in such a way that one or more chemical gradients are created, and optical properties may be varied, either continuously or discontinuously, to produce discrete units of materials with defined optical properties. Boundaries can be defined using a combination of print head or mask movement and careful controlling of input materials and gas mixtures.

The print head may also have the ability to control the size and shape of the orifice such that the geometry of the printed material can be modified in situ. One such method of orifice size and shape control involves two individual plates in sliding contact that have a shaped notch machined into the leading edge such that when one plate moves in relation to the other it changes the size and shape of the orifice. This relative motion may be controlled with a piezo motor, a stepper motor or similar. Varying the size and shape of the orifice while printing provides an additional method of controlling the printed material geometries and cross sectional profiles.

Plasma jet printing of silicon dioxide (silica) can be carried out either using ink containing silica nanoparticles or by plasma polymerization of organosilane or siloxane precursors. In the case of silica nanoparticles, the surface chemistry can be changed either via the liquid solution by mixing appropriate reactants or via the plasma process by introducing an appropriate gas mixture or mixtures to modify nanoparticles' surfaces. In the case of plasma polymerization of organosilane or siloxane, the film chemistry and the refractive index can be changed by introducing appropriate gas mixtures or reactants in the print head.

In the latter case, the surface modification agent such as a gas mixture or a reactant, can be introduced into the print head. The degree of surface modification and the degree of polymerization can be controlled by selection of the corresponding plasma process parameters. In some cases, introducing a carbon-based or fluorine-based source, while printing silicon dioxide, can produce low K dielectric films. In some cases, introducing nitrogen can produce high K dielectric films. In a case where a silica coating is formed by plasma polymerization of a siloxane precursor, controlling the oxygen flow rate into the print head can result in a film with varying carbon content and refractive index.

In some embodiments, using graphene oxide, a reducing gas like hydrogen or ammonia can be introduced into the print head so that the graphene oxide is reduced in-situ and the printed pattern contains reduced graphene oxide.

In some cases, the output of the plasma jet printing process is a dry material that is printed onto the substrate. Compared to the main alternative, this removes both the curing step and the spreading of liquid droplets that could affect the resolution and line width. Relatively quick, cheap and easy manufacturing of optical waveguides can therefore be achieved with plasma jet printing.

Figure 13:
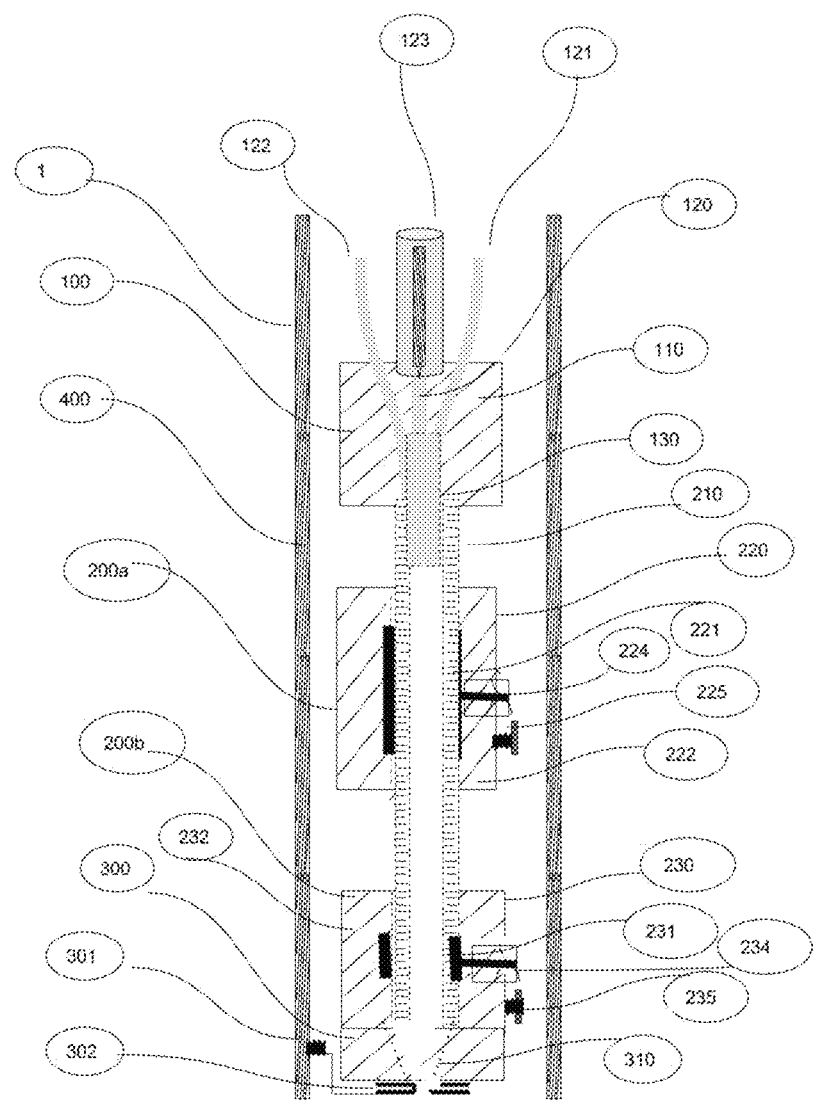

FIG. 13 shows a cross sectional view of an exemplary plasma print head 1 containing precursor and gas inlet module 100, plasma modules 200a and 200b, and nozzle module 300, all of them within an enclosure 400. The plasma print head aerosolizes the materials, mixes aerosolized material and gas mixtures at the inlet manifold, generates plasma to direct, accelerate and/or process the materials entering the print head and print with defined resolution onto the substrate placed outside the mask. The inlet module 100 comprises an inlet manifold 110, through which liquid precursors, aerosolized ink and gas mixtures are introduced and mixed. The inlet module 100 is made of a dielectric material, and contains gas mixing inlets 121 and 122, and atomizer/nebulizer 123 that aerosolizes the liquid (precursor or monomer or polymer or liquid or ink, hereafter called a "liquid precursor") entering the atomizer and gas mixing inlets 121 and 122. The inlet module is attached to a dielectric tube 210, and to the plasma modules 200a and 200b which in turn are connected to nozzle module 300, all of which can be dismantled and connected together depending on the required plasma characteristic and the type/quality of materials being printed.

Figure 14A:
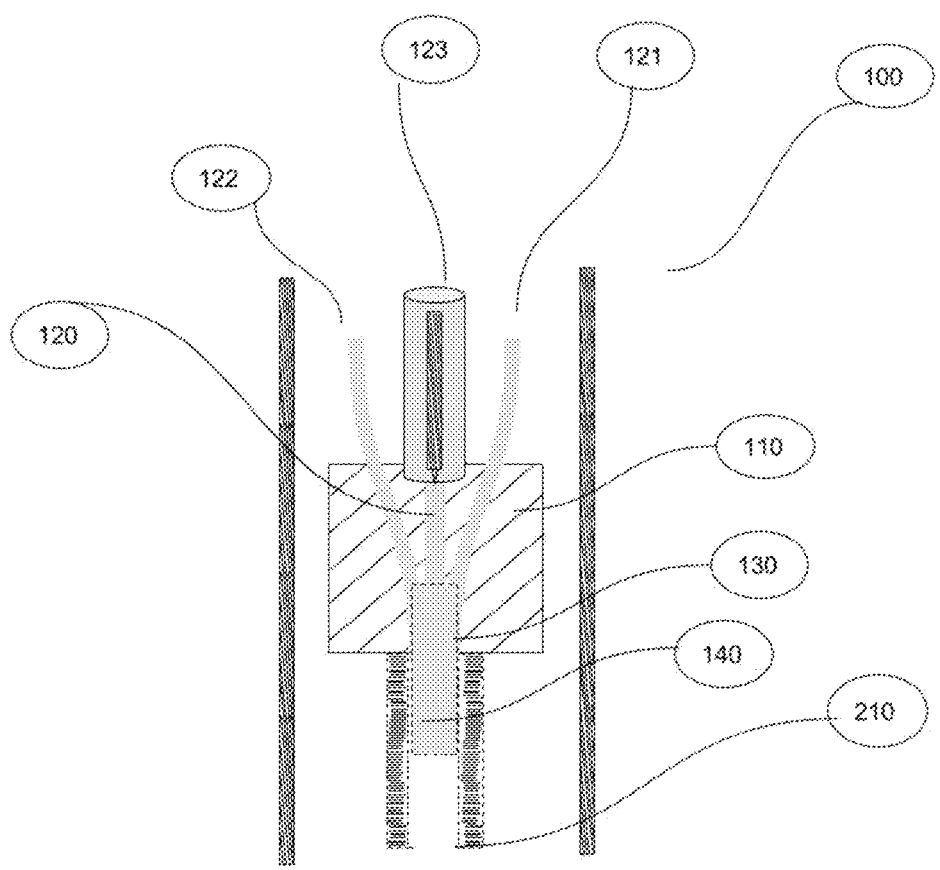
FIG. 14B is a cross sectional view of inlet portion of an exemplary plasma print head comprising one atomizer for aerosolized liquid (precursor) delivery and two gas inlets connected to an inlet module in which the atomizer is enclosed in dielectric inlet module and the enclosure.
FIG. 14C is a cross sectional view of inlet portion of an exemplary plasma print head comprising two atomizers for aerosolized delivery of two different liquids/precursors and one gas inlet connected to an inlet module in which the atomizer is enclosed in dielectric inlet module and the enclosure.

In FIG. 13, inlet module 100 comprises an atomizer/nebulizer 123 that generates an aerosol of the material to be printed; and a plurality of gas inlets 121 and 122, all connected to inlet manifold 110. The dielectric inlet manifold 110 also comprises an opening 130 which connects the primary dielectric tube 210 to the inlet manifold. In some cases, the dielectric inlet manifold 110 also comprises an optional secondary dielectric tube 140, as shown in FIG. 14A. The electrodes 221 and 231 are attached to the dielectric tube 210. One of the electrodes can be connected to the positive terminal of the power supply, and another can be connected to the negative or ground terminal. In some cases, additional electrodes can be placed depending on the need.

The inlet manifold 110 can hold a cluster of tubes (not shown in the figure) or have a cluster of inlets 120, 121, and 122. Each inlet can be used to introduce one or more gases, one or more precursors, one or more materials or one or more gas mixtures. In some cases, each inlet can connect one or more secondary dielectric tubes that are placed inside the primary dielectric tube.

In some embodiments, all the inlets 120, 121 and 122 can be connected to gas supply lines. In some embodiments, as shown in FIG. 14A, one of the inlets can be connected to an atomizer or nebulizer 123 that can generate an aerosol mist of liquid entering the nebulizer.

Figure 14B:
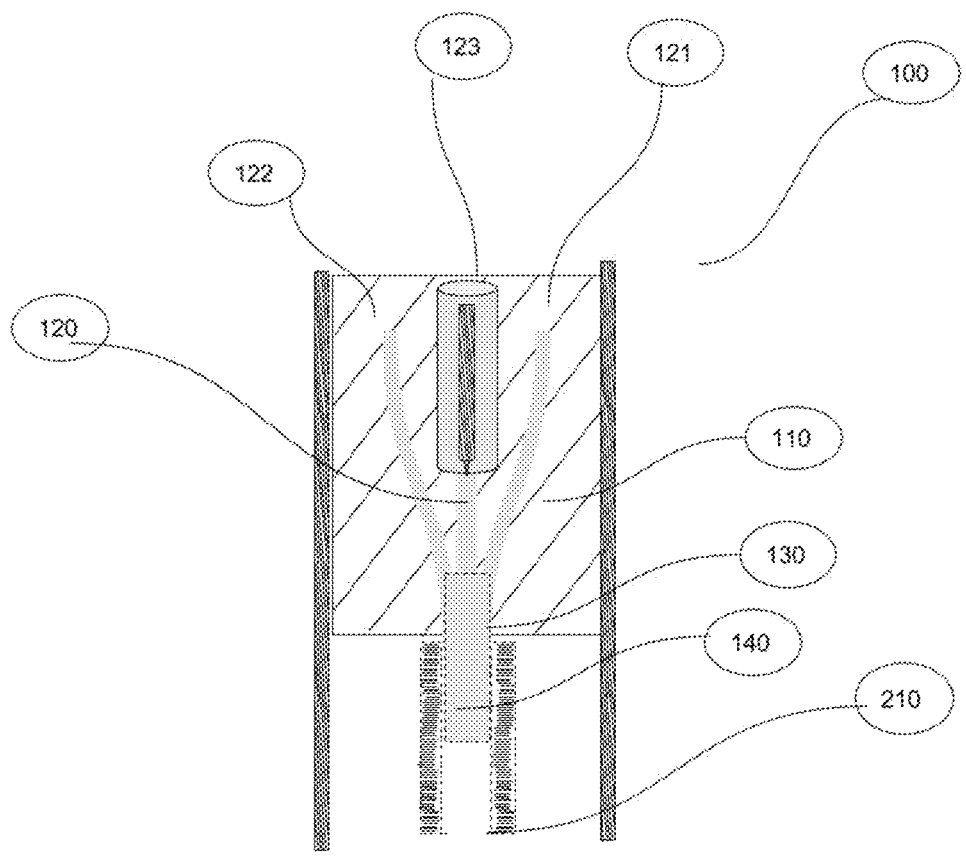

In some embodiments, as shown in FIG. 14B, the inlet manifold 110 can be of sufficient size and volume so that the atomizer or nebulizer can be mounted inside the inlet module.

Figure 14C:
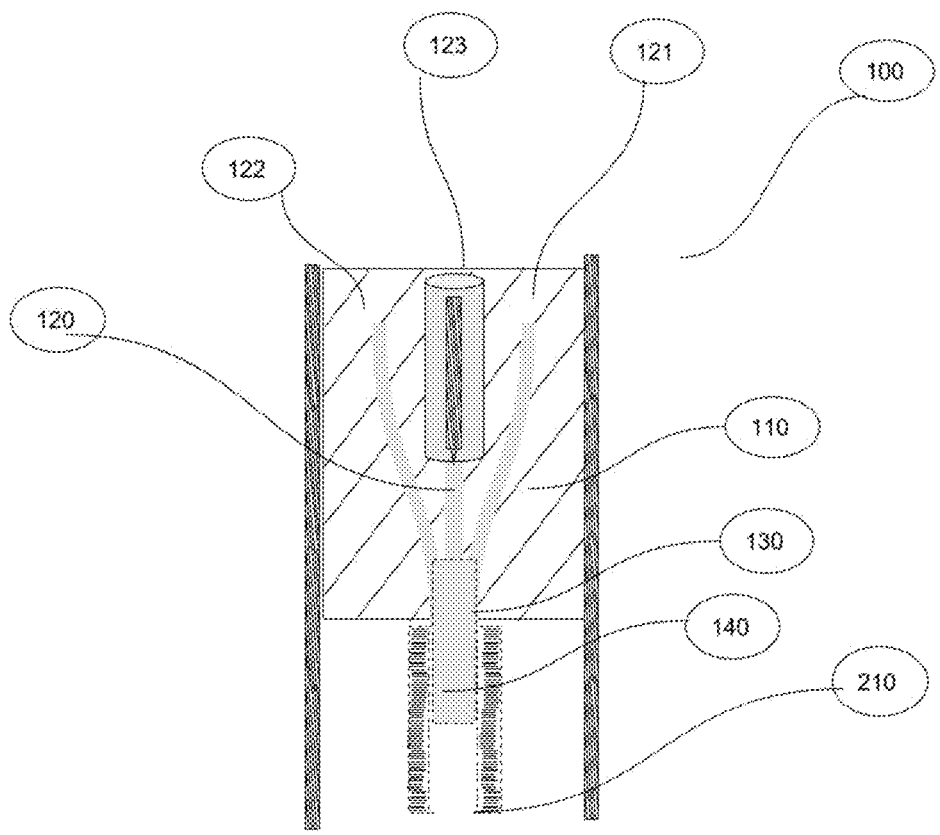

In some embodiments, as shown in FIG. 14C, the inlet manifold 110 can have more than one atomizer or nebulizer, 123 and 124, for aerosol generation so that two different liquid precursors can be introduced into the print head. In some cases, the two nebulizers 123 and 124 can be of similar type. In other cases, each one can function differently. For example, nebulizer 123 can be a pneumatic nebulizer, and nebulizer 124 can be a piezoelectric nebulizer, both can be pneumatic nebulizers, or both can be piezoelectric nebulizers.

The piezoelectric nebulizers can be operated at similar or varying frequencies depending on the need. In some cases, the frequency is about 0.05 MHz to about 10 MHz. In some cases, the frequency is at least about 0.05 MHz. In some cases, the frequency is at most about 10 MHz. In some cases, the frequency is about 0.05 MHz to about 0.1 MHz, about 0.05 MHz to about 0.5 MHz, about 0.05 MHz to about 1 MHz, about 0.05 MHz to about 5 MHz, about 0.05 MHz to about 10 MHz, about 0.1 MHz to about 0.5 MHz, about 0.1 MHz to about 1 MHz, about 0.1 MHz to about 5 MHz, about 0.1 MHz to about 10 MHz, about 0.5 MHz to about 1 MHz, about 0.5 MHz to about 5 MHz, about 0.5 MHz to about 10 MHz, about 1 MHz to about 5 MHz, about 1 MHz to about 10 MHz, or about 5 MHz to about 10 MHz. In some cases, the frequency is about 0.05 MHz, about 0.1 MHz, about 0.5 MHz, about 1 MHz, about 5 MHz, or about 10 MHz.

In some embodiments, the print head comprises at least two plasma modules 200a and 200b; each plasma module contains a plasma manifold: plasma manifolds 220 and 230, respectively. In some cases, each plasma module contains an electrode: electrodes 221 and 231. The electrodes are connected directly to the circumference of the primary dielectric tube 210. In FIG. 13, the electrodes 221 and 231 surround dielectric enclosures 222 and 232, respectively. Also in FIG. 13, the plasma manifold 200 is shown as containing an electrical feedthrough 224 connected to the electrode 221 within dielectric encapsulation 222. The electrodes 221 and 231 in the plasma manifolds are fixed to the primary dielectric tube 210 using adjustable mechanical position controllers 225 and 235, respectively.

In some embodiments, the position controller can be a screw, slide or be made of any adjustable fixture. In some cases, the position controller can be moved along the axis of the primary dielectric tube 210 by manual means or by using a mini motor. The spacing between electrodes 221 and 231 can be controlled using the position controllers 225 and 235, respectively, depending on the nature and type of materials being printed and the plasma characteristics needed to obtain molecular precision in printing.

Figure 15:
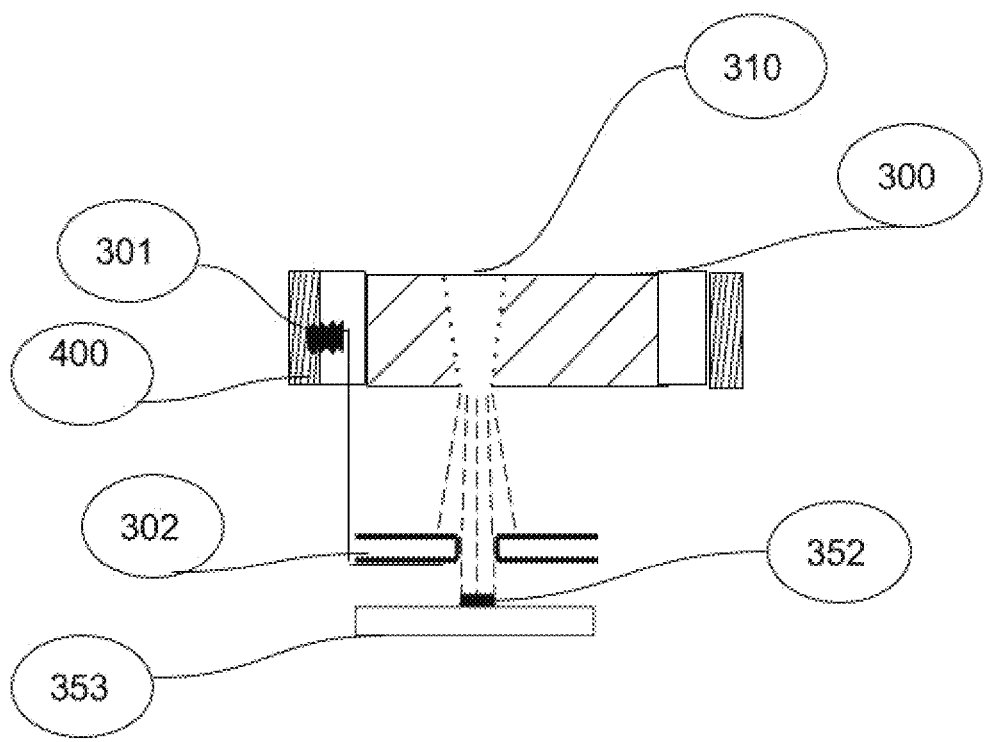
FIG. 15 is a cross sectional view of an exemplary nozzle and mask assembly showing the mask attached to a piezo motor present in the enclosure and the mask placed in front to the nozzle facing the orifice.

FIG. 15 is a cross sectional view of an exemplary nozzle module 300 with an internal orifice diameter 310. In this exemplary embodiment, an orifice controller or mask 302 is connected to the piezo motor 301 which is placed in the enclosure 400. The orifice controller or mask 302 can be independently moved with respect to primary dielectric tube 210. In some cases, the orifice controller or mask can also be moved together with primary dielectric tube 210. The mask can have features in the micron or sub-micron range, and it can enable fine geometry printing that is not otherwise possible without the mask. An example of a fine-geometry printing pattern 352 is shown on substrate 353.

Figure 16:
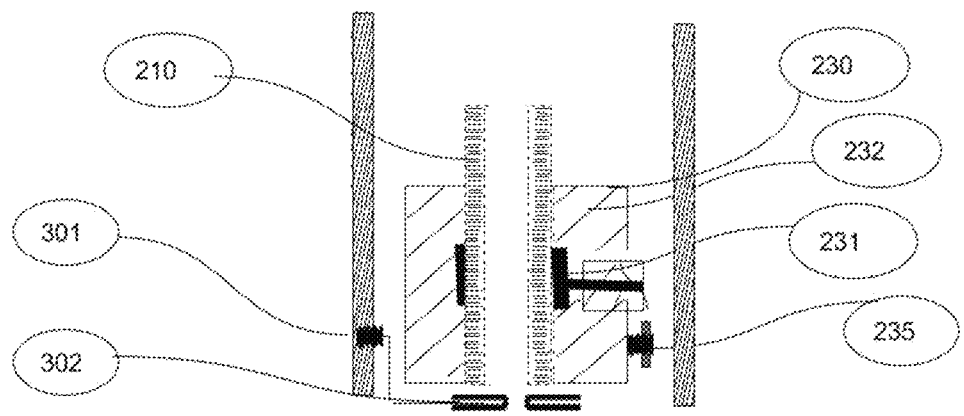
FIG. 16 is a cross sectional view of an exemplary dielectric tube, enclosure and mask assembly showing the mask attached to a piezo motor present in the enclosure and the mask placed directly at the outlet of the dielectric tube.

FIG. 16 is a cross sectional view of the modular portion of an exemplary plasma module 230. In this embodiment, the plasma module contains the dielectric tube 210 that is connected directly to the orifice controller or mask 302.

Figure 17:
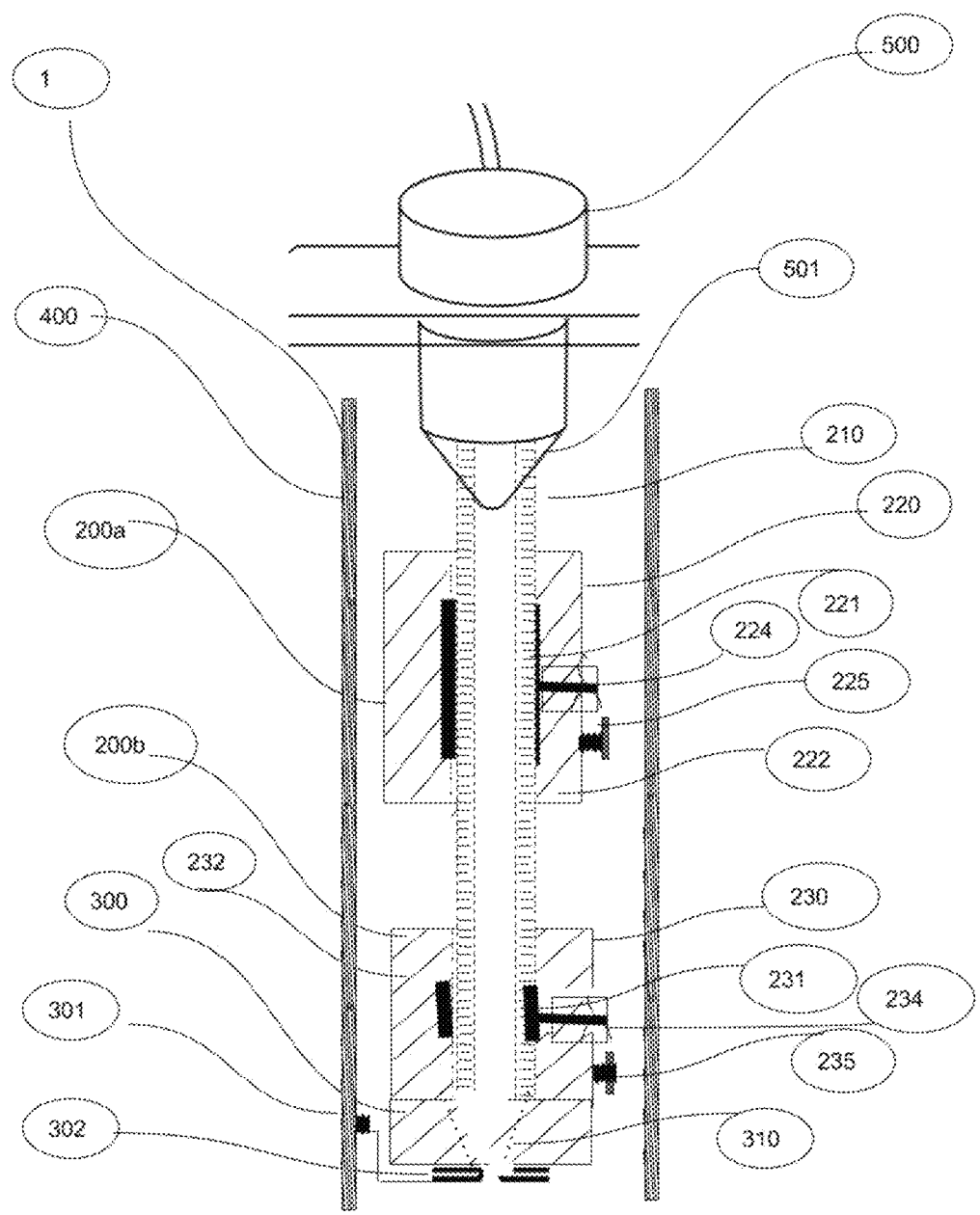
FIG. 17 is a cross sectional view of an exemplary non-plasma print head (comprising inkjet or aerosol jet or cold spray equipment) connected to a plasma module, a dielectric tube, an enclosure and mask assembly showing the mask attached to a piezo motor present in the enclosure and the mask placed directly at the outlet of the dielectric tube.

FIG. 17 shows an exemplary configuration of the printing apparatus, in which the plasma print head 1 can be used in combination with other types of printer 500. In some cases, the other type of printer is an aerosol jet printer. In some cases, the other type of printer is an ink jet printer. The plasma module can be attached directly to the print head 501 of the non-plasma printer comprising ink jet, aerosol jet, cold spray or a combination thereof. In some embodiments, the print head of the non-plasma can be attached to the print head of the plasma printer without the orifice controller or mask 302 and/or piezo motor 301. In other embodiments, the print head of the non-plasma printer can be attached to the print head of the plasma printer without the inlet module 100.

Figure 18:
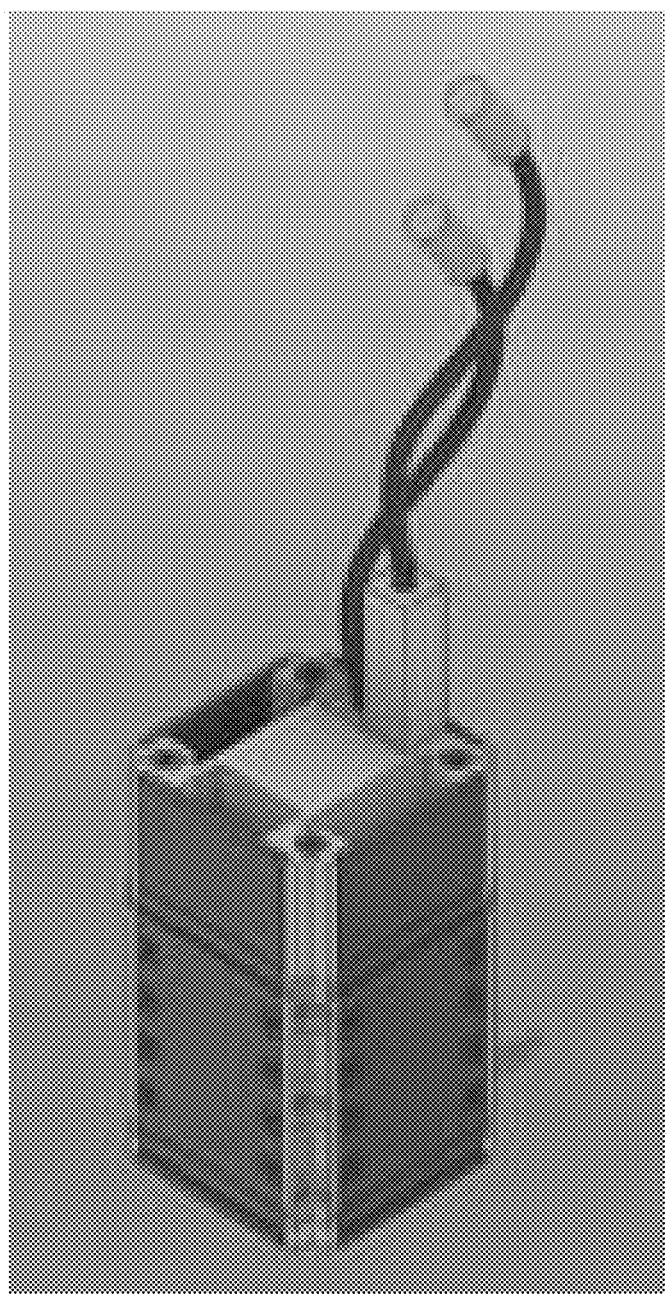
FIG. 18 is a three-dimensional view of an exemplary print head with enclosure.

FIG. 18 is a three-dimensional view of an exemplary print head with an enclosure containing the electrodes, electrode encapsulations and high voltage cable connections.

Figure 19:
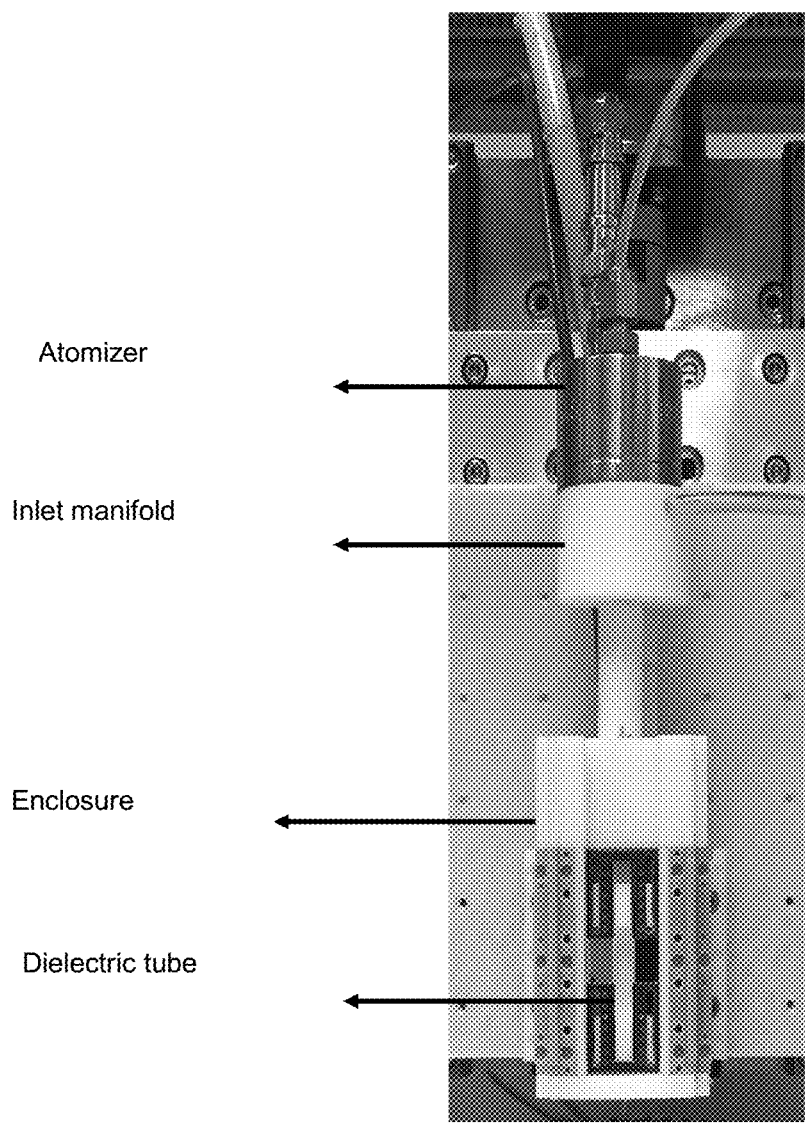
FIG. 19 is a photograph of an exemplary print head with atomizer or nebulizer, an inlet manifold, a dielectric tube with electrodes and high voltage cable with an enclosure.

FIG. 19 is a photograph of an exemplary print head comprising an atomizer/nebulizer, an inlet manifold, a dielectric tube with electrodes and high voltage cable, and an enclosure enclosing the portion of dielectric tube.

Figure 20:
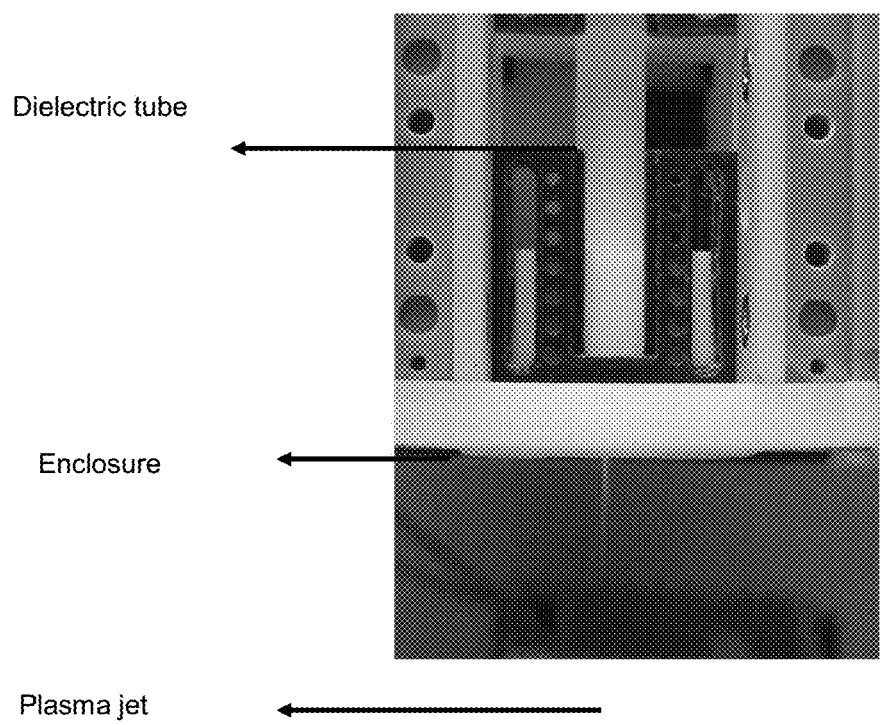
FIG. 20 is a photograph of lower (outlet/printing) portion of print head showing dielectric with electrodes enclosed, and an enclosure with plasma jet.

FIG. 20 is a photograph of the lower portion (outlet/printing) of an exemplary print head showing a dielectric tube with electrodes enclosed, and an enclosure with plasma jet shown at the bottom.

Figure 21:
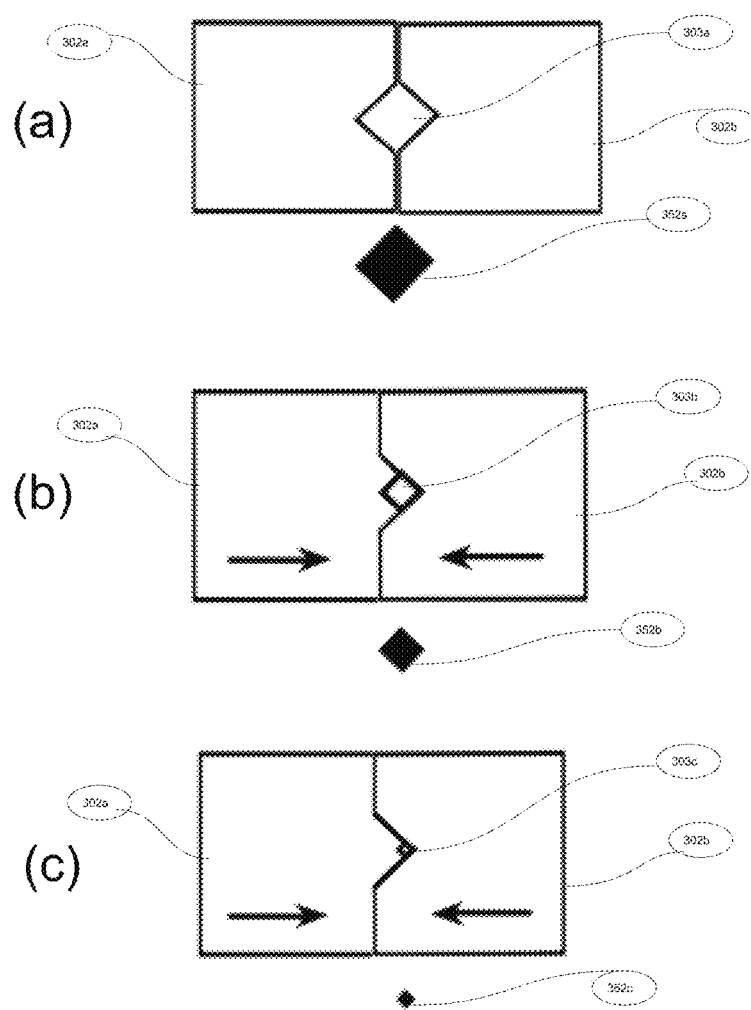
FIG. 21 is top view of an embodiment of the orifice controller or the mask showing patterned printing and ability to adjust orifice size, shape and printing resolution without having to replace the nozzle.

FIG. 21 provide exemplary top view s of embodiments of the orifice controller or the mask showing patterned printing and ability to adjust orifice size, shape and printing resolution without having to replace the nozzle. Parts 302a and 302b comprise two parts of the orifice controller which can be moved independently to control the pattern 303a and printing resolution. FIGS. 21A, 21B and 21C show different embodiments of the mask in which three different printing patterns 303a, 303b and 303c are obtained by adjusting 302a, 302b, and 302c, respectively. Three different printing patterns 352a, 352b and 352c were obtained using a single mask assembly.

Figure 22:
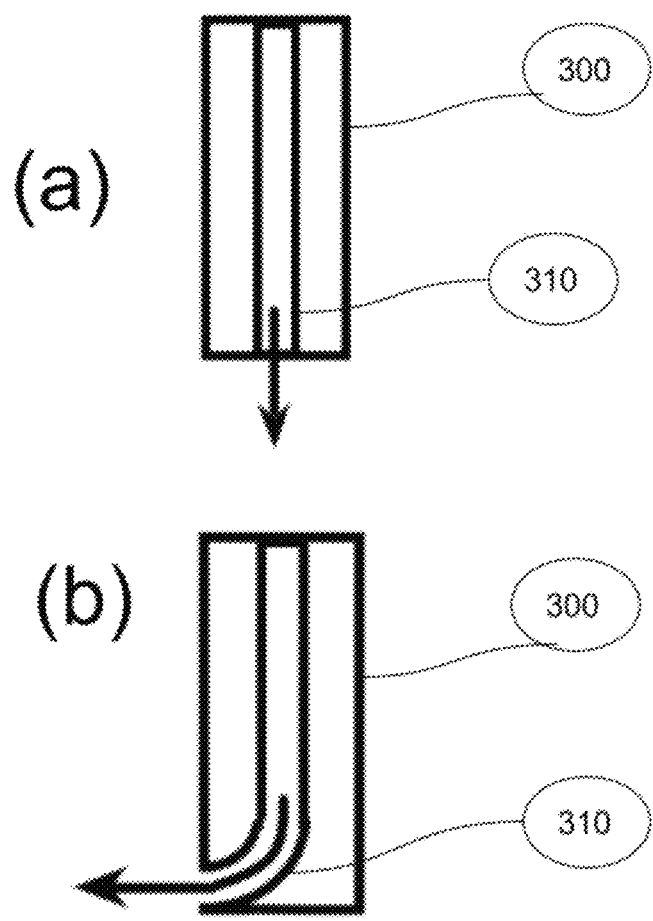
FIG. 22 is q cross sectional view of an exemplary nozzle module with orifice designed for angular printing.
Figure 23:
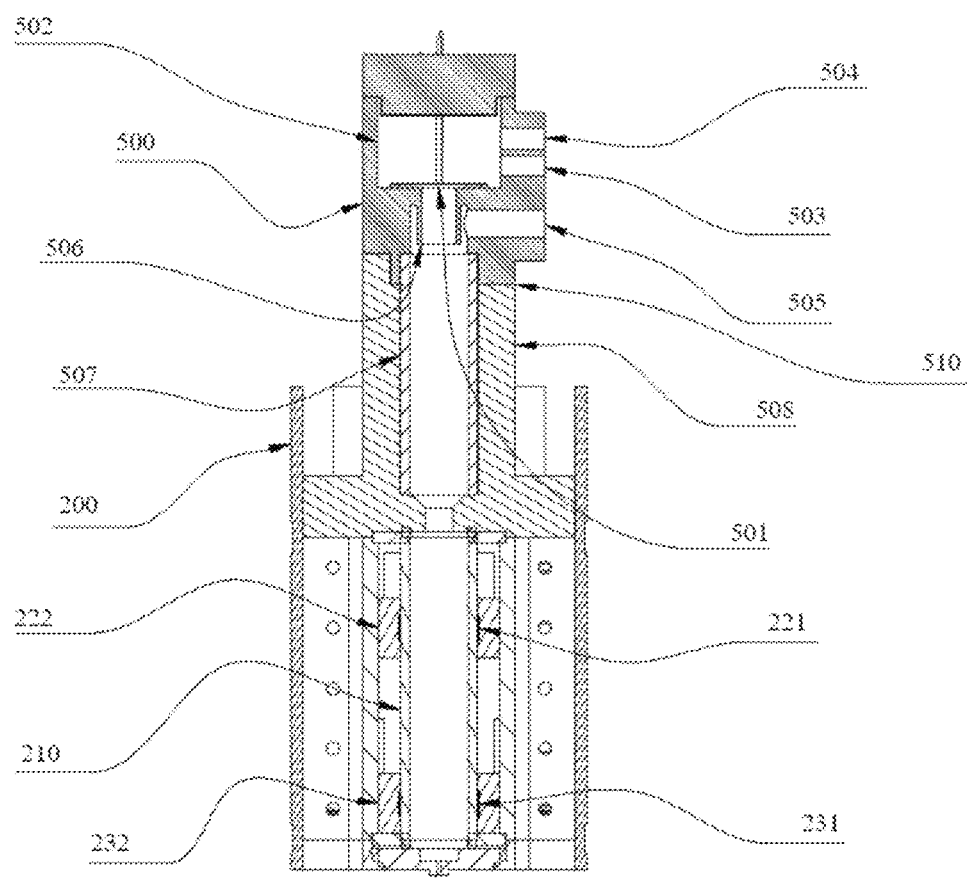
FIG. 23 shows a modular design of an exemplary fluid delivery assembly with cartridge mounted to the plasma manifold of the plasma jet print head.
Figure 24:
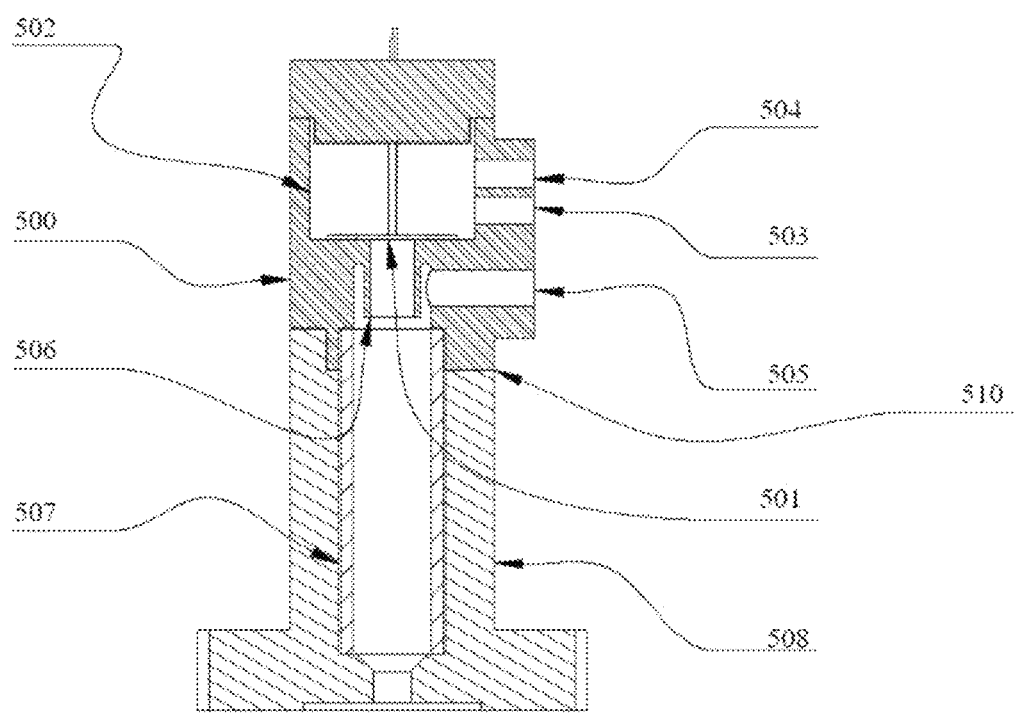
FIG. 24 shows an exemplary fluid delivery assembly comprising a cartridge with atomizer, an ink reservoir, liquid inlets, gas inlets lip and spacer.
Figure 25:
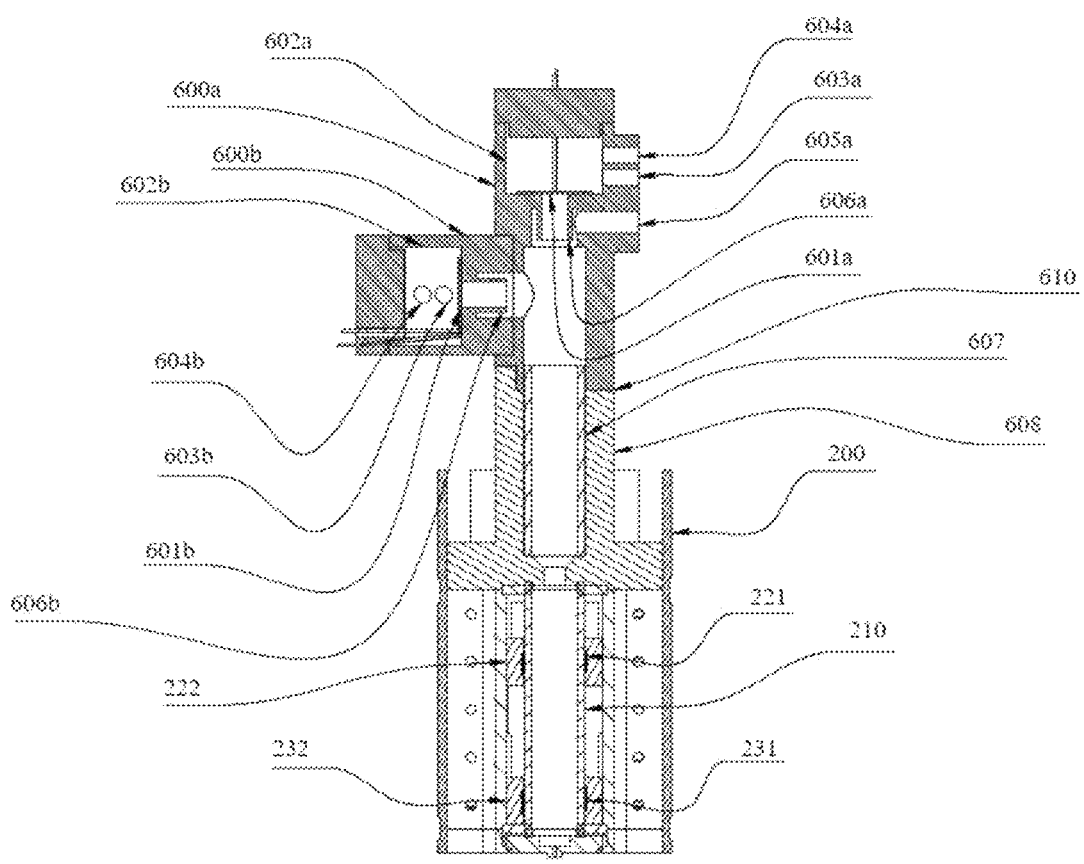
FIG. 25 shows an exemplary multi-material fluid delivery system with two cartridges mounted in a single fluid delivery assembly.
Figure 26:
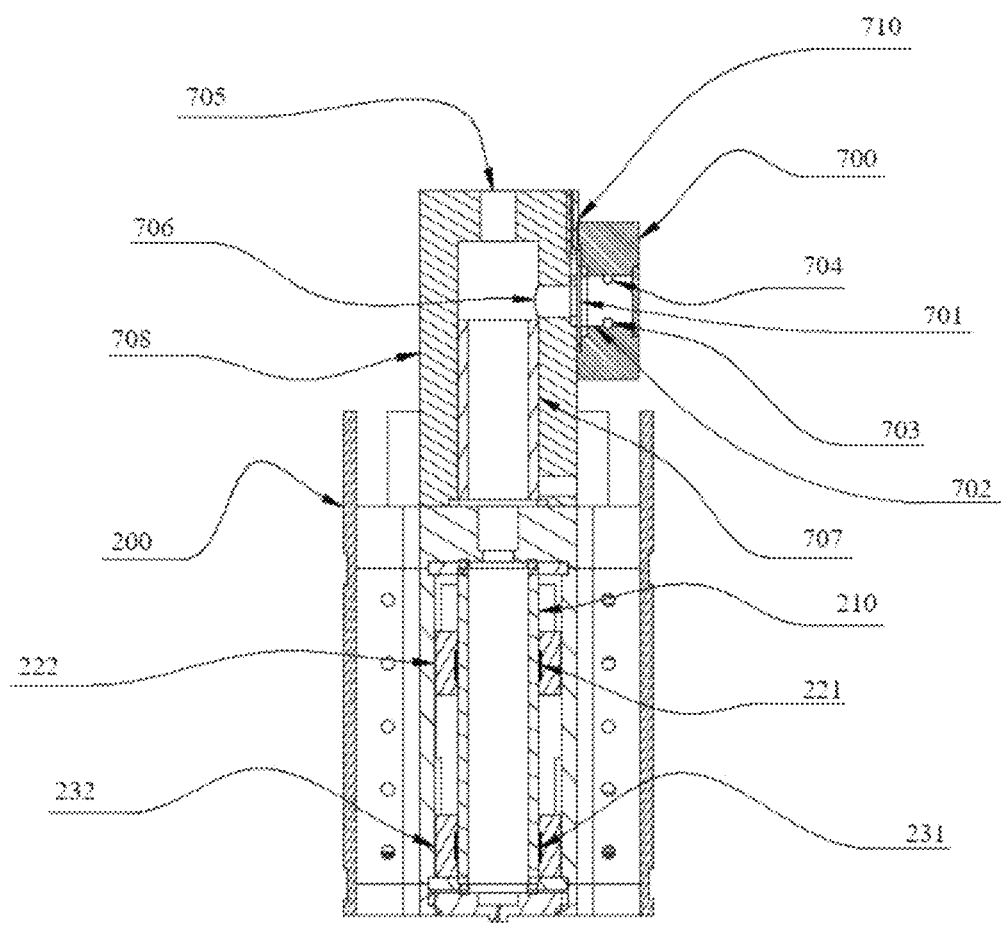
FIG. 26 shows an exemplary fluid delivery assembly with cartridge mounted vertically on the coupler.
Figure 27:
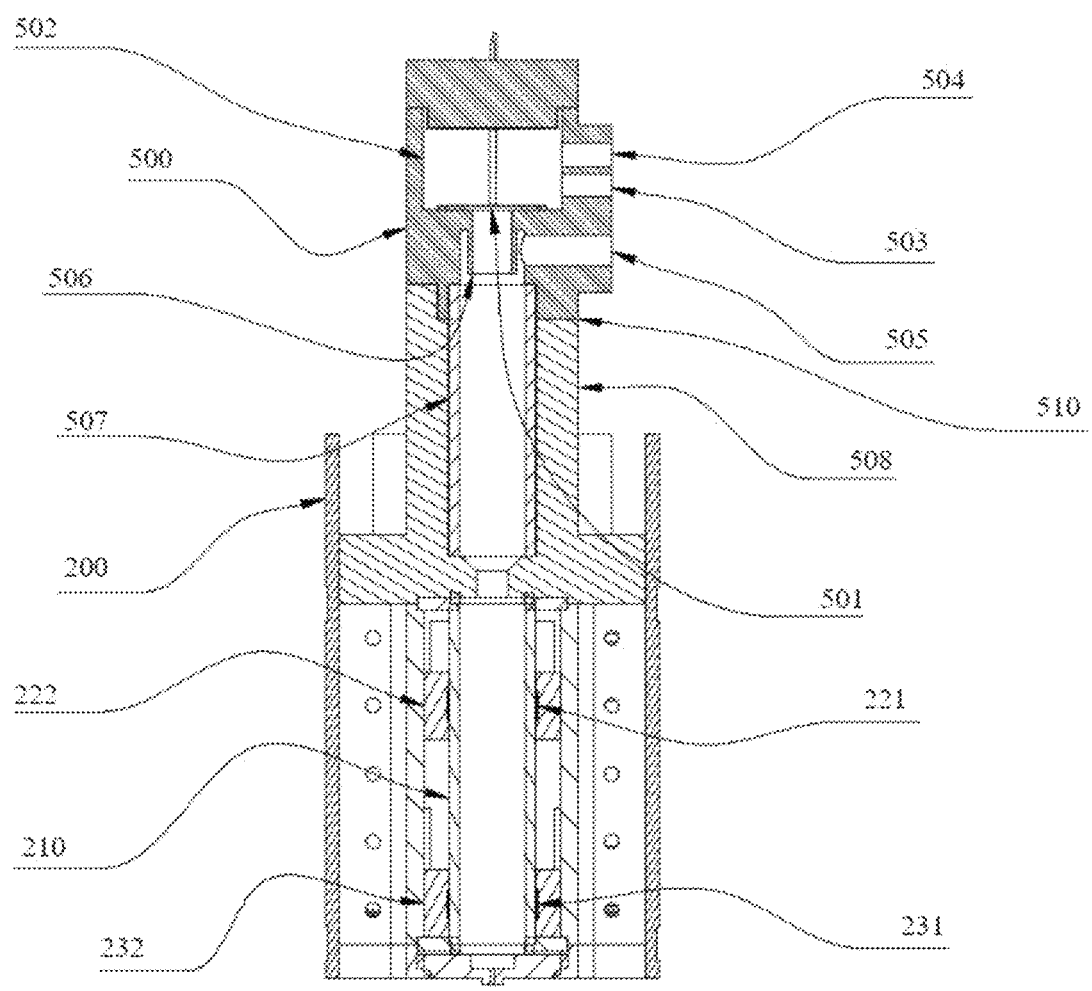
FIG. 27 shows an exemplary modular design of plasma jet print head comprising a fluid delivery assembly.

FIG. 22 is cross sectional view of an exemplary nozzle module 300 with orifice diameter 310. The orifice in nozzle module can be designed in such a way that the axis of the nozzle orifice can vary from 0° to 179° with respect to the axis of the dielectric tube 210 (not shown in FIG. 22). The orifice angle in the nozzle module can be varied to allow the printing material to exit at different angles relative to the normal incidence angle of 90° relative to the substrate.

Described herein is a modular print jet apparatus for direct write dry printing of one or more materials using atmospheric pressure plasma jet. In some cases, one or more properties of the one or more material are tuned using gaseous plasma and a mixture of precursors and gas mixtures in the plasma print head.

In some embodiments, the plasma jet apparatus comprises a plasma print head. In some cases, the plasma print head comprises: a dielectric tube with one end connected directly to an atomizer or nebulizer placed in close proximity through an inlet manifold, and a second end connected to a nozzle; two or more electrodes being disposed over the outer side of the dielectric tube and connected to a shielded high voltage cable and power supply to generate plasma discharge inside the primary dielectric tube; a nebulizer connected to one or more liquid precursor sources containing a polymeric optical material, a plasmonic optical material, or a combination, to be printed, attached directly to the print head using an inlet manifold connecting one end of the dielectric tube; a removable, replaceable and independently movable mask connected to a piezo motor placed at the outlet of the nozzle such that material coming out of the dielectric tube is focused by the mask onto the substrate; an enclosure containing: a temperature sensor for measuring the temperature of the primary dielectric tube for in-situ monitoring and optimization of the plasma, an electromagnetic interference shielding mesh to prevent electromagnetic interference from the plasma print head affecting adjacent electronics, provision to place other sensors in close proximity to the dielectric tube; the dielectric tube, the two or more electrodes, the high voltage cable; and a piezo motor with mask, inlet manifold, and nebulizer for generating aerosol mist; and multiple fluid connections to the print head to introduce materials with similar or varying optical properties and gas into the print head.

Described herein is a plasma jet apparatus for direct write dry printing of optical and plasmonic materials using atmospheric pressure plasma jet, in which the material properties are tuned using gaseous plasma and a mixture of precursors and gas mixtures in the plasma print head, to fabricate photonics and hybrid electronic photonic devices. In some embodiments, the plasma jet apparatus comprises a plasma print head comprising: a dielectric tube with one end connected directly to an atomizer or nebulizer placed in close proximity through an inlet manifold and a second end connected to a nozzle, two or more electrodes being disposed over the outer side of the dielectric and connected to a shielded high voltage cable and power supply to generate plasma discharge inside the dielectric tube; a nebulizer connected to one or more liquid precursor sources containing the polymeric and or plasmonic optical materials to be printed, attached directly to the print head using an inlet manifold connecting one end of the primary dielectric tube; a removable, replaceable and independently movable mask connected to a piezo motor placed at the outlet of the nozzle such that the materials coming out of the dielectric tube is focused by the mask to the substrate; an enclosure containing a temperature sensor for measuring the temperature of the primary dielectric tube for in situ monitoring and optimization of the plasma, an electromagnetic interference shielding mesh to prevent electromagnetic interference from the plasma print head to adjacent electronics, provision to place other sensors in close proximity to dielectric tube, wherein the enclosure encloses the dielectric tube, electrodes and high voltage cables, piezo motor with mask, inlet manifold, nebulizer for generating aerosol mist; multiple fluid connection to the print head to introduce materials with similar or varying optical properties and gas into the print head.

In some embodiments, the atomizer or nebulizer is connected to one or more than one liquid precursor source containing the monomer or polymer or plasmonic optical materials to be printed and the atomizer is attached directly to the print head using an inlet manifold connecting one end of the primary dielectric tube.

In some embodiments, the atomizer is attached directly to the dielectric tube of the print head can be used to generate an aerosol of the liquid precursor and vary the diameter and volume of aerosolized liquid droplets, wherein the liquid precursor can be a precursor or monomer or polymer or colloid or ink.

In some embodiments, the atomizer can be a pneumatic atomizer or piezo electric atomizer that creates an aerosol mist of the liquid that is introduced into the atomizer. Depending on the required aerosol droplet size, nature and viscosity of liquids, the appropriate atomizer can be chosen. In some cases, the atomizer is a piezo electric nebulizer and the operating frequency can be independently controlled such that the droplet size and volume of the aerosol carrying optical materials is optimized for plasma jet printing.

In some embodiments, there can be more than one print head assembly including a nebulizer, an inlet manifold, a primary dielectric tube, a secondary dielectric tube, a nozzle, a mask, or a combination thereof, that can be used to print polymeric and or plasmonic materials individually.

In some embodiments, the enclosure can contain two or more dielectric tubes. In some cases, one or more of the two or more dielectric tubes can be used to generate plasma discharge.

In some embodiments, the materials to be printed can be directed to the substrate through an orifice in the nozzle of the dielectric tube.

In some embodiments, a removable and replaceable mask is attached to the print head through the enclosure and is placed close to the orifice of the dielectric tube such that a pattern can be printed. In some cases, the mask is connected to a piezo motor and moved independently with respect to primary dielectric tube. In other cases, the mask is moved along with the primary electric tube to draw patterns of materials onto the substrate. The drawing of pattern can be by printing, plasma etching, plasma curing, or a combination thereof, of materials.

In some embodiments, the gas flow inlet to the print head is through the inlet manifold.

In some embodiments, the plasma print head allows for variables for controlling plasma process parameters through one or more of the following: externally applied voltage to the electrodes, gas flow rate and gas flow ratio of different gas mixtures, aerosol flow of liquid, flow rate of liquid to the nebulizer, working distance between the mask and substrate, primary dielectric tube diameter, orifice diameter, electrode separation, mask, or a combination thereof.

In some embodiments, the plasma print head allows in situ process control such that the resulting printed films properties can be precisely controlled. These properties can include film thickness, line width, aspect ratio, surface roughness, refractive index, optical transparency, plasmonics, dielectric strength, or a combination thereof.

In some embodiments, the plasma print head allows in situ doping while the printing is carried out and also allows more than one gas or precursor materials to increase or decrease the dielectric strength by varying the plasma process parameters or by creating porous structure.

In some embodiments, the polymeric optical material can be printed with appropriate plasma processing parameter to get any of the following: pristine optical property as is in the solution, tailored optical property with appropriate gas mixture, doped polymeric optical film, hybrid polymeric optical and plasmonic film. In some cases, the optical properties can be refractive index, dielectric strength, transparency, optical transmission characteristics, or a combination thereof.

In some embodiments, the material to be printed is printed in a dry form with specific line width resolution and aspect ratio by avoiding spreading of liquid droplets and by avoiding any post treatment needs.

In some embodiments, the plasma print head comprises one or more inlets connected to gas, and one or more inlets connected to nebulizer for aerosol generation. In some cases, the one or more gas inlet can be used for pre-treatment of surfaces, etching, curing and or polymerization of the printed material or the surface.

In some embodiments, the plasma jet print head comprises a nebulizer, an inlet manifold, a dielectric tube with electrodes and enclosure, a nozzle, a mask, or a combination. In some cases, the plasma jet print head can be mounted on a XYZ stage. The stage may have an additional ability on which the workpiece (substrate) can be located on the stage. The stage may rotate around the Z-axis, or on a multi-axis robot to print optical, photonics, plasmonic, electronic hybrid materials on a planar or non-planar surface including 3D objects, flexible substrates.

In some cases, the print head itself may be able to rotate such that the resultant angle of incidence of the plasma jet relative to the substrate may be varied in a controlled manner from any angle between 90 degrees and 0 degrees, in either direction. In some cases, the print head may rotate a full 360 degrees relative to its normal operating orientation, thus allowing printing in any direction. The combination of motion in the X-axis, Y-axis, and Z-axis with the additional axis of rotation around the Z axis and the ability for the print head to rotate relative to the angle of incidence to stage on which the workpiece (substrate) is located enables printing in any direction on 2D or 3D workpieces (substrates). Further, when the ability to articulate the print head relative to the workpiece (substrate) is combined with the ability to modify the size and shape of the print head orifice, an exceptional level of control over the geometry and cross sectional thickness of the printed material can be achieved.

In some embodiments, the nozzle assembly within the plasma jet print head may be substituted with a nozzle assembly that has a defined or changeable curvature such that the direction of the materials such as plasma, gas and material used to print, exiting the print head may be changed relative to the orientation of the print head such that printing may be performed within complex structures that the print head assembly would not be able to access In some embodiments, the plasma jet print head can be integrated with other printing equipment including additive manufacturing equipment, an ink jet printer, an aerosol jet printer, a cold spray, a plasma treatment system, or a combination thereof. In some cases, the plasma jet printing can be done in parallel with or in series with other manufacturing technologies. This will enable in-line manufacturing and embedding of plasma jet printed materials onto any other structures being manufactured.

In some embodiments, the plasma print head assembly can be used in any of the following possible combinations, for printing single or multi layered optical materials: aerosol jet printing of one layer and plasma jet printing of subsequent layers or vice-versa; plasma jet printing of one or more than one layer; plasma treatment of the surface before, during and after printing for any of the reasons including activation, adhesion, printing, polymerization or etching or curing of optical materials.

In some embodiments, the plasma jet print head can be used to print materials with controlled optical properties including refractive index, dielectric strength, optical and photonics transparency, plasmonic properties, or a combination thereof.

Described herein is an apparatus for printing one or more optical materials with tunable refractive index, tunable photonic transparency using in-situ plasma processing by introduction of various gas mixtures and aerosolized liquid precursor to print dielectric coating and doped dielectric coating with tailored refractive index, graded refractive index, transparency, extinction coefficient, or a combination thereof.

In some embodiments, the plasma induced refractive index change can happen by any one or a combination of plasma treatment of surface, during printing by in situ plasma process through gas and precursor mixtures; plasma-based doping of materials; post-plasma treatment of printed surface, wherein, the plasma is generated using the said print head using atmospheric pressure process.

In some embodiments, the apparatus for printing optical materials with defined refractive index and pattern allows a combination of features including aerosol jet printing, plasma jet printing, plasma treatment, or a combination thereof.

In some embodiments, the apparatus is for printing plasmonic materials with tunable metal particle density, film thickness, optical transparency, or a combination thereof, using in situ plasma processing by introduction of various gas mixtures and aerosolized metal colloid to print plasmonic coating. In some cases, the said plasmonic materials can be gold, silver, aluminum, magnesium, graphene, lead sulphide, quantum dots, or a combination thereof. In some cases, the printed plasmonic materials can be used for selective filtering of color for displays, and/or coupling of photons for plasmonic optical devices and hybrid photonics devices.

In some embodiments, an apparatus is for printing polymer resins without depositing the solvents in the film and by eliminating additional process steps like thermal treatment, curing required to remove the solvents and to cure the resin wherein the film thickness can be precisely controlled without depending on the solvent removal, curing etc., and by avoiding air bubble formation in the film.

In some embodiments, both polymeric optical materials and plasmonic materials can either be introduced simultaneously to the primary dielectric through the inlet to create a hybrid coating or introduced one after the other to get a layered coating.

In some embodiments, the primary dielectric tube could be made of any dielectric material not limited to ceramic, inorganic materials, including alumina, quartz, teflon, silica, Macor, aluminum oxide, or a combination thereof.

Described herein are methods for direct write dry printing of optical and plasmonic materials using atmospheric pressure plasma jet, in which the material properties that are tuned using gaseous plasma and a mixture of precursors and gas mixtures in the plasma print head, to fabricate photonics and hybrid electronic photonic devices In some embodiments, the plasma jet apparatus comprises a plasma print head, wherein the plasma print head comprises: a dielectric tube whose one end is connected directly to an atomizer or nebulizer placed in close proximity through an inlet manifold and the second end connected to a nozzle, wherein, two or more electrodes disposed over the outer side of the dielectric and connected to a shielded high voltage cable and power supply to generate plasma discharge inside the primary dielectric tube; a nebulizer connected to one or more than on liquid precursor source containing the polymeric and or plasmonic optical materials to be printed, attached directly to the print head using an inlet manifold connecting one end of the primary dielectric tube; a removable, replaceable and independently movable mask connected to a piezo motor placed at the outlet of the nozzle such that the materials coming out of the dielectric tube is focused by the mask to the substrate; an enclosure containing a temperature sensor for measuring the temperature of the primary dielectric tube for in-situ monitoring and optimization of the plasma, an electromagnetic interference shielding mesh to prevent electromagnetic interference from the plasma print head to adjacent electronics, provision to place other sensors in close proximity to dielectric tube, wherein the enclosure encloses the dielectric tube, electrodes and high voltage cables, piezo motor with mask, inlet manifold, nebulizer for generating aerosol mist; multiple fluid connection to the print head to introduce materials with similar or varying optical properties and gas into the print head.

The ability to articulate the print head relative to the workpiece (substrate) combined with the ability to modify the size and shape of the print head orifice provides an exceptional level of control over the geometry and cross sectional thickness of the printed material.

The ability to change the direction of the print media such as plasma, gas and material used to print, exiting the print head by substituting the nozzle assembly with a nozzle assembly that has a defined or changeable curvature such that the direction of the print media materials (plasma, gas and material used to print) exiting the print head may be changed relative to the orientation of the print head such that printing may be performed within complex structures that the print head assembly would not be able to access.

In some embodiments, the one or more liquid precursor source containing the monomer or polymer or plasmonic optical materials to be printed are passed through the atomizer or nebulizer present in the print head that generates an aerosol and the aerosol introduced into the plasma zone of the print head along with gas mixtures;

In some embodiments, the volume and the diameter of the aerosolized liquid droplets are controlled by atomizer, wherein the liquid precursor can be a precursor or monomer or polymer or colloid or ink.

In some embodiments, the aerosol mist can be generated by a pneumatic or piezo electric nebulizer. The right nebulizer is chosen depending on the required aerosol droplet size, nature and viscosity of liquids. In some cases, when the atomizer is a piezo electric nebulizer, the operating frequency can be independently controlled such that the droplet size and volume of the aerosol carrying optical materials is optimized for plasma jet printing In some embodiments, the aerosol mist can be generated by a pneumatic or piezo electric nebulizer. The right nebulizer is chosen depending on the required aerosol droplet size, nature and viscosity of liquids. In some cases, when the atomizer is a piezo electric nebulizer, the operating frequency can be independently controlled such that the droplet size and volume of the aerosol carrying optical materials is optimized for plasma jet printing In some embodiments, the plasma jet print head can be used for surface treatments like for example pre-treatment of the surface using atmospheric plasma to create hydrophobic and/or hydrophilic surfaces, or for post treatment using atmospheric plasma with selective gas ratios to etch or cure or act as a UV source or to create morphology change on the surface.

In some embodiments, the mask attached to the plasma jet print head device may be moved independent of the print head. In some cases, the mask attached to the plasma jet print head device may be moved in combination with the print head using a piezo motor to draw one or more patterns of materials on to the substrate either by printing, plasma etching, plasma curing, or a combination thereof, of materials.

In some embodiments, the plasma print head assembly can be used in any of the possible combinations, for printing single or multi layered optical materials: aerosol jet printing of one layer and plasma jet printing of subsequent layers or vice-versa; plasma jet printing of one or more than one layer; plasma treatment of the surface before, during and after printing for any of the reasons including activation, adhesion, printing, polymerization or etching or curing of optical materials.

Described herein is a method for manufacturing active polymer photonic devices comprising: printing a first cladding layer on the substrate using plasma jet print head; imprinting the first cladding layer; printing a core layer on the imprinted first cladding layer using plasma jet print head and printing a second cladding layer on the core layer using the plasma jet print head, plasma jet printing of an electrode on the cladding layer, wherein, the plasma can be used to pretreat, print and post treat the surface and the materials printed to achieve any of the following including activation, adhesion, printing, curing, UV source, etching, polymerization, doping, tuning of optical properties including refractive index etc.

Described herein is a method for manufacturing optical waveguides comprising: printing a first cladding layer on the substrate using plasma jet print head, imprinting the first cladding layer; printing a core layer on the imprinted first cladding layer using plasma jet print head and printing a second cladding layer on the core layer using the plasma jet print head wherein, the plasma can be used to pre-treat, print and post treat the surface and the materials printed to achieve any of the following including activation, adhesion, printing, curing, UV source, etching, polymerization, doping, tuning of optical properties including refractive index etc. In some cases, the plasma jet printing can be used for selectively coating any one or more layers of the optical waveguides.

Described herein is a method for manufacturing optical waveguides comprising: printing a first cladding layer on the substrate using plasma jet print head; imprinting the first cladding layer; printing a core layer on the imprinted first cladding layer using plasma jet print head, printing a second cladding layer on the core layer using the plasma jet print head; printing an electrode connected either to the first cladding layer or to second cladding layer or to both the cladding layers; wherein, the plasma can be used to pre-treat, print and post-treat the surface and the materials printed to achieve any of the following including activation, adhesion, printing, curing, UV source, etching, polymerization, doping, tuning of optical properties including refractive index etc., wherein, the plasma jet printing can be used for selectively coating any one or more than one layers of the optical waveguides and also the electrically conducting electrodes.

In some cases, the material used for printing cladding and core are made of liquid polymers or organo silane or siloxanes, wherein said optical element forming material is selected from the polymer liquid group consisting of UV-curable adhesives, UV-curable resins, glasses, amorphous polytetrafluoroethylene, translucent polymers, solvenated polymers, PMMA, poly styrene, polyimide, tetra ethyl oath silicate, hexamethyl disiloxane, hexamethyldisilazane, polymers containing laser dyes, sol-gel materials, optical waxes, optical epoxies, optical polymers, silicon dioxide, polyimide, polynorbornenes, benzocyclobutene, and PTFE and by using silicon based polymeric dielectric hydrogen silsesquioxane (HSQ) and methylsilsesquioxane (MSQ).

In some cases, the refractive index of core material is higher than the refractive index of the cladding. In some cases, the optical materials and photonics devices are cladded multimode waveguides and wherein the optical materials having a first index of refraction are printed from said printing device to said substrate and second optical material forming a core with a second index of refraction which is higher than the cladding are printed from said plasma jet printing device to said substrate In some cases, the polymer-based waveguide device as described herein comprises a substrate is made of a material selected from a group comprising silicon single crystal, silicon polycrystal, lithium niobate single crystal, quartz, optical glass and optical plastic. Optical polymers can generally be grouped into classes such as thermoplastics, thermosets or photopolymers, to name a few.

In some embodiments, the silicon dioxide dielectric strength (K) can be changed by introducing carbon- or fluorine-based source for printing silicon dioxide with low K and introducing nitrogen for high K dielectric film by controlling the plasma process parameters; printing of low K dielectric can be achieved by using polymers including polyimide, polynorbornenes, benzocyclobutene, and PTFE and by using silicon based polymeric dielectric hydrogen silsesquioxane (HSQ) and methylsilsesquioxane (MSQ); printing of high K dielectric can be achieved by using oxynitride and by introducing nitrogen in the silicon di oxide.

In some cases, a silicon dioxide coating can be doped using B, P, Al, Ga, As, Sb or combinations thereof using plasma process parameters.

In some cases, the precursor and gas flow rates individually can be from 5 standard cubic centimeter per minute (SCCM) to 5,000 sccm. In some cases, the power used to generate the plasma can vary from 1 Watts to 100 Watts. In some cases, the power supply used for generating the plasma discharge comprises any one or a combination of DC, pulsed DC, AC, microwave and RF. In some cases, the working distance between the plasma print head and the substrate can vary from 1 millimeter to 5 centimeters.

In some cases, the primary gas used to generate plasma discharge can be from any of the gases comprising inert gases, helium, argon, nitrogen, hydrogen, oxygen, sulphur hexafluoride, air, mixture of inert and reactive gases.

In some cases, the thickness of the film that can be printed using plasma jet printing can vary from 1 nm to 1 centimeter or more depending on the need.

In some cases, the printing resolution or the line width can vary from 100 nanometers to 5 centimeters. For large area coating, the print head can be rastered.

In some embodiments, the waveguide is made up only of an optical core. In other embodiments, the waveguide is made up of an optical core, and one or more optical cladding layers In one embodiment, the refractive index of the bottom cladding layer is substantially equal to the refractive index of the top cladding layer.

The core material in the core region may be in the solid phase or the gas phase. For example, the core material may be a solid polymer such as polyethylene, polypropylene, polytetrafluoroethylene (PTFE), or the like. Alternatively, the core material may be one or more gases, such as air. Air has a low dielectric strength of approximately 1.0.

One or more patterns can be printed on a substrate. The one or more patterns can be a single layer or can be multilayered. The pattern can be directly printed on the devices or attached to other devices (optical or non-optical), or elements of devices (e.g., electrodes).

In some embodiments, the materials that can be printed includes two dimensional materials such as graphene, silicone, and germanene, dichalcogenides (MX2), hexagonal boron nitride (hBN), phosphorene, silicene, oxides, graphene oxide and reduced graphene oxide multilayers.

In some cases, the material used for printing electrodes is at least one of, a metal, a conductive polymer, organic electronic materials, a conductive metal oxide, carbon nanotubes, and graphene.

In some cases, the material used for printing electrodes can be a colloid containing metal or metal oxide and the plasma jet printing process can be used to tailor the oxidation state and electronic structure of the metal or metal oxide to print a high quality conducting electrode on the said surface. Metals such as gold, silver, platinum, copper, and alloys, and conductive materials such carbon black, conductive epoxy, or indium-tin-oxide (ITO), can also be used.

In some cases, the plasmonic materials can be any of the following: gold, silver, aluminum, magnesium, graphene, metamaterials, quantum dots, lead sulphide, or a combination thereof.

In some cases, the printed plasmonic structures absorb specific wavelengths depending its density of packing, film thickness, nature of material and on a nearby refractive index, all of which can be controlled by plasma process parameters.

In some cases, the printed plasmonic materials can be used to create localized surface plasmon polarity and surface plasmon resonance. In some cases, the printed plasmonic materials can be used for coupling photonics and plasmon waveguides, color change application, displays, optical packaging etc.

Another aspect of the invention is a fluid delivery assembly for introducing aerosols into the print head for plasma jet printing.

In some cases, to print materials using a plasma jet printer, the one or more materials to be printed are aerosolized and introduced into the plasma jet print head. In some embodiments, the one or more aerosolized materials interact with plasma within the plasma jet print. After interacting with the plasma, the one or more aerosolized materials are directed towards the one or more substrates to be printed.

In order to increase the efficiency and reliability of printing, several characteristics of the aerosolized particles may need to be controlled efficiently. In some cases, the characteristics of the aerosolized particles to be controlled may include the density, the flow rate, the droplet size, the atomization rate, the size distribution, or a combination thereof.

To aerosolize the one or more materials, one or more atomizers can be placed close to the plasma jet print head using a modular fluid delivery assembly. In some cases, the modular fluid assembly can be attached to the plasma jet print head. In some cases, the modular fluid assembly can be detached to the plasma jet print head.

There are at least two major issues in aerosol assisted plasma jet printing when the atomizer is placed close to the print head: (1) the electrical arcing between the electrodes in the plasma jet print head used to generate the plasma and the metallic component of the atomizer placed near the electrode. This electrical arcing will damage the atomizer and also not result in stable plasma in print head. This will result in no or very poor printing; and (2) a gas supply introduced to carry the aerosol and generate the plasma having a direct impact on the aerosol and completely displacing the aerosol towards the wall, when the gas flow comes in direct contact with the aerosol, resulting in loss of aerosolized materials to the wall of the assembly. When this happens, there will not be any printing as the materials will be lost to inner surface of the dielectric tube or spacer.

Described herein is a modular fluid delivery assembly is designed for efficient delivery of aerosolized ink to a plasma jet print head described herein for plasma jet printing. The modular fluid delivery assembly is designed in such a way to avoid arcing between the metallic atomizer and the electrode of the print head. In addition, the fluid delivery assembly provided herein efficiently carries the aerosolized material, the aerosol, to the print head without the aerosol getting displaced towards the wall and without the mist of the aerosol getting quenched.

In some embodiments, the fluid delivery assembly comprises of an ink reservoir. In some embodiments, the volume of the ink reservoir is about 100 cubic mm to about 10,000 cubic mm. In some embodiments, the volume of the ink reservoir is at least about 100 cubic mm. In some embodiments, the volume of the ink reservoir is at most about 10,000 cubic mm. In some embodiments, the volume of the ink reservoir is about 100 cubic mm to about 500 cubic mm, about 100 cubic mm to about 1,000 cubic mm, about 100 cubic mm to about 2,000 cubic mm, about 100 cubic mm to about 3,000 cubic mm, about 100 cubic mm to about 4,000 cubic mm, about 100 cubic mm to about 5,000 cubic mm, about 100 cubic mm to about 6,000 cubic mm, about 100 cubic mm to about 7,000 cubic mm, about 100 cubic mm to about 8,000 cubic mm, about 100 cubic mm to about 9,000 cubic mm, about 100 cubic mm to about 10,000 cubic mm, about 500 cubic mm to about 1,000 cubic mm, about 500 cubic mm to about 2,000 cubic mm, about 500 cubic mm to about 3,000 cubic mm, about 500 cubic mm to about 4,000 cubic mm, about 500 cubic mm to about 5,000 cubic mm, about 500 cubic mm to about 6,000 cubic mm, about 500 cubic mm to about 7,000 cubic mm, about 500 cubic mm to about 8,000 cubic mm, about 500 cubic mm to about 9,000 cubic mm, about 500 cubic mm to about 10,000 cubic mm, about 1,000 cubic mm to about 2,000 cubic mm, about 1,000 cubic mm to about 3,000 cubic mm, about 1,000 cubic mm to about 4,000 cubic mm, about 1,000 cubic mm to about 5,000 cubic mm, about 1,000 cubic mm to about 6,000 cubic mm, about 1,000 cubic mm to about 7,000 cubic mm, about 1,000 cubic mm to about 8,000 cubic mm, about 1,000 cubic mm to about 9,000 cubic mm, about 1,000 cubic mm to about 10,000 cubic mm, about 2,000 cubic mm to about 3,000 cubic mm, about 2,000 cubic mm to about 4,000 cubic mm, about 2,000 cubic mm to about 5,000 cubic mm, about 2,000 cubic mm to about 6,000 cubic mm, about 2,000 cubic mm to about 7,000 cubic mm, about 2,000 cubic mm to about 8,000 cubic mm, about 2,000 cubic mm to about 9,000 cubic mm, about 2,000 cubic mm to about 10,000 cubic mm, about 3,000 cubic mm to about 4,000 cubic mm, about 3,000 cubic mm to about 5,000 cubic mm, about 3,000 cubic mm to about 6,000 cubic mm, about 3,000 cubic mm to about 7,000 cubic mm, about 3,000 cubic mm to about 8,000 cubic mm, about 3,000 cubic mm to about 9,000 cubic mm, about 3,000 cubic mm to about 10,000 cubic mm, about 4,000 cubic mm to about 5,000 cubic mm, about 4,000 cubic mm to about 6,000 cubic mm, about 4,000 cubic mm to about 7,000 cubic mm, about 4,000 cubic mm to about 8,000 cubic mm, about 4,000 cubic mm to about 9,000 cubic mm, about 4,000 cubic mm to about 10,000 cubic mm, about 5,000 cubic mm to about 6,000 cubic mm, about 5,000 cubic mm to about 7,000 cubic mm, about 5,000 cubic mm to about 8,000 cubic mm, about 5,000 cubic mm to about 9,000 cubic mm, about 5,000 cubic mm to about 10,000 cubic mm, about 6,000 cubic mm to about 7,000 cubic mm, about 6,000 cubic mm to about 8,000 cubic mm, about 6,000 cubic mm to about 9,000 cubic mm, about 6,000 cubic mm to about 10,000 cubic mm, about 7,000 cubic mm to about 8,000 cubic mm, about 7,000 cubic mm to about 9,000 cubic mm, about 7,000 cubic mm to about 10,000 cubic mm, about 8,000 cubic mm to about 9,000 cubic mm, about 8,000 cubic mm to about 10,000 cubic mm, or about 9,000 cubic mm to about 10,000 cubic mm. In some embodiments, the volume of the ink reservoir is about 100 cubic mm, about 500 cubic mm, about 1,000 cubic mm, about 2,000 cubic mm, about 3,000 cubic mm, about 4,000 cubic mm, about 5,000 cubic mm, about 6,000 cubic mm, about 7,000 cubic mm, about 8,000 cubic mm, about 9,000 cubic mm, or about 10,000 cubic mm.

In some embodiments, the fluid delivery assembly further comprises an atomizer, one or more fluid inlets, a gas inlet, a lip and a dielectric spacer.

In some cases, the atomizer comprises a piezoelectric vibrator, a transducer, or a combination. The atomizer can generate an aerosol when a liquid comes in direct contact with the atomizer.

In some cases, a perforated plate is placed inside the ink reservoir. The perforated plate can allow the aerosol to exit towards the print head on the other side of the ink reservoir.

In some embodiments, the fluid delivery assembly can be a stand-alone module with pre-filled ink cartridge. In those cases, the fluid delivery assembly and/or the cartridge case can be replaced once the ink is finished.

In some embodiments, the fluid delivery assembly can also be used for continuous feeding of ink into ink reservoir and to the print head through a liquid inlet and outlet on top of the reservoir. The liquid inlet and outlet helps re-circulate the ink while the atomizer at the bottom of the reservoir continuously aerosolizes the ink. The aerosol is then directed to the plasma jet print head using a gas inlet placed below the atomizer and at the side of the assembly.

In some cases, the gas inlet is located at the bottom of the atomizer and to the side, so that the gas can carry the aerosol to the print head. To generate plasma, the gas flow rate can vary from 50 sccm to 5000 sccm. In some embodiments, the gas flow rate is about 50 sccm to about 5,000 sccm. In some embodiments, the gas flow rate is at least about 50 sccm. In some embodiments, the gas flow rate is at most about 5,000 sccm. In some embodiments, the gas flow rate is about 50 sccm to about 100 sccm, about 50 sccm to about 250 sccm, about 50 sccm to about 500 sccm, about 50 sccm to about 750 sccm, about 50 sccm to about 1,000 sccm, about 50 sccm to about 1,500 sccm, about 50 sccm to about 2,000 sccm, about 50 sccm to about 2,500 sccm, about 50 sccm to about 3,000 sccm, about 50 sccm to about 4,000 sccm, about 50 sccm to about 5,000 sccm, about 100 sccm to about 250 sccm, about 100 sccm to about 500 sccm, about 100 sccm to about 750 sccm, about 100 sccm to about 1,000 sccm, about 100 sccm to about 1,500 sccm, about 100 sccm to about 2,000 sccm, about 100 sccm to about 2,500 sccm, about 100 sccm to about 3,000 sccm, about 100 sccm to about 4,000 sccm, about 100 sccm to about 5,000 sccm, about 250 sccm to about 500 sccm, about 250 sccm to about 750 sccm, about 250 sccm to about 1,000 sccm, about 250 sccm to about 1,500 sccm, about 250 sccm to about 2,000 sccm, about 250 sccm to about 2,500 sccm, about 250 sccm to about 3,000 sccm, about 250 sccm to about 4,000 sccm, about 250 sccm to about 5,000 sccm, about 500 sccm to about 750 sccm, about 500 sccm to about 1,000 sccm, about 500 sccm to about 1,500 sccm, about 500 sccm to about 2,000 sccm, about 500 sccm to about 2,500 sccm, about 500 sccm to about 3,000 sccm, about 500 sccm to about 4,000 sccm, about 500 sccm to about 5,000 sccm, about 750 sccm to about 1,000 sccm, about 750 sccm to about 1,500 sccm, about 750 sccm to about 2,000 sccm, about 750 sccm to about 2,500 sccm, about 750 sccm to about 3,000 sccm, about 750 sccm to about 4,000 sccm, about 750 sccm to about 5,000 sccm, about 1,000 sccm to about 1,500 sccm, about 1,000 sccm to about 2,000 sccm, about 1,000 sccm to about 2,500 sccm, about 1,000 sccm to about 3,000 sccm, about 1,000 sccm to about 4,000 sccm, about 1,000 sccm to about 5,000 sccm, about 1,500 sccm to about 2,000 sccm, about 1,500 sccm to about 2,500 sccm, about 1,500 sccm to about 3,000 sccm, about 1,500 sccm to about 4,000 sccm, about 1,500 sccm to about 5,000 sccm, about 2,000 sccm to about 2,500 sccm, about 2,000 sccm to about 3,000 sccm, about 2,000 sccm to about 4,000 sccm, about 2,000 sccm to about 5,000 sccm, about 2,500 sccm to about 3,000 sccm, about 2,500 sccm to about 4,000 sccm, about 2,500 sccm to about 5,000 sccm, about 3,000 sccm to about 4,000 sccm, about 3,000 sccm to about 5,000 sccm, or about 4,000 sccm to about 5,000 sccm. In some embodiments, the gas flow rate is about 50 sccm, about 100 sccm, about 250 sccm, about 500 sccm, about 750 sccm, about 1,000 sccm, about 1,500 sccm, about 2,000 sccm, about 2,500 sccm, about 3,000 sccm, about 4,000 sccm, or about 5,000 sccm.

In some cases, when the gas is introduced with such flow rate directly from the side, facing the rear side of the atomizer through which the aerosol exits, the aerosol gets displaced by the gas flow towards the wall and the aerosol gets quenched. In order to avoid direct exposure of the gas to the aerosol mist exiting the atomizer, a lip is built at the bottom of the atomizer to prevent direct contact of the gas flow with the aerosol exiting the atomizer. The aerosol is then carried by the gas towards the plasma jet printer, where the materials in the aerosol are accelerated by the plasma towards the substrate. The lip ensures that the gas flow pressure is not directly exerted on to the aerosol exiting the atomizer.

In some embodiments, the length of the lip is about 2 mm to about 100 mm. In some embodiments, the length of the lip is at least about 2 mm. In some embodiments, the length of the lip is at most about 100 mm. In some embodiments, the length of the lip is about 2 mm to about 5 mm, about 2 mm to about 10 mm, about 2 mm to about 20 mm, about 2 mm to about 30 mm, about 2 mm to about 40 mm, about 2 mm to about 50 mm, about 2 mm to about 60 mm, about 2 mm to about 70 mm, about 2 mm to about 80 mm, about 2 mm to about 90 mm, about 2 mm to about 100 mm, about 5 mm to about 10 mm, about 5 mm to about 20 mm, about 5 mm to about 30 mm, about 5 mm to about 40 mm, about 5 mm to about 50 mm, about 5 mm to about 60 mm, about 5 mm to about 70 mm, about 5 mm to about 80 mm, about 5 mm to about 90 mm, about 5 mm to about 100 mm, about 10 mm to about 20 mm, about 10 mm to about 30 mm, about 10 mm to about 40 mm, about 10 mm to about 50 mm, about 10 mm to about 60 mm, about 10 mm to about 70 mm, about 10 mm to about 80 mm, about 10 mm to about 90 mm, about 10 mm to about 100 mm, about 20 mm to about 30 mm, about 20 mm to about 40 mm, about 20 mm to about 50 mm, about 20 mm to about 60 mm, about 20 mm to about 70 mm, about 20 mm to about 80 mm, about 20 mm to about 90 mm, about 20 mm to about 100 mm, about 30 mm to about 40 mm, about 30 mm to about 50 mm, about 30 mm to about 60 mm, about 30 mm to about 70 mm, about 30 mm to about 80 mm, about 30 mm to about 90 mm, about 30 mm to about 100 mm, about 40 mm to about 50 mm, about 40 mm to about 60 mm, about 40 mm to about 70 mm, about 40 mm to about 80 mm, about 40 mm to about 90 mm, about 40 mm to about 100 mm, about 50 mm to about 60 mm, about 50 mm to about 70 mm, about 50 mm to about 80 mm, about 50 mm to about 90 mm, about 50 mm to about 100 mm, about 60 mm to about 70 mm, about 60 mm to about 80 mm, about 60 mm to about 90 mm, about 60 mm to about 100 mm, about 70 mm to about 80 mm, about 70 mm to about 90 mm, about 70 mm to about 100 mm, about 80 mm to about 90 mm, about 80 mm to about 100 mm, or about 90 mm to about 100 mm. In some embodiments, the length of the lip is about 2 mm, about 5 mm, about 10 mm, about 20 mm, about 30 mm, about 40 mm, about 50 mm, about 60 mm, about 70 mm, about 80 mm, about 90 mm, or about 100 mm.

The assembly is designed in such a way that the metallic component of the atomizer including the drilled or perforated plate, and the transducer and/or piezo electric vibrator, is separated from the top electrode of the plasma jet print head by a minimum of 1.2 times the separation distance between the electrodes of the plasma manifold in plasma jet print head.

This separation ensures that there is no arcing between the atomizer and the top electrode of the print head during plasma jet printing. In order to facilitate the separation between the atomizer and the top electrode of the print head, a dielectric spacer may be used to connect the atomizer and the print head. The dielectric spacer is designed in such a way that the inner wall of the dielectric is smooth to avoid the aerosol from getting adsorbed on the inner surface and to help transport the aerosol mist and the gas to the print head. The dielectric spacer can be placed below the lip of the atomizer assembly and close to the gas inlet such that the gas inlet is not blocked by the dielectric spacer. The dielectric spacer can also be used as an inner dielectric tube whose length and shape can be varied such that the tube ends before meeting the electrodes or in between the electrodes or extended beyond the electrodes.

In some embodiments, the diameter of the dielectric spacer is about 1 mm to about 40 mm. In some embodiments, the diameter of the dielectric spacer is at least about 1 mm. In some embodiments, the diameter of the dielectric spacer is at most about 40 mm. In some embodiments, the diameter of the dielectric spacer is about 1 mm to about 5 mm, about 1 mm to about 10 mm, about 1 mm to about 15 mm, about 1 mm to about 20 mm, about 1 mm to about 25 mm, about 1 mm to about 30 mm, about 1 mm to about 35 mm, about 1 mm to about 40 mm, about 5 mm to about 10 mm, about 5 mm to about 15 mm, about 5 mm to about 20 mm, about 5 mm to about 25 mm, about 5 mm to about 30 mm, about 5 mm to about 35 mm, about 5 mm to about 40 mm, about 10 mm to about 15 mm, about 10 mm to about 20 mm, about 10 mm to about 25 mm, about 10 mm to about 30 mm, about 10 mm to about 35 mm, about 10 mm to about 40 mm, about 15 mm to about 20 mm, about 15 mm to about 25 mm, about 15 mm to about 30 mm, about 15 mm to about 35 mm, about 15 mm to about 40 mm, about 20 mm to about 25 mm, about 20 mm to about 30 mm, about 20 mm to about 35 mm, about 20 mm to about 40 mm, about 25 mm to about 30 mm, about 25 mm to about 35 mm, about 25 mm to about 40 mm, about 30 mm to about 35 mm, about 30 mm to about 40 mm, or about 35 mm to about 40 mm. In some embodiments, the diameter of the dielectric spacer is about 1 mm, about 5 mm, about 10 mm, about 15 mm, about 20 mm, about 25 mm, about 30 mm, about 35 mm, or about 40 mm.

In some embodiments, the length of the dielectric spacer is about 5 mm to about 120 mm. In some embodiments, the length of the dielectric spacer is at least about 5 mm. In some embodiments, the length of the dielectric spacer is at most about 120 mm. In some embodiments, the length of the dielectric spacer is about 5 mm to about 10 mm, about 5 mm to about 20 mm, about 5 mm to about 30 mm, about 5 mm to about 40 mm, about 5 mm to about 50 mm, about 5 mm to about 60 mm, about 5 mm to about 70 mm, about 5 mm to about 80 mm, about 5 mm to about 90 mm, about 5 mm to about 100 mm, about 5 mm to about 120 mm, about 10 mm to about 20 mm, about 10 mm to about 30 mm, about 10 mm to about 40 mm, about 10 mm to about 50 mm, about 10 mm to about 60 mm, about 10 mm to about 70 mm, about 10 mm to about 80 mm, about 10 mm to about 90 mm, about 10 mm to about 100 mm, about 10 mm to about 120 mm, about 20 mm to about 30 mm, about 20 mm to about 40 mm, about 20 mm to about 50 mm, about 20 mm to about 60 mm, about 20 mm to about 70 mm, about 20 mm to about 80 mm, about 20 mm to about 90 mm, about 20 mm to about 100 mm, about 20 mm to about 120 mm, about 30 mm to about 40 mm, about 30 mm to about 50 mm, about 30 mm to about 60 mm, about 30 mm to about 70 mm, about 30 mm to about 80 mm, about 30 mm to about 90 mm, about 30 mm to about 100 mm, about 30 mm to about 120 mm, about 40 mm to about 50 mm, about 40 mm to about 60 mm, about 40 mm to about 70 mm, about 40 mm to about 80 mm, about 40 mm to about 90 mm, about 40 mm to about 100 mm, about 40 mm to about 120 mm, about 50 mm to about 60 mm, about 50 mm to about 70 mm, about 50 mm to about 80 mm, about 50 mm to about 90 mm, about 50 mm to about 100 mm, about 50 mm to about 120 mm, about 60 mm to about 70 mm, about 60 mm to about 80 mm, about 60 mm to about 90 mm, about 60 mm to about 100 mm, about 60 mm to about 120 mm, about 70 mm to about 80 mm, about 70 mm to about 90 mm, about 70 mm to about 100 mm, about 70 mm to about 120 mm, about 80 mm to about 90 mm, about 80 mm to about 100 mm, about 80 mm to about 120 mm, about 90 mm to about 100 mm, about 90 mm to about 120 mm, or about 100 mm to about 120 mm. In some embodiments, the length of the dielectric spacer is about 5 mm, about 10 mm, about 20 mm, about 30 mm, about 40 mm, about 50 mm, about 60 mm, about 70 mm, about 80 mm, about 90 mm, about 100 mm, or about 120 mm.

The atomizer assembly design can also be changed so that the atomizer is placed at the side of the assembly and the gas introduced from the top. Also more than one atomizers and reservoir unit combinations can be attached to the atomizer assembly and connected on the top side of the dielectric spacer. The gas inlet can be introduced from top and more than one atomizer and reservoir units connected at the side of the assembly can introduce multiple materials from the inks/aerosols into the inner portion of the assembly and all the aerosols from multiple reservoirs/atomizers carried into the plasma jet print head through the dielectric spacer. This will allow multi-materials and hybrid coatings to be printed. The composition of the printed material can be precisely controlled by individually controlling the fluid delivery from each atomizer/reservoir combination.

The atomizer assembly comprises a dielectric material to avoid plasma arcing between atomizer and electrode. An operating frequency range of the atomizer can vary to create aerosols comprising different materials. The aerosols can comprise droplets of various sizes. The aerosols to be printed and atomizers with different frequency ranges can be used to aerosolize and deliver appropriate quantity and droplet size of the aerosol to the plasma region of the print head. Atomizers of various types including mesh nebulizer, ultrasonic nebulizer, or a combination thereof can be used.

In some embodiments, the operating frequency is about 0.05 MHz to about 10 MHz. In some embodiments, the operating frequency is at least about 0.05 MHz. In some embodiments, the operating frequency is at most about 10 MHz. In some embodiments, the operating frequency is about 0.05 MHz to about 0.5 MHz, about 0.05 MHz to about 1 MHz, about 0.05 MHz to about 2 MHz, about 0.05 MHz to about 3 MHz, about 0.05 MHz to about 4 MHz, about 0.05 MHz to about 5 MHz, about 0.05 MHz to about 6 MHz, about 0.05 MHz to about 7 MHz, about 0.05 MHz to about 8 MHz, about 0.05 MHz to about 9 MHz, about 0.05 MHz to about 10 MHz, about 0.5 MHz to about 1 MHz, about 0.5 MHz to about 2 MHz, about 0.5 MHz to about 3 MHz, about 0.5 MHz to about 4 MHz, about 0.5 MHz to about 5 MHz, about 0.5 MHz to about 6 MHz, about 0.5 MHz to about 7 MHz, about 0.5 MHz to about 8 MHz, about 0.5 MHz to about 9 MHz, about 0.5 MHz to about 10 MHz, about 1 MHz to about 2 MHz, about 1 MHz to about 3 MHz, about 1 MHz to about 4 MHz, about 1 MHz to about 5 MHz, about 1 MHz to about 6 MHz, about 1 MHz to about 7 MHz, about 1 MHz to about 8 MHz, about 1 MHz to about 9 MHz, about 1 MHz to about 10 MHz, about 2 MHz to about 3 MHz, about 2 MHz to about 4 MHz, about 2 MHz to about 5 MHz, about 2 MHz to about 6 MHz, about 2 MHz to about 7 MHz, about 2 MHz to about 8 MHz, about 2 MHz to about 9 MHz, about 2 MHz to about 10 MHz, about 3 MHz to about 4 MHz, about 3 MHz to about 5 MHz, about 3 MHz to about 6 MHz, about 3 MHz to about 7 MHz, about 3 MHz to about 8 MHz, about 3 MHz to about 9 MHz, about 3 MHz to about 10 MHz, about 4 MHz to about 5 MHz, about 4 MHz to about 6 MHz, about 4 MHz to about 7 MHz, about 4 MHz to about 8 MHz, about 4 MHz to about 9 MHz, about 4 MHz to about 10 MHz, about 5 MHz to about 6 MHz, about 5 MHz to about 7 MHz, about 5 MHz to about 8 MHz, about 5 MHz to about 9 MHz, about 5 MHz to about 10 MHz, about 6 MHz to about 7 MHz, about 6 MHz to about 8 MHz, about 6 MHz to about 9 MHz, about 6 MHz to about 10 MHz, about 7 MHz to about 8 MHz, about 7 MHz to about 9 MHz, about 7 MHz to about 10 MHz, about 8 MHz to about 9 MHz, about 8 MHz to about 10 MHz, or about 9 MHz to about 10 MHz. In some embodiments, the operating frequency is about 0.05 MHz, about 0.5 MHz, about 1 MHz, about 2 MHz, about 3 MHz, about 4 MHz, about 5 MHz, about 6 MHz, about 7 MHz, about 8 MHz, about 9 MHz, or about 10 MHz.

The replaceable atomizer unit has provision for controlling the flow rate of aerosol in to the plasma jet print head without causing electrical arc between the electrodes in the print head and the atomizer.

In some cases, the replaceable atomizer unit comprises a piezo electric atomizer or transducer. In some cases, the atomizer comprises a plurality of pores in a mesh whose frequency and pore size can be controlled. Atomizers with varying vibrating frequency and pore sizes can be chosen for a range of fluids such as organic fluids, nano-colloids, metallic nano-colloids, inorganic nano-colloids. In some cases, an atomizer assembly can be created for each class of materials and/or colloids with varying particle size.

The surface energy of the atomizer can be tuned with hydrophobic coating to prevent clogging of the pores and settling of materials on the atomizer.

The fluid delivery assembly allows for the attachment of more than one cartridges; such a configuration can introduce two or more inks, liquid precursors, chemical reagents, or a combination, into the print head in the form of one or more aerosols.

The fluid delivery assembly described herein comprising two or more cartridges can enable multi-material printing, multi-layered printing, hybrid coating, polymerization, the introduction of two or more inks or chemical reagents into the print head, or a combination thereof.

FIG. 27 shows a modular design of plasma jet print head comprising a fluid delivery assembly. In this exemplary embodiment, the fluid delivery assembly 510 comprises a cartridge 500. In some embodiments, the cartridge 500 can be mounted on top of a coupler 508. In some cases, the coupler 508 is connected to a plasma manifold 200 of the plasma jet print head.

In some embodiments, the cartridge 500 comprises of an ink reservoir 502 with an inlet 503 and an outlet 504, as shown in FIG. 1. In some cases, the inlet 503 and the outlet 504 are connected to an external tank (not shown in FIG. 27). The external tank allocates ink supply from an external tank to the ink reservoir via the inlet and outlet. In some cases, the ink is recycled back to the tank from the reservoir.

In some embodiments, the inlet 503 and the outlet 504 of the cartridge 500 can be sealed after the ink reservoir is completely filled. In those cases, the cartridge 500 containing the atomizer can be used as a replaceable sealed cartridge.

In some embodiments, an atomizer 501 is located at the bottom of the ink reservoir. In some cases, the atomizer 501 comprises a piezoelectric component, a transducer, a vibrating mesh, or a combination thereof. The atomizer can be independently controlled, using a battery or an electrical input. The atomizer is used to generate an aerosol of any liquid that comes into contact with it.

In some embodiments, the characteristics of the atomizer can be varied depending on the application. In some cases, the atomizer 501 comprises a piezoelectric device that generates aerosol of the ink when it comes in contact with the piezo material.

In some cases, the atomizer 501 comprises a vibrating mesh with a frequency of about 0.05 MHz to about 10 MHz. In some cases, the frequency is about 0.05 MHz to about 10 MHz. In some cases, the frequency is at least about 0.05 MHz. In some cases, the frequency is at most about 10 MHz. In some cases, the frequency is about 0.05 MHz to about 0.1 MHz, about 0.05 MHz to about 0.5 MHz, about 0.05 MHz to about 1 MHz, about 0.05 MHz to about 5 MHz, about 0.05 MHz to about 10 MHz, about 0.1 MHz to about 0.5 MHz, about 0.1 MHz to about 1 MHz, about 0.1 MHz to about 5 MHz, about 0.1 MHz to about 10 MHz, about 0.5 MHz to about 1 MHz, about 0.5 MHz to about 5 MHz, about 0.5 MHz to about 10 MHz, about 1 MHz to about 5 MHz, about 1 MHz to about 10 MHz, or about 5 MHz to about 10 MHz. In some cases, the frequency is about 0.05 MHz, about 0.1 MHz, about 0.5 MHz, about 1 MHz, about 5 MHz, or about 10 MHz.

In some embodiments, the atomizer 501 generates an aerosol mist with a plurality of droplets. In some embodiments, the size of the droplets in the plurality of droplets is about 1 μm to about 20 μm. In some embodiments, the size of the droplets in the plurality of droplets is at least about 1 μm. In some embodiments, the size of the droplets in the plurality of droplets is at most about 20 μm. In some embodiments, the size of the droplets in the plurality of droplets is about 1 μm to about 5 μm, about 1 μm to about 10 μm, about 1 μm to about 15 μm, about 1 μm to about 20 μm, about 5 μm to about 10 μm, about 5 μm to about 15 μm, about 5 μm to about 20 μm, about 10 μm to about 15 μm, about 10 μm to about 20 μm, or about 15 μm to about 20 μm. In some embodiments, the size of the droplets in the plurality of droplets is about 1 μm, about 5 μm, about 10 μm, about 15 μm, or about 20 μm.

In some cases, the atomizer 501 is placed on a perforated plate. The perforated plate allows the aerosol to exit on the other side of the ink reservoir. The hole diameter (not shown in figure) of the perforated plate (not shown in figure) can be chosen depending on the nature and type of ink and the particle size of the nano- and/or micron-sized materials dispersed in the ink and also on the size of aerosol droplet required for plasma jet printing.

In some cases, the amplitude of vibration of the atomizer, the atomization rate of the atomizer, or both, can be independently controlled using a voltage source. In some cases, the voltage source can be controlled using software. By varying the amplitude of vibration, the number of aerosols generated per minute can be controlled and by changing the frequency of vibration, the aerosol particle size distribution can be precisely controlled.

In some embodiments, the atomizer 501 can be removed and replaced. This modular design enables reuse of the fluid delivery assembly 510 and cartridge 500 with different types of atomizers. The different atomizers may vary in frequency range, amplitude range, diameter of the hole, or a combination thereof.

In some embodiments, a gas inlet 505 is located below the atomizer mesh to carry the aerosol to the print head for printing.

In some embodiments, the cartridge delivers aerosolized ink to the plasma jet print head. In some cases, a lip 506 is located at the bottom of the cartridge 500 below the atomizer 501. The lip 506 aids in downward flow of aerosolized ink into the plasma manifold of the print head. The lip assists in the prevention of direct contact of the aerosolized ink with the gas flow from the gas inlet 505. When the gas flow is introduced directly without a loop, the gas flow will face the aerosol with a high flow rate that displaces the wall of the print head, and quenches the aerosol.

In some embodiments, the gas flow rate is about 50 sccm to about 5,000 sccm. In some embodiments, the gas flow rate is at least about 50 sccm. In some embodiments, the gas flow rate is at most about 5,000 sccm. In some embodiments, the gas flow rate is about 50 sccm to about 100 sccm, about 50 sccm to about 250 sccm, about 50 sccm to about 500 sccm, about 50 sccm to about 1,000 sccm, about 50 sccm to about 2,000 sccm, about 50 sccm to about 3,000 sccm, about 50 sccm to about 4,000 sccm, about 50 sccm to about 5,000 sccm, about 100 sccm to about 250 sccm, about 100 sccm to about 500 sccm, about 100 sccm to about 1,000 sccm, about 100 sccm to about 2,000 sccm, about 100 sccm to about 3,000 sccm, about 100 sccm to about 4,000 sccm, about 100 sccm to about 5,000 sccm, about 250 sccm to about 500 sccm, about 250 sccm to about 1,000 sccm, about 250 sccm to about 2,000 sccm, about 250 sccm to about 3,000 sccm, about 250 sccm to about 4,000 sccm, about 250 sccm to about 5,000 sccm, about 500 sccm to about 1,000 sccm, about 500 sccm to about 2,000 sccm, about 500 sccm to about 3,000 sccm, about 500 sccm to about 4,000 sccm, about 500 sccm to about 5,000 sccm, about 1,000 sccm to about 2,000 sccm, about 1,000 sccm to about 3,000 sccm, about 1,000 sccm to about 4,000 sccm, about 1,000 sccm to about 5,000 sccm, about 2,000 sccm to about 3,000 sccm, about 2,000 sccm to about 4,000 sccm, about 2,000 sccm to about 5,000 sccm, about 3,000 sccm to about 4,000 sccm, about 3,000 sccm to about 5,000 sccm, or about 4,000 sccm to about 5,000 sccm. In some embodiments, the gas flow rate is about 50 sccm, about 100 sccm, about 250 sccm, about 500 sccm, about 1,000 sccm, about 2,000 sccm, about 3,000 sccm, about 4,000 sccm, or about 5,000 sccm.

In some embodiments, the cartridge 500 is connected to the plasma manifold 200 of the print head through a dielectric spacer 507. In some cases, the dielectric spacer 507 is placed inside the coupler assembly 508. A purpose of the dielectric spacer 507 is to carry the aerosol into the plasma manifold 200. Another purpose is to prevent electrical arcing between an electrode 221 in the plasma manifold and the atomizer 501 both of which comprise a metal capable of conducting electrons.

In some embodiments, a high voltage can be applied to at least two electrodes 221 and 231 to generate plasma. If there is a directly exposed metallic surface closer to any electrode such as electrode 221, this can result in electrical arcing and/or suppress the plasma generated between the electrodes 221 and 231. In order to prevent arcing between metal-containing atomizer 501 and electrode 221, they both need to be separated by a dielectric spacer 507. The dielectric spacer length should be larger than the distance between the electrodes, such as the distance between electrode 221 and electrode 231 in the plasma manifold 200. An objective of the spacer 507 is to prevent electrical arcing between the top electrode 221 of the plasma manifold and any metallic portion of the cartridge such at the metal-containing atomizer 501. In some cases, the dielectric spacer 507 may have a smooth inner surface to prevent adsorption of aerosolized ink onto the inner surface resulting in any loss of aerosolized ink to the walls of the spacer.

In some embodiments, the distance between the first electrode and the second electrode is about 5 mm to about 40 mm. In some embodiments, the distance between the first electrode and the second electrode is at least about 5 mm. In some embodiments, the distance between the first electrode and the second electrode is at most about 40 mm. In some embodiments, the distance between the first electrode and the second electrode is about 5 mm to about 10 mm, about 5 mm to about 15 mm, about 5 mm to about 20 mm, about 5 mm to about 25 mm, about 5 mm to about 30 mm, about 5 mm to about 35 mm, about 5 mm to about 40 mm, about 10 mm to about 15 mm, about 10 mm to about 20 mm, about 10 mm to about 25 mm, about 10 mm to about 30 mm, about 10 mm to about 35 mm, about 10 mm to about 40 mm, about 15 mm to about 20 mm, about 15 mm to about 25 mm, about 15 mm to about 30 mm, about 15 mm to about 35 mm, about 15 mm to about 40 mm, about 20 mm to about 25 mm, about 20 mm to about 30 mm, about 20 mm to about 35 mm, about 20 mm to about 40 mm, about 25 mm to about 30 mm, about 25 mm to about 35 mm, about 25 mm to about 40 mm, about 30 mm to about 35 mm, about 30 mm to about 40 mm, or about 35 mm to about 40 mm. In some embodiments, the distance between the first electrode and the second electrode is about 5 mm, about 10 mm, about 15 mm, about 20 mm, about 25 mm, about 30 mm, about 35 mm, or about 40 mm.

In some embodiments, the distance between the electrodes is about 1 mm to about 180 mm. In some embodiments, the distance between the electrodes is at least about 1 mm. In some embodiments, the distance between the electrodes is at most about 180 mm. In some embodiments, the distance between the electrodes is about 1 mm to about 10 mm, about 1 mm to about 25 mm, about 1 mm to about 50 mm, about 1 mm to about 75 mm, about 1 mm to about 100 mm, about 1 mm to about 125 mm, about 1 mm to about 150 mm, about 1 mm to about 180 mm, about 10 mm to about 25 mm, about 10 mm to about 50 mm, about 10 mm to about 75 mm, about 10 mm to about 100 mm, about 10 mm to about 125 mm, about 10 mm to about 150 mm, about 10 mm to about 180 mm, about 25 mm to about 50 mm, about 25 mm to about 75 mm, about 25 mm to about 100 mm, about 25 mm to about 125 mm, about 25 mm to about 150 mm, about 25 mm to about 180 mm, about 50 mm to about 75 mm, about 50 mm to about 100 mm, about 50 mm to about 125 mm, about 50 mm to about 150 mm, about 50 mm to about 180 mm, about 75 mm to about 100 mm, about 75 mm to about 125 mm, about 75 mm to about 150 mm, about 75 mm to about 180 mm, about 100 mm to about 125 mm, about 100 mm to about 150 mm, about 100 mm to about 180 mm, about 125 mm to about 150 mm, about 125 mm to about 180 mm, or about 150 mm to about 180 mm. In some embodiments, the distance between the electrodes is about 1 mm, about 10 mm, about 25 mm, about 50 mm, about 75 mm, about 100 mm, about 125 mm, about 150 mm, or about 180 mm.

In some embodiments, the electrodes 221 and 231 are connected to an external high voltage power supply. In some cases, the electrodes 221 and 231 can be dispersed on the outer surface of the primary dielectric tube 210. Plasma is generated in the primary dielectric tube 210 upon introduction of gas and high voltage potential. The gas inlet 505 can be one, or more than one (not shown), to allow for tuning of one or more material properties. For example, hydrogen can be introduced in addition to helium or argon to reduce copper oxide while printing copper and for example, oxygen can be introduced in addition to helium or argon to polymerize the hexamethyldisiloxane or tetraethyl orthosilicate, for printing silicon dioxide.

FIG. 28 provides an exemplary fluid delivery assembly 510 comprising a cartridge 500. In this exemplary embodiment, the cartridge 500 comprises an atomizer 501, an ink reservoir 502, at least two of a liquid inlet and/or outlet, such as inlet and/or outlet 503 and 504, a gas inlet 505, a lip 506, and a spacer 507.

In this exemplary embodiment, the fluid delivery module can be detached into two separate portions: (a) coupler assembly 508 comprising a dielectric spacer 507, and gas inlet 505; and (b) a cartridge 500 comprising an ink reservoir 502, an atomizer 501, one or more fluid inlet and/or outlet 503 and 504, and a lip 506.

FIG. 29 provides an exemplary multi-material fluid delivery system with two cartridges 600a and 600b. Both cartridges can be mounted in a fluid delivery assembly 610. Each cartridge 600a and 600b comprises an ink reservoir, 602a and 602b, respectively, and also comprises an atomizer 601a and 601b, respectively.

A gas inlet 605a can be a single inlet. In some cases, another gas inlet (not shown) can also be introduced. Each cartridge comprises a fluid inlet 603a and 603b, respectively; and comprises a fluid outlet 604a and 604b, respectively.

In some cases, each cartridge comprises a lip 606a and 606b. In some cases, both cartridges can either be mounted to a single coupler 608 with a single dielectric spacer 607. In some cases, the second cartridge 600b can be mounted on the primary cartridge 600a.

The entire multi material fluid delivery assembly 610 can be connected to plasma manifold 200 of the plasma jet print head in a leak tight manner.

FIG. 30 shows a fluid delivery assembly with a cartridge mounted vertically on a coupler. The fluid delivery assembly 710 comprises a cartridge 700. In this exemplary embodiment, the cartridge 700 comprises an atomizer 701, an ink reservoir 702, at least two liquid inlets and/or outlets 703 and 704, a gas inlet 705, a lip 706, and a dielectric spacer 707. In some cases, the fluid delivery module can be detached into two separate portions: (a) a coupler assembly 708 comprising a dielectric spacer 707 and a gas inlet 705; and (b) a cartridge 700 comprising ink reservoir 702, an atomizer 701, a fluid inlet/outlet 703 and 704, and a lip 706.

Provided herein is a fluid delivery system for aerosol assisted plasma jet printing of a variety of materials such as copper, silver, gold, titanium dioxide, silicon dioxide, or a combination thereof. In some cases, the material may have one or more organic functionalities including amine functionalization and carboy functionalization. In some cases, the material comprises a composite such as copper-titanium dioxide. In some cases, the material comprises a hybrid coating like silicon dioxide with gold nanoparticles. The fluid delivery system is a modular system comprising with a cartridge and dielectric spacer that can be assembled and/or dissembled from a plasma jet print head.

In some embodiments, the fluid delivery system comprises an atomizer. In some cases, the atomizer comprises an electrically controllable aerosol generator. In some cases, the atomizer comprises a perforated plate a plurality of holes.

Several properties of the atomizer can be controlled with high precision to achieve printing results of interest. In some cases, the properties can include the size of the holes of the perforated plate, the vibration frequency, the amplitude, the surface energy, or a combination thereof. In some cases, the atomizer can be attached and detached as needed from the plasma print head assembly.

In some embodiments, the fluid delivery system comprises an ink reservoir for storing and delivering ink to the atomizer. After the ink is aerosolized in the atomizer, the aerosolized ink is delivered to a print head.

In some embodiments, the fluid delivery system comprises an atomizer situated at a bottom surface of an ink reservoir.

In some embodiments, the fluid delivery system comprises a gas inlet at a bottom side of an atomizer. In some cases, the gas inlet is located below the atomizer to carry the aerosol from the atomizer into a print head. Within the print head, the aerosol can be used to generate plasma.

In some embodiments, the fluid delivery system comprises a lip. In some cases, the lip is situated at a bottom section of the atomizer assembly. A purpose of the lip is to prevent any aerosol generated from the atomizer from being directly exposed to high pressure gas with a high flow rate from the gas inlet.

In some embodiments, the fluid delivery system comprises a dielectric spacer. In some cases, the dielectric spacer comprises a non-conductive material with smooth inner surface. The dielectric spacer can connect the atomizer assembly to the plasma jet print head.

In some cases, the length of the dielectric spacer is larger than the distance between the at least two electrodes in the plasma jet print head. This prevents arcing between the top electrode of the print head and the metallic atomizer placed in the assembly. In some embodiments, the length of the dielectric spacer cannot be equal to or less than the distance between the two electrodes to avoid arcing between the atomizer and the top electrode.

In some embodiments, the fluid delivery system comprises an ink reservoir. In some cases, the ink reservoir provides a continuous supply of ink to the atomizer and the print head from a large ink storage tank through a liquid inlet and a liquid outlet. The liquid inlet and the liquid outlet may be connected to the top of the ink reservoir.

In some cases, the ink reservoir is large enough to provide pre-loaded ink to the atomizer. In this configuration, the fluid delivery assembly comprises a self-contained enclosed cartridge with pre-loaded ink.

In some embodiments, two or more atomizers can be attached to a dielectric spacer of the fluid delivery assembly. In some embodiments, two or more ink reservoir units can be attached to a dielectric space of the fluid delivery assembly. In those cases, the first atomizer and/or ink reservoir can be attached to the side of the dielectric spacer; and the second atomizer and/or ink reservoir can be attached to the top of the dielectric spacer.

A fluid delivery assembly comprising two or more atomizers and two or more ink reservoirs can be used to introduce two or more aerosols into the plasma jet print head for printing. In some cases, the two or more aerosols comprise the same material. In other cases, the two or more aerosols comprise different materials. A fluid delivery assembly comprising two or more atomizers and two or more ink reservoirs can be used for printing two or more materials in hybrid coatings, composites, polymers, alloys, or a combination using a single print head. In other cases, a fluid delivery assembly comprising two or more atomizers and two or more ink reservoirs can be used for multi-layered printing using a single print head. In some embodiments, the fluid delivery assembly comprises an atomizer, a spacer and a print head all connected in a leak-time manner such that no arcing occurs.

Example

In an exemplary embodiment, copper can be printed on low glass transition temperature plastics such as polyethylene terephthalate and polycarbonate. The print head that can be used in this exemplary embodiment comprises a fluid delivery assembly and a plasma manifold.

The fluid delivery assembly comprises a cartridge. In this exemplary embodiment, the cartridge comprises an atomizer, an ink reservoir with a volume of about 2544 $mm^3$; a liquid inlet; a liquid outlet; a gas inlet; a lip with a length of about 4 mm; and a spacer. a dielectric spacer 507 with a length of about 70 mm, an inner diameter of about 10 mm and an outer diameter of about 13 mm; and a lip 506 with a length of about 4 mm.

To print, a gas is introduced into the fluid delivery assembly through the gas inlet at a gas flow rate of about 600 sccm.

The operating frequency of the atomizer is about 116 KHz and the atomization rate set at about 40% of the maximum allowed atomization at this frequency. The atomization rate can be increased by increasing the voltage input to the atomizer. At atomization rates above 60%, more aerosol enters the plasma region and the printed pattern is wet and non-uniform as opposed to dry and uniform pattern at a lower atomization rate. In addition, when the atomization rate is higher, more aerosol enters the plasma region and prevents uniform plasma generation between the electrodes. An optimal atomization rate is 40 to 50% of the atomization rate. The externally applied high voltage is in the range of about 2 kV to about 6 kV and the frequency is in the range of about 30 KHz to about 60 KHz.

The plasma manifold comprises a primary dielectric tube. The dielectric tube has an outer diameter of about 6 mm and an inner diameter of about 4 mm. The plasma manifold further comprises at least two electrodes. The separation between the two electrodes is about 30 mm.

Argon gas flowing at a rate of about 600 sccm can be used to generate plasma in the plasma manifold. The plasma can tune the oxidation state of copper oxide to copper. In some cases, hydrogen gas can be added to the argon gas, by flowing hydrogen gas at a gas flow rate of about 50 sccm. In some cases, the combination of hydrogen and gas can occur during printing. In some cases, the combination can occur after plasma treatment to tune the oxidation state of copper oxide to copper.

The substrate that is being printed on can be about 3 mm to about 5 mm. The working distance between the printer orifice and the substrate can be varied from about 3 mm to about 5 mm. At working distance lower than 3 mm, the substrate may get affected by the temperature in the plasma print head and may result in partial melting of the substrate. At larger working distance above 7 mm, the plasma effect is very minimal and the adhesion of the printed pattern could be poor.

The conditions are important to attain the desired printing characteristics. For example, when the applied voltage is below 2 kV, the plasma intensity and temperature are minimal and the copper nanomaterial passing through the plasma region does not undergo significant morphological change. For example, when the electrode separation is minimal at about 10 mm, and when the applied potential is low, the impact of plasma species on the copper nanomaterials is very minimal and does not cause morphological and/or oxidation change. The particles retain the particle size and shape; this does not result in a uniform and conducting film.

When higher potential is used in combination with larger electrode separation of 10 mm or more and in the presence of hydrogen, the copper oxide in the aerosol is reduced in-situ printing and a conducting metallic copper pattern is formed on the substrate. In some cases, post-treatment using argon and hydrogen gas mixture ensures a uniform and conducting film.

In some cases, it may be difficult to print copper on some substrates such as glass, quartz, ceramics, due to poor adhesion at the low temperatures during deposition. Such substrates can withstand high temperatures however. In such cases, the distance between the electrodes can be greater than about 30 mm to ensure a hot and intense plasma between the electrodes, and to increase the residence time of the copper nanomaterial in the plasma region. In some cases, the externally applied potential can be above 6 kV and/or the working distance between the substrate and the print head can be from about 2 mm to about 5 mm. The atomization rate can be from about 40 to about 50% of the maximum atomization rate, to avoid more copper nanoparticles being aerosolized and entered through the plasma that could potentially prevent uniform plasma discharge. This will also result in a wet film deposition and the morphology and oxidation state of copper oxide might remain the same. Printing conditions such as larger electrode separation, higher potential, lower working distance, higher hydrogen content in the gas mixture, and longer post-treatment time will result in a film with better adhesion to glass, quartz, other ceramic materials, polytetrafluoroethylene (PTFE) type of substrates and increased conductivity closer to that of the bulk copper.

For printing copper on substrates like glass, quartz, ceramic etc., that can withstand higher temperature and where the adhesion of printed copper becomes an issue when deposited at lower temperature, the distance between the electrodes is increased to over 30 mm to ensure a hotter and intense plasma between the electrodes and to increase the residence time of the copper nano materials in the plasma region. Also the externally applied potential can be increased further above 6 kilo volts and the working distance between the substrate and print head can be minimized to stay between 2 mm to 5 mm. The atomization rate should remain optimal at 40 to 50% of the maximum atomization rate, to avoid more copper nanoparticles being aerosolized and entered through the plasma that could potentially prevent uniform plasma discharge. Also, this will result in a wet film deposition and the morphology and oxidation state of copper oxide might remain the same. Larger electrode separation, higher potential, lower working distance, higher hydrogen content in the gas mixture, longer post treatment tie etc., will result in a film with better adhesion to glass, quartz, other ceramic materials, polytetrafluoroethylene (PTFE) type of substrates and also increased conductivity closer to that of the bulk copper.

While preferred embodiments of the present invention have been shown and described herein, it will be obvious to those skilled in the art that such embodiments are provided by way of example only. Numerous variations, changes, and substitutions will now occur to those skilled in the art without departing from the invention. It should be understood that various alternatives to the embodiments of the invention described herein may be employed in practicing the invention. It is intended that the following claims define the scope of the invention and that methods and structures within the scope of these claims and their equivalents be covered thereby.

What is claimed is:

1. An apparatus for printing, comprising: (i) a plasma module for generating a plasma discharge, wherein the plasma module comprises a dielectric tube, a first electrode having a first surface area, and a second electrode having a second surface area, wherein the first electrode and the second electrode are configured to move along the length of the dielectric tube; and (ii) a detachable fluid assembly comprising a dielectric spacer and a cartridge, wherein a proximal end of the dielectric spacer is configured to be attached to or detached from a distal end of the plasma module, and a distal end of the dielectric spacer is coupled to a proximal end of the cartridge, wherein the cartridge comprises an ink inlet, an ink outlet, an ink reservoir, a piezo atomizer, a perforated plate, a lip, or a combination thereof, and wherein the dielectric spacer of the fluid assembly has a length that is (i) greater than a distance between respective centers of the first electrode and the second electrode in the plasma module, and (ii) between 5 millimeters (mm) to 216 mm.

2. The apparatus of claim 1, wherein the first electrode and the second electrode are located on the outside of the dielectric tube.

3. The apparatus of claim 1, wherein the first electrode is located on the outside of the dielectric tube, and the second electrode is located on the inside of the dielectric tube.

4. The apparatus of claim 1, wherein the first surface area and the second surface area are different.

5. The apparatus of claim 1, wherein the first electrode is encapsulated with a first dielectric material and the second electrode is encapsulated with a second dielectric material to prevent arcing between the first electrode and the second electrode.

6. The apparatus of claim 5, wherein the first dielectric material and/or the second dielectric material has a thickness that is greater than a thickness of the dielectric tube.

7. The apparatus of claim 5, wherein the first dielectric material has a first dielectric constant and the second dielectric material has a second dielectric constant, and the first dielectric constant is greater than the second dielectric constant.

8. The apparatus of claim 5, wherein the first dielectric material and/or the second dielectric material has a thickness that is at least three times greater than a thickness of the dielectric tube.

9. The apparatus of claim 1, wherein the apparatus further comprises a detachable nozzle module, wherein the detachable nozzle module is connected to the plasma module at a proximal end of the plasma module, and the detachable nozzle module can be detached from the plasma module.

10. The apparatus of claim 1, wherein the cartridge comprises the piezo electric atomizer to aerosolize an ink to generate an aerosolized ink to be printed.

11. The apparatus of claim 10, wherein the dielectric spacer is configured to prevent arcing of the plasma between the piezo electric atomizer and the first and second electrodes in the plasma module.

12. The apparatus of claim 10, wherein the cartridge comprises a gas inlet to allow entry of a gas into the cartridge.

13. The apparatus of claim 12, wherein the first electrode and the second electrode are configured to generate a plasma within the dielectric tube in the presence of the gas.

14. The apparatus of claim 12, wherein the cartridge comprises the ink inlet that allows entry of the ink into the cartridge, wherein the ink is aerosolized by the piezo electric atomizer to generate an aerosolized ink.

15. The apparatus of claim 14, wherein the detachable fluid assembly allows for flow of the aerosolized ink from the cartridge into the dielectric tube of the plasma module.

16. The apparatus of claim 15, wherein the plasma module is configured to expose the aerosolized ink to the plasma generated in the dielectric tube, thereby altering a property of the aerosolized ink.

17. A method of printing, comprising: (a) introducing an ink to be printed through the ink inlet of the cartridge of the apparatus of claim 15; (b) aerosolizing the ink using the piezo electric atomizer of the cartridge to generate an aerosolized ink; (c) flowing the aerosolized ink from the cartridge, through the dielectric spacer to the dielectric tube of the plasma module; (d) exposing the aerosolized ink to plasma generated by the first and second electrode in the plasma module to generate a plasma-treated aerosolized ink; and (e) printing the plasma-treated aerosolized ink on a substrate.

18. The apparatus of claim 14, wherein the cartridge further comprises the lip at the proximal end of the cartridge, wherein the lip is configured to prevent direct interaction of the gas entering the cartridge through the gas inlet with the aerosolized ink and to allow the aerosolized ink to flow from the piezo electric atomizer to the dielectric spacer without condensation.

19. The apparatus of claim 10, wherein the piezo electric atomizer operates at a frequency of about 50 kHz to about 10 MHz.

20. The apparatus of claim 1, wherein the detachable fluid assembly is in fluid communication with the plasma module.

21. The apparatus of claim 1, wherein the detachable fluid assembly comprises two or more cartridges.

22. The apparatus of claim 1, wherein the distance between the first electrode and the second electrode can be changed.

* * * * *